US012811091B2

(12) United States Patent
Wang et al.

(10) Patent No.: US 12,811,091 B2
(45) Date of Patent: Nov. 24, 2026

(54) SEMICONDUCTOR CHARGED PARTICLE DETECTOR FOR MICROSCOPY

(71) Applicant: ASML Netherlands B.V., Veldhoven (NL)

(72) Inventors: Yongxin Wang, San Ramon, CA (US); Zhonghua Dong, Sunnyvale, CA (US); Rui-Ling Lai, San Jose, CA (US); Kenichi Kanai, Palo Alto, CA (US)

(73) Assignee: ASML Netherlands B.V., Veldhoven (NL)

( * ) Notice: Subject to any disclaimer, the term of this patent is extended or adjusted under 35 U.S.C. 154(b) by 76 days.

(21) Appl. No.: 18/976,198

(22) Filed: Dec. 10, 2024

(65) Prior Publication Data

US 2025/0182999 A1 Jun. 5, 2025

Related U.S. Application Data

(63) Continuation of application No. 17/970,469, filed on Oct. 20, 2022, now Pat. No. 12,205,792, which is a (Continued)

(51) Int. Cl.
*H01J 37/244* (2006.01)
*G01T 1/24* (2006.01)
(Continued)

(52) U.S. Cl.
CPC ............ *H01J 37/244* (2013.01); *G01T 1/247* (2013.01); *H01J 37/28* (2013.01); *H01J 37/285* (2013.01);
(Continued)

(58) Field of Classification Search
None
See application file for complete search history.

(56) References Cited

U.S. PATENT DOCUMENTS

| | | |
|---|---|---|
| 4,473,748 A | 9/1984 | Konagai et al. |
| 6,584,413 B1 | 6/2003 | Keenan et al. |

(Continued)

FOREIGN PATENT DOCUMENTS

| | | |
|---|---|---|
| CN | 1630979 A | 6/2005 |
| CN | 107112182 A | 8/2017 |

(Continued)

OTHER PUBLICATIONS

S. Yamada, T. Ito, K. Gouhara, & Y. Uchikawa, Electron-Count Imaging in SEM, Scanning vol. 13, 165-171 (1991) (7 pages).

(Continued)

*Primary Examiner* — Marcus H Taningco
(74) *Attorney, Agent, or Firm* — Finnegan, Henderson, Farabow, Garrett & Dunner LLP

(57) ABSTRACT

A detector may be provided with an array of sensing elements. The detector may include a semiconductor substrate including the array, and a circuit configured to count a number of charged particles incident on the detector. The circuit of the detector may be configured to process outputs from the plurality of sensing elements and increment a counter in response to a charged particle arrival event on a sensing element of the array. Various counting modes may be used. Counting may be based on energy ranges. Numbers of charged particles may be counted at a certain energy range and an overflow flag may be set when overflow is encountered in a sensing element. The circuit may be configured to determine a time stamp of respective charged particle arrival events occurring at each sensing element. Size of the sensing element may be determined based on criteria for enabling charged particle counting.

20 Claims, 50 Drawing Sheets

Related U.S. Application Data continuation of application No. 16/435,145, filed on Jun. 7, 2019, now Pat. No. 11,508,547.

(60) Provisional application No. 62/852,816, filed on May 24, 2019, provisional application No. 62/787,066, filed on Dec. 31, 2018, provisional application No. 62/682,730, filed on Jun. 8, 2018.

(51) Int. Cl.
*H01J 37/28* (2006.01)
*H01J 37/285* (2006.01)
*H10F 30/00* (2025.01)

(52) U.S. Cl.
CPC .... *H10F 30/301* (2025.01); *H01J 2237/2441* (2013.01)

(56) References Cited

U.S. PATENT DOCUMENTS

| | | | | |
|---|---|---|---|---|
| 7,183,555 | B2 | 2/2007 | Jarron | |
| 7,851,764 | B2 | 12/2010 | Jin et al. | |
| 7,928,400 | B1 | 4/2011 | Diawara et al. | |
| 8,338,782 | B2 | 12/2012 | Luecken et al. | |
| 8,742,528 | B2 | 6/2014 | Yamamura et al. | |
| 8,817,148 | B2 * | 8/2014 | Janssen | H04N 23/30 348/308 |
| 9,153,413 | B2 | 10/2015 | Almogy et al. | |
| 9,696,435 | B2 * | 7/2017 | Gubbens | G01T 1/2006 |
| 10,163,603 | B2 | 12/2018 | Zeidler et al. | |
| 2005/0029473 | A1 * | 2/2005 | Muraki | B82Y 40/00 250/492.1 |
| 2007/0221827 | A1 | 9/2007 | Fathimulla et al. | |
| 2010/0084568 | A1 | 4/2010 | Lagarec et al. | |
| 2010/0237252 | A1 | 9/2010 | Jin et al. | |
| 2016/0106387 | A1 | 4/2016 | Kahn et al. | |
| 2016/0148780 | A1 | 5/2016 | Agrawal et al. | |
| 2016/0266054 | A1 | 9/2016 | Cao et al. | |
| 2016/0284531 | A1 | 9/2016 | Zaks et al. | |
| 2017/0207059 | A1 * | 7/2017 | Trevor | H01J 37/05 |
| 2017/0309445 | A1 | 10/2017 | Agrawal et al. | |
| 2018/0206805 | A1 | 7/2018 | Onouchi | |

FOREIGN PATENT DOCUMENTS

| | | | |
|---|---|---|---|
| EP | 2599103 | B1 | 3/2017 |
| JP | S5020867 | B1 | 7/1975 |
| JP | S6275371 | A | 4/1987 |
| JP | H02259590 | A | 10/1990 |
| JP | H07245076 | A | 9/1995 |
| JP | 2008123716 | A | 5/2008 |
| JP | 2013214467 | A | 10/2013 |
| JP | 6177915 | B2 | 8/2017 |
| JP | 2017526142 | A | 9/2017 |
| JP | 2017537426 | A | 12/2017 |
| KR | 20110065285 | A | 6/2011 |
| KR | 20170095831 | A | 8/2017 |
| TW | 201101469 | A | 1/2011 |
| WO | 2016033388 | A1 | 3/2016 |
| WO | 2017033675 | A1 | 3/2017 |

OTHER PUBLICATIONS

K. Omote, "Dead-Time Effects in Photon Counting Distributions", Nuclear Instruments & Methods in Physics Research A293 (1990) 582-588 (7 pages).
L. Mandel, "Inversion Problem in Photon Counting with Dead Time", J. Opt. Soc. Am., vol. 70, No. 7 (1980) 873-874 (2 pages).
Mir, et al., "Characterisation of the Medipix3 detector for 60 and 80 keV electrons", Ultramicroscopy 182 (2017) 44-53 (10 pages).
International Search Report issued by the International Searching Authority in related PCT Application No. PCT/EP2019/064445, mailed Nov. 6, 2019 (5 pgs.).
Office Action issued by the Intellectual Property Office (ROC) of Taiwan in related Application No. 108119553, issued May 4, 2020 (11 pgs.).
Mcmullan et al., "Electron imaging with Medipix2 hybrid pixel detector," Ultramicroscopy, Elsevier, Amsterdam, NL vol. 107, No. 4-5, Jan. 25, 2007 pp. 401-413, XP005859109, ISSN: 0304-3991, DOI: 10.1016/J. ULTRAMIC.2006.10.005 (14 pgs.).
Faruqi, A.R., "Direct Electron Detectors for Electron Microscopy," Electron Emission Physics, Kevin L. Jensen, Elsevier, Acad. Press, vol. 145, Jan. 1, 2007 pp. 55-93, XP009166553, ISSN: 1076-5670, DOI: 10.1016/S1076-5670(06)45002-3, pp. 64-66; figures 2, 3 (39 pgs.).
Notice of Reasons for Rejection issued in related Japanese Patent Application No. 2020-565872; mailed Feb. 25, 2022 (9 pgs.).
Office Action of the Intellectual Property Office issued in related Taiwan Patent Application No. 108119553; mailed Mar. 8, 2022 (15 pgs.).
Search Report and Written Opinion from the Intellectual Property Office of Singapore issued in related Singapore Patent Application No. 11202011505R; mailed May 23, 2022 (9 pgs.).
Notification of Reason(s) for Refusal issued in related Korean Patent Application No. 10-2020-7035295; mailed Aug. 8, 2022 (9 pgs.).

* cited by examiner

| # of events in SP | $P_{(k)}$ | # of Events to be counted in SP | | | | # of Events to be missed in SP | | | |
|---|---|---|---|---|---|---|---|---|---|
| | | MC=1 | MC=2 | MC=3 | MC=$k$ | MC=1 | MC=2 | MC=3 | MC=$k$ |
| **0** | $e^{-h}$ | 0 | 0 | 0 | 0 | 0 | 0 | 0 | 0 |
| **1** | $he^{-h}$ | 1 | 1 | 1 | 1 | 0 | 0 | 0 | 0 |
| **2** | $\frac{1}{2}h^2e^{-h}$ | 1 | 2 | 2 | 2 | 1 | 0 | 0 | 0 |
| **3** | $\frac{1}{3!}h^3e^{-h}$ | 1 | 2 | 3 | 3 | 2 | 1 | 0 | 0 |
| **4** | $\frac{1}{4!}h^4e^{-h}$ | 1 | 2 | 3 | 4 | 3 | 2 | 1 | |
| **k** | $\frac{1}{k!}h^ke^{-h}$ | 1 | 2 | 3 | k | 0 | 0 | 0 | 0 |

SP: Sample Period
MC: Maximum Count

FIG. 12

FIG. 28A
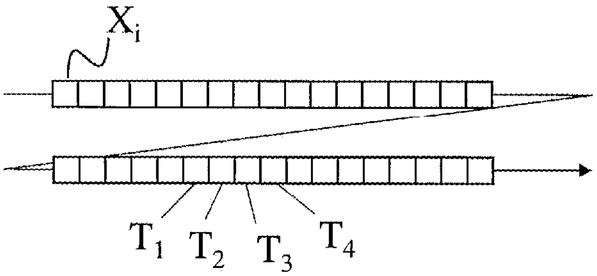
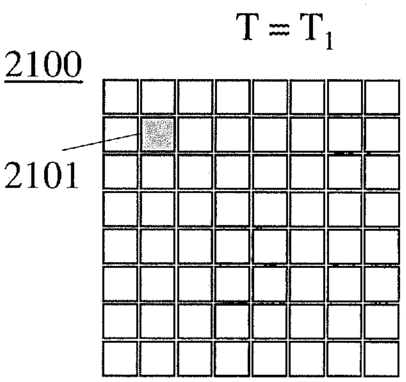
FIG. 28B
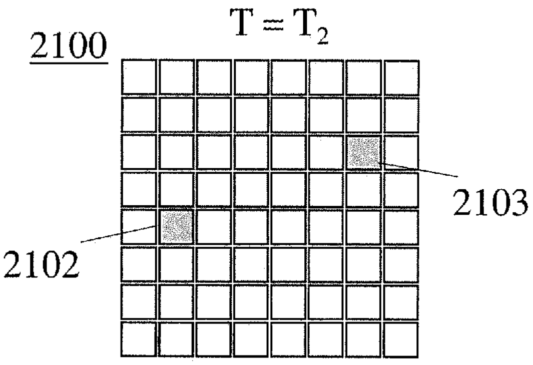
FIG. 28C
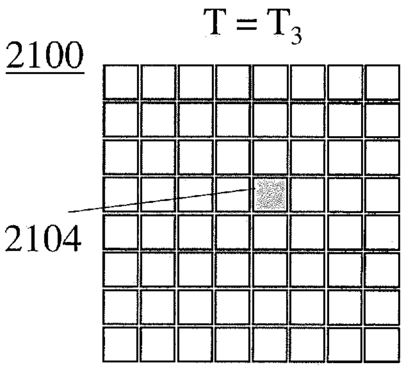
FIG. 28D
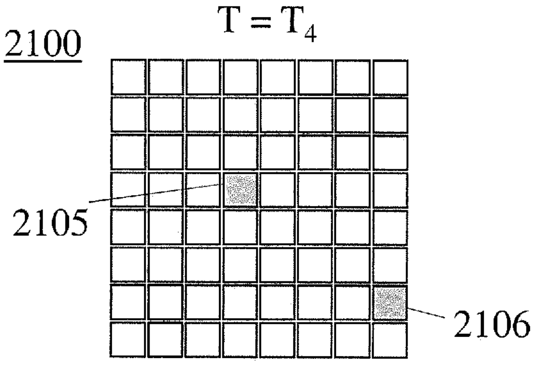
FIG. 28E

SEMICONDUCTOR CHARGED PARTICLE DETECTOR FOR MICROSCOPY

CROSS-REFERENCE TO RELATED APPLICATIONS

This application is a continuation of U.S. application Ser. No. 17/970,469, filed Oct. 20, 2022, which is a continuation of U.S. application Ser. No. 16/435,145, filed Jun. 7, 2019 (now U.S. U.S. Pat. No. 11,508,547), which claims priority of U.S. application No. 62/682,730, which was filed on Jun. 8, 2018; U.S. application 62/787,066, which was filed on Dec. 31, 2018; and U.S. application 62/852,816, which was filed on May 24, 2019. The contents of these applications are incorporated herein by reference in their entireties.

FIELD

The description herein relates to charged particle detection, and more particularly, to systems and methods that may be applicable to charged particle beam detection.

BACKGROUND

Detectors may be used for sensing physically observable phenomena. For example, charged particle beam tools, such as electron microscopes, may comprise detectors that receive charged particles projected from a sample and that output a detection signal. Detection signals can be used to reconstruct images of sample structures under inspection and may be used, for example, to reveal defects in the sample. Detection of defects in a sample is increasingly important in the manufacturing of semiconductor devices, which may include large numbers of densely packed, miniaturized integrated circuit (IC) components. Dedicated inspection tools may be provided for this purpose.

In some applications in the field of inspection, for example microscopy using a scanning electron microscope (SEM), an electron beam may be scanned across a sample to derive information from backscattered or secondary electrons generated from the sample. In a related art, electron detection systems in SEM tools may include a detector configured to detect electrons coming from the sample. Existing detectors in SEM tools may detect only the intensity of the beam. Sensitivity in conventional detection systems may be limited by poor signal-to-noise ratio (SNR), particularly when beam current reduces to, for example, pico-ampere ranges. In some detection methods, a large area semiconductor detector or a group of small area semiconductor detectors having an area equal to, smaller, or larger than the area of the beam spot may be used. Current induced by the incoming electron beam may be generated within the detector and then amplified by an amplifier following the detector.

With continuing miniaturization of semiconductor devices, inspection systems may use lower and lower electron beam currents. As beam current decreases, maintaining SNR becomes even more difficult. For example, when probe current decreases to 200 pA or below, SNR may drop off dramatically. Poor SNR may require taking measures such as image averaging or extending the integration time of signal corresponding to each pixel in the image of the sample, which may increase the electron dose on the sample surface, resulting in surface charging artifacts or other detrimental effects. Such measures may also lower the overall throughput of the inspection system.

In a related art, particle counting may be useful in low-current applications. Particle counting may be employed in detectors such as an Everhart-Thornley detector (ETD), which may use a scintillator and a photomultiplier tube (PMT). An ETD may exhibit good SNR in probe current ranges of some applications, such as 8 pA to 100 pA. However, the scintillator's light yield may degrade with accumulated electron dose, and thus has a limited lifetime. Aging of the scintillator may also cause performance drift at the system level and may contribute to generating non-uniform images. Therefore, an ETD may not be appropriate for use in an inspection tool, especially when used in semiconductor manufacturing facilities where it may be required to run 24 hours per day, 7 days per week.

A charged particle detector is needed that can achieve high SNR and that may be used with low probe currents, such as those below 200 pA. Meanwhile, a detector should secure stable quantum efficiency and long lifetime with low performance drift, for example even when used with probe currents of 1 nA or more in continuous operation.

Detection systems employing related art methods may face limitations in detection sensitivity and SNR, particularly at low electron dosages. Furthermore, in some applications, additional information besides beam intensity may be desired. Some related art systems may employ an energy filter, such as a filter electrode, to filter out some charged particles having a certain level of energy. This may be useful to derive additional information from a sample. However, energy filters may add additional complexity to systems, and may cause SNR to deteriorate due to loss introduced by the energy filter. Improvements in detection systems and methods are thus desired.

SUMMARY

Embodiments of the present disclosure provide systems and methods for charged particle detection. In some embodiments, there may be provided a detector for a charged particle beam apparatus that includes a semiconductor substrate including an array of sensing elements, and a circuit configured to count a number of charged particles incident on the detector. The circuit of the detector may be configured to process outputs from the plurality of sensing elements and increment a counter in response to a charged particle arrival event on a sensing element of the array. The circuit may include a plurality of circuitries, each of the circuitries corresponding to a sensing element. The circuit may be configured to determine a time stamp of respective charged particle arrival events occurring at each sensing element.

The detector may be configured to operate in a variety of counting modes. For example, the detector may be configured to count up to only one charged particle arrival event in a sensing element before resetting without discriminating energy of the one charged particle arrival event. Resetting of a sensing element may refer to resetting the sensing element itself or a circuit associated with it. The detector may also be configured to count numbers of charged particle arrival events without discriminating energy of the charged particle arrival events and to set an overflow flag when overflow is encountered in a sensing element. The detector may also be configured to count up to only one charged particle arrival event in a sensing element for a first energy range before resetting. The detector may also be configured to count numbers of charged particle arrival events for a first energy range and to set an overflow flag when overflow is encountered in a sensing element.

The detector may be configured to reset the sensing elements of the array in a variety of resetting modes. For example, the detector may be configured to reset all sensing elements of the array of sensing elements simultaneously. The detector may also be configured to reset all sensing elements of a region of the array of sensing elements simultaneously. The detector may also be configured to reset each sensing element of the array of sensing elements individually. The detector may also be configured to reset some sensing elements of the array of sensing elements simultaneously and some sensing elements of the array of sensing elements individually.

Some embodiments of the disclosure may provide a method including processing outputs from a plurality of sensing elements of an array of sensing elements of a detector, counting a number of charged particles incident on a detector, wherein the counting includes incrementing a counter in response to a charged particle arrival event on a sensing element of the array, and determining a time stamp of the charged particle arrival event.

Some embodiments of the disclosure may provide a non-transitory computer-readable medium storing instructions for implementing a method, such as the above method.

It is to be understood that both the foregoing general description and the following detailed description are exemplary and explanatory only and are not restrictive of the disclosed embodiments, as may be claimed.

BRIEF DESCRIPTION OF THE DRAWINGS

The above and other aspects of the present disclosure will become more apparent from the description of exemplary embodiments, taken in conjunction with the accompanying drawings in which:

FIG. 12 is a table showing a relationship between number of events to be counted and number of events missed in a detector, consistent with embodiments of the present disclosure.

FIG. 28A is a diagram illustrating a charged particle beam scanning in a raster pattern, consistent with embodiments of the present disclosure.

FIGS. 28B, 28C, 28D, and 28E are diagrams illustrating arrays of sensing elements at particular scanning time points, consistent with embodiments of the present disclosure.

DETAILED DESCRIPTION

Figure 1:
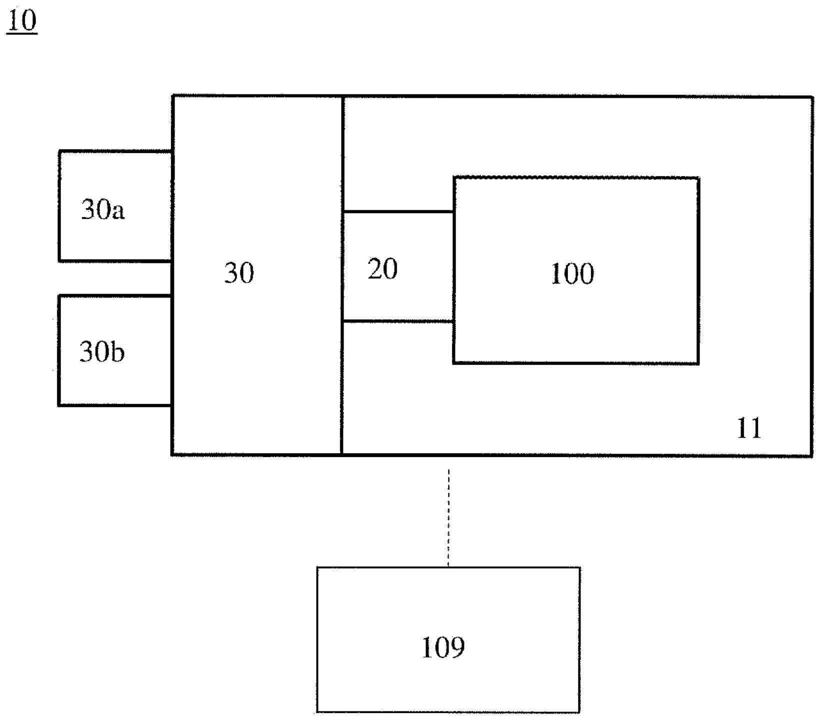
FIG. 1 is a schematic diagram illustrating an exemplary electron beam inspection (EBI) system, consistent with embodiments of the present disclosure.

Reference will now be made in detail to exemplary embodiments, examples of which are illustrated in the drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses, systems, and methods consistent with aspects related to subject matter that may be recited in the appended claims.

Aspects of the present application relate to systems and methods for charged particle beam detection. Systems and methods may employ counting of charged particles, such as electrons, and may be useful in an inspection tool, such as a scanning electron microscope (SEM). Inspection tools may be used in the manufacturing process of integrated circuit (IC) components. To realize the enhanced computing power of modern day electronic devices, the physical size of the devices may shrink while the packing density of circuit components, such as, transistors, capacitors, diodes, etc., is significantly increased on an IC chip. For example, in a smartphone, an IC chip (which may be the size of a thumbnail) may include over 2 billion transistors, the size of each transistor being less than 1/1,000th of a human hair. Not surprisingly, semiconductor IC manufacturing is a complex process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get 75% yield, each individual step must have a yield greater than 99.4%, and if the individual step yield is 95%, the overall process yield drops to 7%.

It is increasingly important to ensure the ability to detect defects with high accuracy and high resolution while maintaining high throughput (defined as the number of wafer processes per hour, for example). High process yields and high wafer throughput may be impacted by the presence of defects, especially when operator intervention is involved. Thus, detection and identification of micro and nano-sized defects by inspection tools (such as a SEM) is important for maintaining high yields and low cost.

In some inspection tools, a sample may be inspected by scanning a beam of high energy electrons over the sample surface. Due to interactions at the sample surface, secondary or backscattered electrons may be generated from the sample that may then be detected by a detector.

Related art detectors may have limitations, for example poor signal-to-noise ratio (SNR) or poor durability, as noted above. Aspects of the present disclosure may address some such limitations by providing a detector with an array of detector elements, each of the detector elements including a sensing element, and each of the sensing elements having an area such that no more than a certain number of charged particles are received per sampling period of the sensing element. The detector may include circuitries coupled to each sensing element that may enable charged particle counting. Charged particle counting may allow simpler and smaller components to be packaged on a chip relative to, for example, analog signal detection, thus allowing robust and reliable detection of charged particles with good SNR. While the present disclosure discusses some exemplary embodiments in the context of electrons, it will be understood that the present disclosure may be applicable to other types of charged particles, such as ions.

To help ensure accurate electron counting, time separation between subsequent electron arrival events may be a significant parameter. If electron arrival events are too close together, a detector may be overwhelmed, and discrimination of single electron arrival events may be impeded. Similarly, signal pulse width may be another significant parameter limiting electron counting, which may be related to pulse width of signals generated in response to an electron arrival event at the detector. If the detector generates a signal that is too weak or broad (as opposed to a sharp blip), signals from subsequent electron arrival events may merge into one. Additionally, a sampling rate of the detector should be high enough that individual electron arrival events may be captured. That is, a detector should be fast enough that electron arrival events do not go undetected. Another consideration for electron counting may be achieving accuracy with a level of miscounts that may be no more than a certain degree. Miscounts may be based on dead time of a detector element. Thus, a number of criteria may be relevant in configuring a detector for electron counting.

As one example of a sensing element, a PIN diode may be provided. A PIN diode may be well suited for use in electron counting. A PIN diode may have high natural internal gain, and thus, even in the case of a single electron arrival event, a strong, measurable signal may be generated that is easily distinguishable against a relatively low floor level of background noise. The need to provide an amplifier or complex systems on a chip, such as avalanche diodes, to boost the signal may be reduced or eliminated. Instead, a signal generated from a PIN diode by itself or with a relatively low-gain amplifier may be well suited for electron counting because it is generated quickly in response to an electron arrival event and stands out against background noise.

However, a single detector element including a PIN diode with one output may not be able to handle counting for all ranges of beam currents. For example, for a 1 nA electron beam, it is known that about 64 electrons may be incident on a detector in a typical 10 ns sampling period. In some SEM systems, a detector may run with a sampling rate of 100 MHz, thus corresponding to a 10 ns sampling period. In one sampling period of 10 ns, 64 electron arrival events may occur, and thus, signals generated from individual electron arrival events cannot be easily discriminated. Even in a high-speed detector, such as one running with a sampling rate of 800 MHz, there may be about 8 incident electrons per sampling period, which may overload the detector.

In some embodiments of the present disclosure, a sensing element of an array may be sized such that no more than a certain number of charged particles is received in the area of the individual sensing element per sampling period. The certain number may be one. The size of the sensing element may be smaller than a geometric spread of charged particles incident on the detector. Thus, an individual sensing element may be configured to receive fewer charged particles than the total number of charged particles incident on the detector. According to various criteria, aspects of the detector may be set so as to enable charged particle counting, such as a size of sensing elements, sampling rate, and other characteristics.

Without limiting the scope of the present disclosure, some embodiments may be described in the context of providing detectors and detection methods in systems utilizing electron beams. However, the disclosure is not so limited. Other types of charged particle beams may be similarly applied. Furthermore, systems and methods for detection may be used in other imaging systems, such as optical imaging, photon detection, x-ray detection, ion detection, etc.

As used herein, unless specifically stated otherwise, the term "or" encompasses all possible combinations, except where infeasible. For example, if it is stated that a component includes A or B, then, unless specifically stated otherwise or infeasible, the component may include A, or B, or A and B. As a second example, if it is stated that a component includes A, B, or C, then, unless specifically stated otherwise or infeasible, the component may include A, or B, or C, or A and B, or A and C, or B and C, or A and B and C.

As used throughout the present disclosure, the expression "a first number of sensing elements" shall mean a group of sensing elements of a first quantity among a superset of sensing elements. For example, there may be provided a plurality of sensing elements. A first number of sensing elements may refer to a subset of sensing elements among the plurality. The first number may be from one to the total number of sensing elements in the plurality. Similarly, the expression "a second number of sensing elements" shall mean a group of sensing elements of a second quantity among a superset of sensing elements. A second number of sensing elements may refer to a further subset of sensing elements among the plurality of sensing elements, for example, a subset within the first number of sensing elements.

Additionally, the term "detector element" may include or cover "sensing element," "sensor element," "detection cell," or "detector segment," etc. A sensing element may be a diode configured to have a depletion region, and in some embodiments discussed herein, the term "sensing element" may exclude an avalanche diode operating in Geiger mode. A detector element may include a diode, an interconnect, and a circuit, which may include front-end electronics, for example. Furthermore, the term "frame" may include or cover "sampling period," "SEM image pixel period," or "pixel period," etc. A SEM image frame may refer to a frame of pixels that may be refreshed on a frame-by-frame basis, while a data frame may refer to a group of data acquired by a detection system within a specified period of time.

Embodiments of the present disclosure may provide a detection method. The detection method may comprise charged particle counting. For example, in some embodiments, a charged particle detection method may be provided for electron microscopy. The method may be applied to a SEM detection system. The charged particle detection method may be based on electron counting. By counting the number of electrons received during a pre-defined period, the intensity of an incoming electron beam may be determined. The term "incoming electron" may include or cover an incident electron, such as an electron that impacts the surface of a detector. According to some embodiments, noise from the charged particle detection process may be reduced. However, solely improving SNR may not fulfill the ever increasing needs of various SEM applications.

In some embodiments, a semiconductor electron detector may be provided to not only detect the intensity of the incoming electron beam, but also identify the proportions of electrons with different energy. For example, an energy spectrum of the incoming electron beam may be acquired in addition to intensity information.

Some embodiments may provide a display method accompanying a detection method. For example, in some embodiments, an additional dimension of information may be provided, such as energy spectrum information. In some applications, a method may be applied to generate a color SEM image.

Electron counting may involve determining individual electron arrival events occurring at a detector. For example, electrons may be detected one-by-one as they reach the detector. In some embodiments, electrons incident on a detector may generate an electrical signal that is routed to signal processing circuitries and then read-out to an interface, such as a digital controller. A detector may be configured to resolve signals generated by incident electrons and distinguish individual electrons with a discrete count.

In some embodiments, electron counting may be applied to situations in which beam current is very small. For example, an electron beam may be set to irradiate a sample with a low dose. Low current may be used to prevent oversaturation of an electron counting detector by large current. For example, large current may have the effect of introducing nonlinearity in detection results. Meanwhile, for a detector that may be used in an industrial setting, the detector should also be able to handle situations of large beam current.

Some embodiments may address the above issues. For example, some embodiments may provide a plurality of relatively small sensing elements that may be used to detect an electron beam. Isolation may be provided between adjacent sensing elements so that the probability of one incoming electron going from one sensing element to its adjacent sensing elements may be reduced. In this way, crosstalk between adjacent sensing elements may be reduced.

In some embodiments, a data frame rate may be set based on a first parameter. The data frame rate may be a rate of data frames during which sensing elements collect incoming electrons from an electron beam to be used for imaging. The data frame rate may be set so that a pre-defined proportion (e.g., A %) of the sensing elements receive at least one incoming electron. The data frame rate may also be expressed by period (e.g., a duration) of the data frame. In addition, the data frame rate may be set based on a second parameter. For example, among sensing elements that receive at least one incoming electron, only a second predefined proportion (e.g., B %) of the sensing elements may receive more than one electron. In this way, a predefined detection linearity may be maintained while, at the same time, electron beams with large beam current may be handled. The data frame rate may be a constant value for a particular SEM setting or may be a varying value set to adapt the signal intensity of the electron beam being detected even under the same SEM settings. As a result, under the same SEM settings, adjacent data frame periods in time domain may be the same or may be different.

In addition to an adaptive frame, each frame may include information about when the frame starts and when it stops. Information on frame start and stop time (e.g., a frame start time point and a frame stop time point) may be used when a pixel in a SEM image is generated. For example, each pixel in a SEM image may be generated using the frames acquired during a particular period of time. The period (or rate) of SEM image pixel acquisition may be based on a predefined parameter set according to specific requirements. During the period of each SEM image pixel acquisition, one or more frames may be acquired. The number of frames acquired in adjacent SEM image pixel periods may be the same or different.

In addition to the frame-rate adjustments, systems and methods for charged particle detection may employ adjustments to structures or settings of a SEM system. For example, to ensure the predefined A % of sensing elements among the group of sensing elements receiving only one electron during the period of each frame, adjustments to the SEM system may be done so that the electron density within each electron beam spot is more evenly distributed. One such adjustment may be to defocus a projection system in a secondary SEM column in a multi-beam inspection (MBI) system. The projection system may be configured to defocus the beam to a certain extent. Furthermore, the magnification of the SEM system may be changed to enlarge the spot size of an electron beam or beamlet(s). The size of each beamlet spot may be enlarged. Magnification settings may be configured in consideration of crosstalk between beamlet spots.

In some embodiments, statistical analysis may be performed at each frame. For example, after each frame, for each electron beam, statistical results of received electron energy plotted against a number of electrons at each energy level within the frame may be acquired in addition to the overall number of electrons received during the frame. The overall numerical output may be used in generating one pixel in a SEM image, such as a grayscale image as in a conventional SEM. The overall number of electrons may correspond to the gray level of the pixel. Furthermore, one pixel of a color SEM image may also be generated. In a color SEM image, color information, such as red green blue (RGB) values of each pixel, may be determined by statistical results of corresponding frames generated in the aforementioned manner. In this way, an additional degree of freedom may be added to SEM imaging. Accordingly, analysis of a sample may be enhanced by, for example, elucidating further aspects of the sample under investigation such as material properties, microstructure, and alignment between layers.

In some embodiments, a detection method may be applied to grayscale SEM imaging. The method may comprise determining a series of thresholds. Instead of or in addition to generating statistical results of received electron energy plotted against a number of electrons at each energy level within the frame, information may be generated with respect to the thresholds. For example, three thresholds may be set in a way that the electron energy increases from low to high. The first threshold at the lowest electron energy may be used to identify whether a sensing element has received an electron or if its output is caused by interference or dark current, or the like. The second threshold, with an intermediary electron energy, may be used to identify whether an electron received by a sensing element is a secondary electron from the sample or a scattered electron from the sample. The third threshold, with the highest electron energy, may be used to identify whether a sensing element has received more than one electron during the specific frame. The number of secondary electrons received, the number of the scattered electrons received, and overall number of electrons received during the specific frame may be determined. By accumulating the above information pixel-by-pixel for a SEM image, one or more of the following can be acquired: a SEM image based on all received electrons, a secondary electron SEM image, and a scattered electron SEM image. Such images may be acquired with improved signal-to-noise ratio and without the help of an energy filter.

In some embodiments, a detector may be formed by using digital circuitry rather than implementations requiring a large amount of analog circuits. Accordingly, various aspects of implementation of a detector, such as design and manufacturing, may be improved.

Reference is now made to FIG. 1, which illustrates an exemplary electron beam inspection (EBI) system 10 that may include a detector, consistent with embodiments of the present disclosure. EBI system 10 may be used for imaging. As shown in FIG. 1, EBI system 10 includes a main chamber 11 a load/lock chamber 20, an electron beam tool 100, and an equipment front end module (EFEM) 30. Electron beam tool 100 is located within main chamber 11. EFEM 30 includes a first loading port 30*a* and a second loading port 30*b*. EFEM 30 may include additional loading port(s). First loading port 30*a* and second loading port 30*b* receive wafer front opening unified pods (FOUPs) that contain wafers (e.g., semiconductor wafers or wafers made of other material(s)) or samples to be inspected (wafers and samples may be collectively referred to as "wafers" herein).

One or more robotic arms (not shown) in EFEM 30 may transport the wafers to load/lock chamber 20. Load/lock chamber 20 is connected to a load/lock vacuum pump system (not shown) which removes gas molecules in load/lock chamber 20 to reach a first pressure below the atmospheric pressure. After reaching the first pressure, one or more robotic arms (not shown) may transport the wafer from load/lock chamber 20 to main chamber 11. Main chamber 11 is connected to a main chamber vacuum pump system (not shown) which removes gas molecules in main chamber 11 to reach a second pressure below the first pressure. After reaching the second pressure, the wafer is subject to inspection by electron beam tool 100. Electron beam tool 100 may be a single-beam system or a multi-beam system. A controller 109 is electronically connected to electron beam tool 100, and may be electronically connected to other components as well. Controller 109 may be a computer configured to execute various controls of EBI system 10. While controller 109 is shown in FIG. 1 as being outside of the structure that includes main chamber 11, load/lock chamber 20, and EFEM 30, it is appreciated that controller 109 can be part of the structure.

Figure 2A:
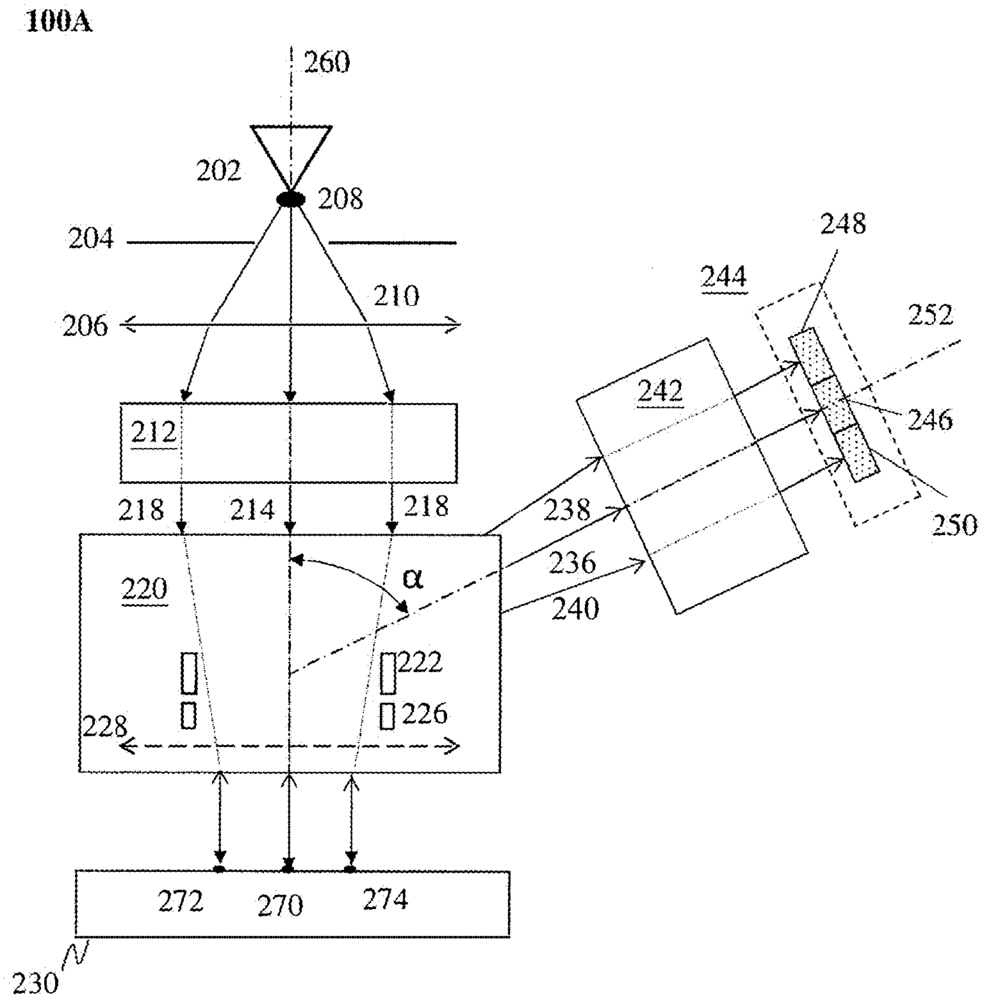
FIG. 2A, FIG. 2B, and FIG. 2C are schematic diagrams illustrating exemplary electron beam tools, consistent with embodiments of the present disclosure that may be a part of the exemplary electron beam inspection system of FIG. 1.

FIG. 2A illustrates a charged particle beam apparatus in which an inspection system may comprise a multi-beam inspection tool that uses multiple primary electron beamlets to simultaneously scan multiple locations on a sample.

As shown in FIG. 2A, an electron beam tool 100A (also referred to herein as apparatus 100A) may comprise an electron source 202, a gun aperture 204, a condenser lens 206, a primary electron beam 210 emitted from electron source 202, a source conversion unit 212, a plurality of beamlets 214, 216, and 218 of primary electron beam 210, a primary projection optical system 220, a wafer stage (not shown in FIG. 2A), multiple secondary electron beams 236, 238, and 240, a secondary optical system 242, and an electron detection device 244. Electron source 202 may generate primary particles, such as electrons of primary electron beam 210. A controller, image processing system, and the like may be coupled to electron detection device 244. Primary projection optical system 220 may comprise a beam separator 222, deflection scanning unit 226, and objective lens 228. Electron detection device 244 may comprise detection sub-regions 246, 248, and 250.

Electron source 202, gun aperture 204, condenser lens 206, source conversion unit 212, beam separator 222, deflection scanning unit 226, and objective lens 228 may be aligned with a primary optical axis 260 of apparatus 100A. Secondary optical system 242 and electron detection device 244 may be aligned with a secondary optical axis 252 of apparatus 100A.

Electron source 202 may comprise a cathode, an extractor or an anode, wherein primary electrons can be emitted from the cathode and extracted or accelerated to form a primary electron beam 210 with a crossover (virtual or real) 208. Primary electron beam 210 can be visualized as being emitted from crossover 208. Gun aperture 204 may block off peripheral electrons of primary electron beam 210 to reduce size of probe spots 270, 272, and 274.

Source conversion unit 212 may comprise an array of image-forming elements (not shown in FIG. 2A) and an array of beam-limit apertures (not shown in FIG. 2A). An example of source conversion unit 212 may be found in U.S. Pat. No. 9,691,586; U.S. Publication No. 2017/0025243; and International Application No. PCT/EP2017/084429, all of which are incorporated by reference in their entireties. The array of image-forming elements may comprise an array of micro-deflectors or micro-lenses. The array of image-forming elements may form a plurality of parallel images (virtual or real) of crossover 208 with a plurality of beamlets 214, 216, and 218 of primary electron beam 210. The array of beam-limit apertures may limit the plurality of beamlets 214, 216, and 218.

Condenser lens 206 may focus primary electron beam 210. The electric currents of beamlets 214, 216, and 218 downstream of source conversion unit 212 may be varied by adjusting the focusing power of condenser lens 206 or by changing the radial sizes of the corresponding beam-limit apertures within the array of beam-limit apertures. Condenser lens 206 may be a moveable condenser lens that may be configured so that the position of its first principle plane is movable. The movable condenser lens may be configured to be magnetic, which may result in off-axis beamlets 216 and 218 landing on the beamlet-limit apertures with rotation angles. The rotation angles change with the focusing power and the position of the first principal plane of the movable condenser lens. In some embodiments, the moveable condenser lens may be a moveable anti-rotation condenser lens, which involves an anti-rotation lens with a movable first principal plane. Moveable condenser lens is further described in U.S. Publication No. 2017/0025241, which is incorporated by reference in its entirety.

Objective lens 228 may focus beamlets 214, 216, and 218 onto a wafer 230 for inspection and may form a plurality of probe spots 270, 272, and 274 on the surface of wafer 230.

Beam separator 222 may be a beam separator of Wien filter type generating an electrostatic dipole field and a magnetic dipole field. In some embodiments, if they are applied, the force exerted by electrostatic dipole field on an electron of beamlets 214, 216, and 218 may be equal in magnitude and opposite in direction to the force exerted on the electron by magnetic dipole field. Beamlets 214, 216, and 218 can therefore pass straight through beam separator 222 with zero deflection angle. However, the total dispersion of beamlets 214, 216, and 218 generated by beam separator 222 may also be non-zero. Beam separator 222 may separate secondary electron beams 236, 238, and 240 from beamlets 214, 216, and 218 and direct secondary electron beams 236, 238, and 240 towards secondary optical system 242.

Deflection scanning unit 226 may deflect beamlets 214, 216, and 218 to scan probe spots 270, 272, and 274 over a surface area of wafer 230. In response to incidence of beamlets 214, 216, and 218 at probe spots 270, 272, and 274, secondary electron beams 236, 238, and 240 may be emitted from wafer 230. Secondary electron beams 236, 238, and 240 may comprise electrons with a distribution of energies including secondary electrons and backscattered electrons. Secondary optical system 242 may focus secondary electron beams 236, 238, and 240 onto detection sub-regions 246, 248, and 250 of electron detection device 244. Detection sub-regions 246, 248, and 250 may be configured to detect corresponding secondary electron beams 236, 238, and 240 and generate corresponding signals used to reconstruct an image of surface area of wafer 230.

Although FIG. 2A shows an example of electron beam tool 100 as a multi-beam tool that uses a plurality of beamlets, embodiments of the present disclosure are not so limited. For example, electron beam tool 100 may also be a single-beam tool that uses only one primary electron beam to scan one location on a wafer at a time.

Figure 2B:
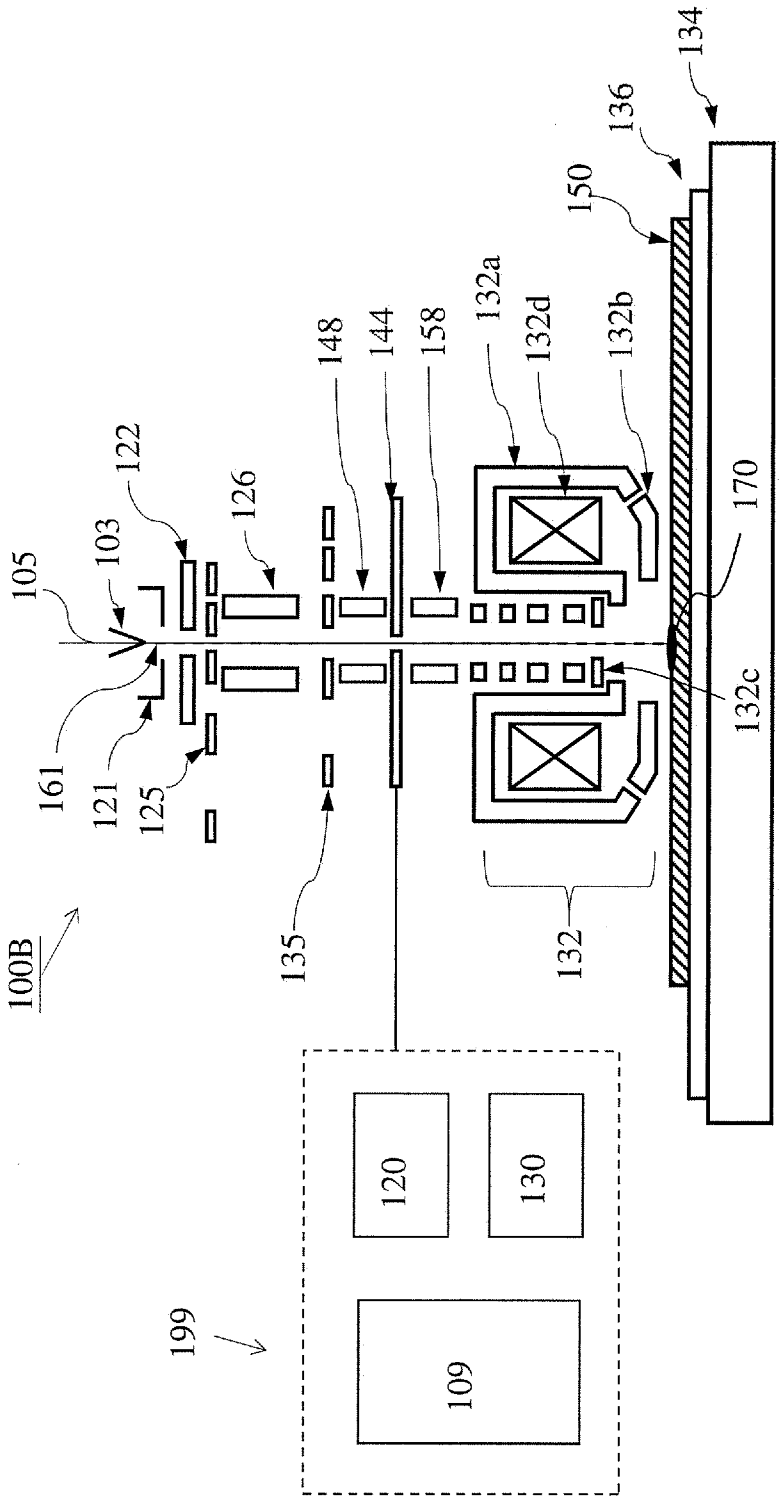

As shown in FIG. 2B, an electron beam tool 100B (also referred to herein as apparatus 100B) may be a single-beam inspection tool that is used in EBI system 10. Apparatus 100B includes a wafer holder 136 supported by motorized stage 134 to hold a wafer 150 to be inspected. Electron beam tool 100B includes an electron emitter, which may comprise a cathode 103, an anode 121, and a gun aperture 122. Electron beam tool 100B further includes a beam limit aperture 125, a condenser lens 126, a column aperture 135, an objective lens assembly 132, and a detector 144. Objective lens assembly 132, in some embodiments, may be a modified SORIL lens, which includes a pole piece 132*a*, a control electrode 132*b*, a deflector 132*c*, and an exciting coil 132*d*. In an imaging process, an electron beam 161 emanating from the tip of cathode 103 may be accelerated by anode 121 voltage, pass through gun aperture 122, beam limit aperture 125, condenser lens 126, and be focused into a probe spot 170 by the modified SORIL lens and impinge onto the surface of wafer 150. Probe spot 170 may be scanned across the surface of wafer 150 by a deflector, such as deflector 132*c* or other deflectors in the SORIL lens. Secondary or scattered primary particles, such as secondary electrons or scattered primary electrons emanated from the wafer surface may be collected by detector 144 to determine intensity of the beam and so that an image of an area of interest on wafer 150 may be reconstructed.

There may also be provided an image processing system 199 that includes an image acquirer 120, a storage 130, and controller 109. Image acquirer 120 may comprise one or more processors. For example, image acquirer 120 may comprise a computer, server, mainframe host, terminals, personal computer, any kind of mobile computing devices, and the like, or a combination thereof. Image acquirer 120 may connect with detector 144 of electron beam tool 100B through a medium such as an electrical conductor, optical fiber cable, portable storage media, IR, Bluetooth, internet, wireless network, wireless radio, or a combination thereof. Image acquirer 120 may receive a signal from detector 144 and may construct an image. Image acquirer 120 may thus acquire images of wafer 150. Image acquirer 120 may also perform various post-processing functions, such as generating contours, superimposing indicators on an acquired image, and the like. Image acquirer 120 may be configured to perform adjustments of brightness and contrast, etc. of acquired images. Storage 130 may be a storage medium such as a hard disk, random access memory (RAM), cloud storage, other types of computer readable memory, and the like. Storage 130 may be coupled with image acquirer 120 and may be used for saving scanned raw image data as original images, and post-processed images. Image acquirer 120 and storage 130 may be connected to controller 109. In some embodiments, image acquirer 120, storage 130, and controller 109 may be integrated together as one electronic control unit.

In some embodiments, image acquirer 120 may acquire one or more images of a sample based on an imaging signal received from detector 144. An imaging signal may correspond to a scanning operation for conducting charged particle imaging. An acquired image may be a single image comprising a plurality of imaging areas that may contain various features of wafer 150. The single image may be stored in storage 130. Imaging may be performed on the basis of imaging frames.

The condenser and illumination optics of the electron beam tool may comprise or be supplemented by electromagnetic quadrupole electron lenses. For example, as shown in FIG. 2B, electron beam tool 100B may comprise a first quadrupole lens 148 and a second quadrupole lens 158. In some embodiments, the quadrupole lenses are used for controlling the electron beam. For example, first quadrupole lens 148 can be controlled to adjust the beam current and second quadrupole lens 158 can be controlled to adjust the beam spot size and beam shape.

FIG. 2B illustrates a charged particle beam apparatus in which an inspection system may use a single primary beam that may be configured to generate secondary electrons by interacting with wafer 150. Detector 144 may be placed along optical axis 105, as in the embodiment shown in FIG. 2B. The primary electron beam may be configured to travel along optical axis 105. Accordingly, detector 144 may include a hole at its center so that the primary electron beam may pass through to reach wafer 150. FIG. 3G shows an example of detector 144 having an opening 145 at its center. However, some embodiments may use a detector placed off-axis relative to the optical axis along which the primary electron beam travels. For example, as in the embodiment shown in FIG. 2A, beam separator 222 may be provided to direct secondary electron beams toward a detector placed off-axis. Beam separator 222 may be configured to divert secondary electron beams by an angle $\alpha$.

Another example of a charged particle beam apparatus will now be discussed with reference to FIG. 2C. Electron beam tool 100C (also referred to herein as apparatus 100C) may be an example of electron beam tool 100 and may be similar to electron beam tool 100A shown in FIG. 2A.

Figure 2C:
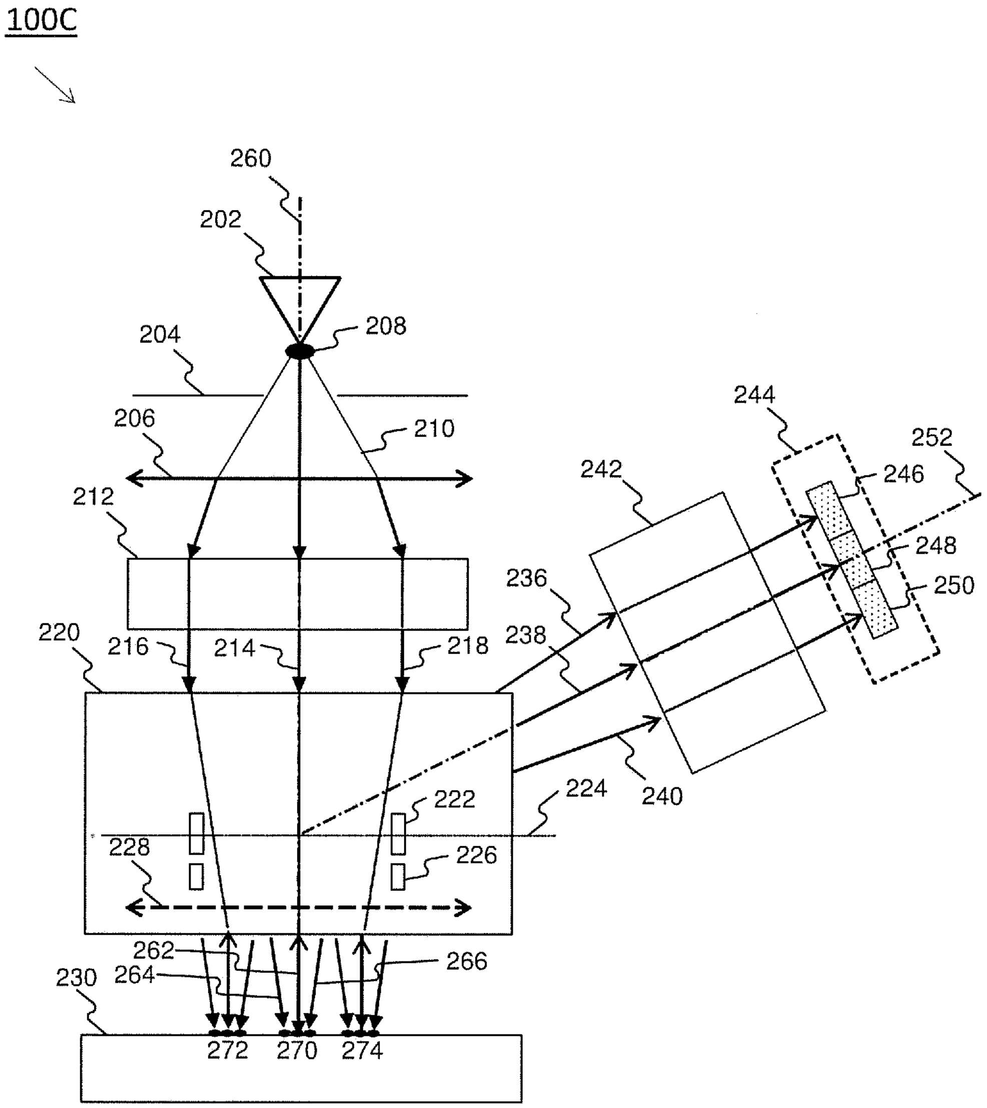

As shown in FIG. 2C, beam separator 222 may be a beam separator of Wien filter type generating an electrostatic dipole field and a magnetic dipole field. In some embodiments, if they are applied, the force exerted by electrostatic dipole field on an electron of beamlets 214, 216, and 218 may be equal in magnitude and opposite in direction to the force exerted on the electron by magnetic dipole field.

Beamlets 214, 216, and 218 can therefore pass straight through beam separator 222 with zero deflection angle. However, the total dispersion of beamlets 214, 216, and 218 generated by beam separator 222 may also be non-zero. For a dispersion plane 224 of beam separator 222, FIG. 2C shows dispersion of beamlet 214 with nominal energy V0 and an energy spread ΔV into beamlet portions 262 corresponding to energy V0, beamlet portion 264 corresponding to energy V0+ΔV/2, and beamlet portion 266 corresponding to energy V0−ΔV/2. The total force exerted by beam separator 222 on an electron of secondary electron beams 236, 238, and 240 can be non-zero. Beam separator 222 may separate secondary electron beams 236, 238, and 240 from beamlets 214, 216, and 218 and direct secondary electron beams 236, 238, and 240 towards secondary optical system 242.

A semiconductor electron detector (sometimes called a "PIN detector") may be used in apparatus 100 in EBI system 10. EBI system 10 may be a high-speed wafer imaging SEM including an image processor. An electron beam generated by EBI system 10 may irradiate the surface of a sample or may penetrate the sample. EBI system 10 may be used to image a sample surface or structures under the surface, such as for analyzing layer alignment. In some embodiments, EBI system 10 may detect and report process defects relating to manufacturing semiconductor wafers by, for example, comparing SEM images against device layout patterns, or SEM images of identical patterns at other locations on the wafer under inspection. A PIN detector may include a silicon PIN diode that may operate with negative bias. A PIN detector may be configured so that incoming electrons generate a relatively large and distinct detection signal. In some embodiments, a PIN detector may be configured so that an incoming electron may generate a number of electron-hole pairs while a photon may generate just one electron-hole pair. A PIN detector used for electron counting may have numerous differences as compared to a photodiode used for photon detection, as shall be discussed as follows.

Figure 3A:
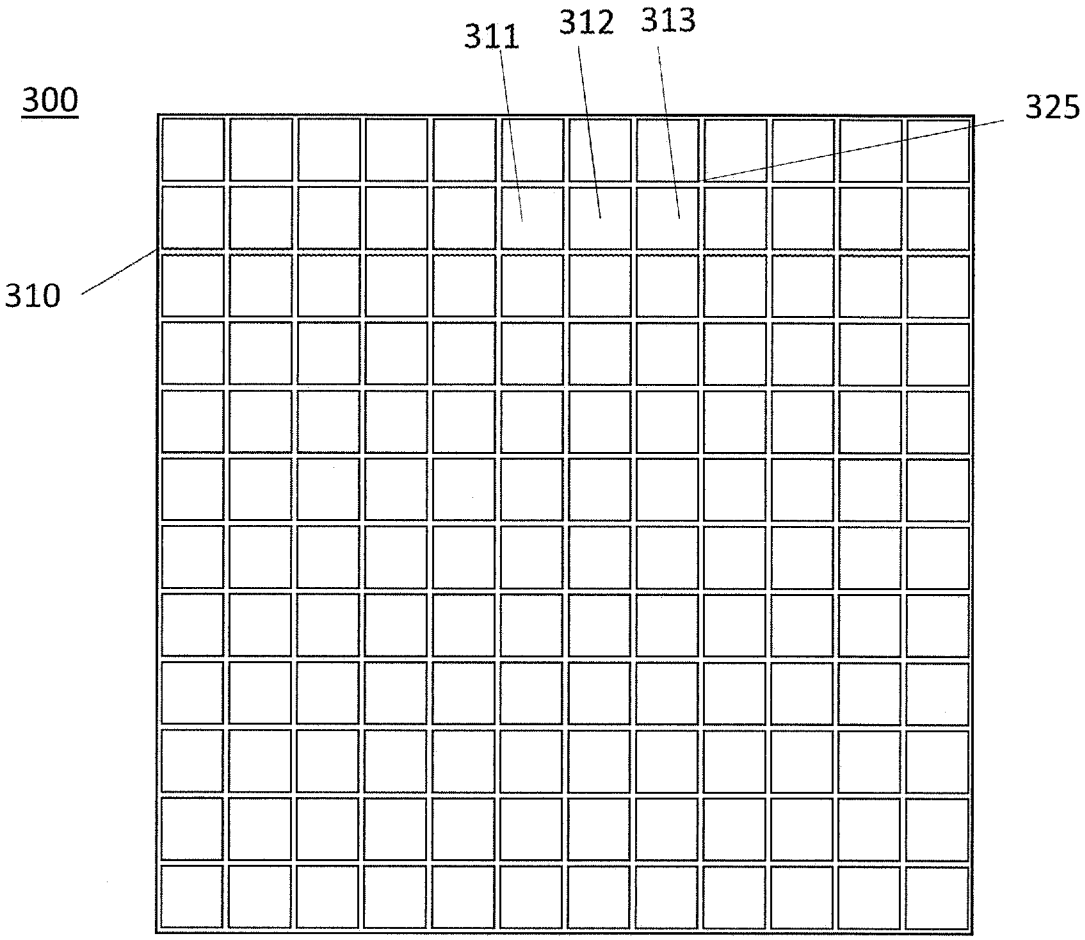
FIG. 3A is a representation of an exemplary structure of a detector, consistent with embodiments of the present disclosure.

Reference is now made to FIG. 3A, which illustrates a schematic representation of an exemplary structure of a detector 300. Detector 300 may be provided as detector 144 or electron detection device 244 with reference to FIG. 2A, FIG. 2B, and FIG. 2C. While one array is shown in FIG. 3A, it is appreciated that detector 300 may include multiple arrays, such as one array for each secondary electron beam.

Detector 300 may comprise an array of sensing elements, including sensing elements 311, 312, and 313. The sensing elements may be arranged in a planar, two-dimensional array, the plane of the array being substantially perpendicular to an incidence direction of incoming charged particles. In some embodiments, detector 300 may be arranged so as to be inclined relative to the incidence direction.

Detector 300 may comprise a substrate 310. Substrate 310 may be a semiconductor substrate that may include the sensing elements. A sensing element may be a diode. A sensing element may also be an element similar to a diode that can convert incident energy into a measurable signal. The sensing elements may comprise, for example, a PIN diode, an avalanche diode, an electron multiplier tube (EMT), etc., or combinations thereof. An area 325 may be provided between adjacent sensing elements. Area 325 may be an isolation area to isolate the sides or corners of neighboring sensing elements from one another. Area 325 may comprise an insulating material that is a material different from that of other areas of the detection surface of detector 300. Area 325 may be provided as a cross-shaped area as seen in the plane view of FIG. 3A. Area 325 may be provided as a square. In some embodiments, area 325 may not be provided between adjacent sides of sensing elements. For example, in some embodiments, there may be no isolation area provided on a detection surface of a detector.

Sensing elements may generate an electric signal commensurate with charged particles received in the active area of a sensing element. For example, a sensing element may generate an electric current signal commensurate with the energy of a received electron. A pre-processing circuit may convert the generated current signal into a voltage that may represent the intensity of an electron beam spot or a part thereof. The pre-processing circuitry may comprise, for example, pre-amp circuitries. Pre-amp circuitries may include, for example, a charge transfer amplifier (CTA), a transimpedance amplifier (TIA), or an impedance conversion circuit coupled with a CTA or a TIA. In some embodiments, signal processing circuitry may be provided that provides an output signal in arbitrary units on a timewise basis. There may be provided one or a plurality of substrates, such as dies, that may form circuit layers for processing the output of sensing elements. The dies may be stacked together in a thickness direction of the detector. Other circuitries may also be provided for other functions. For example, switch actuating circuitries may be provided that may control switching elements for connecting sensing elements to one another.

Figure 3B:
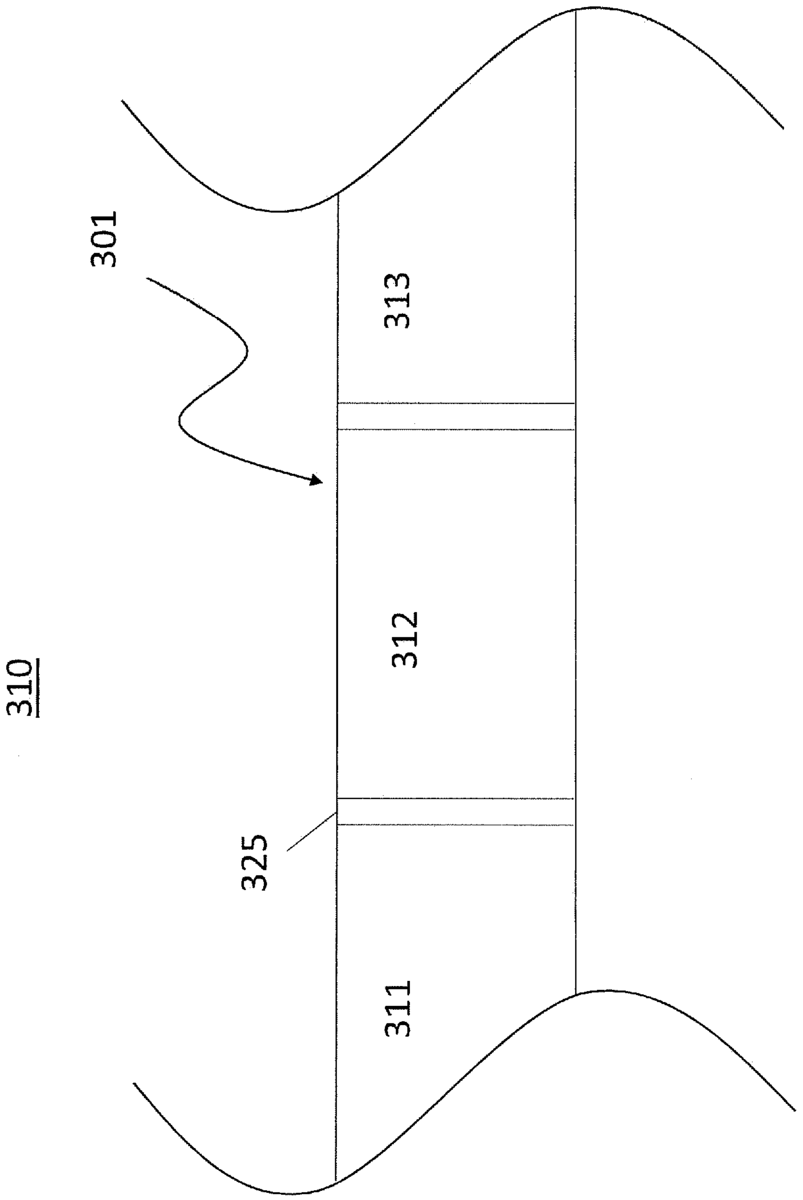
FIG. 3B and FIG. 3C are diagrams illustrating cross-sectional views of detectors, consistent with embodiments of the present disclosure.

Reference is now made to FIG. 3B, which shows a schematic illustration of a cross-sectional structure of a substrate 310, which may be an example of a structure included in a PIN detector. Substrate 310 may comprise one or more layers. For example, substrate 310 may be configured to have a plurality of layers stacked in a thickness direction, the thickness direction being substantially parallel to an incidence direction of an electron beam. In some embodiments, substrate 310 may have a plurality of layers stacked in a direction perpendicular to the incidence direction of an electron beam. Substrate 310 may be provided with a sensor surface 301 for receiving incident charged particles. Sensing elements (for example sensing elements 311, 312, and 313) may be provided in a sensing layer of substrate 310. Area 325 may be provided between adjacent sensing elements. For example, substrate 310 may comprise a trench, or other structure that is made of or filled with insulating material. In some embodiments, area 325 may extend fully or partially through substrate 310.

Figure 3C:
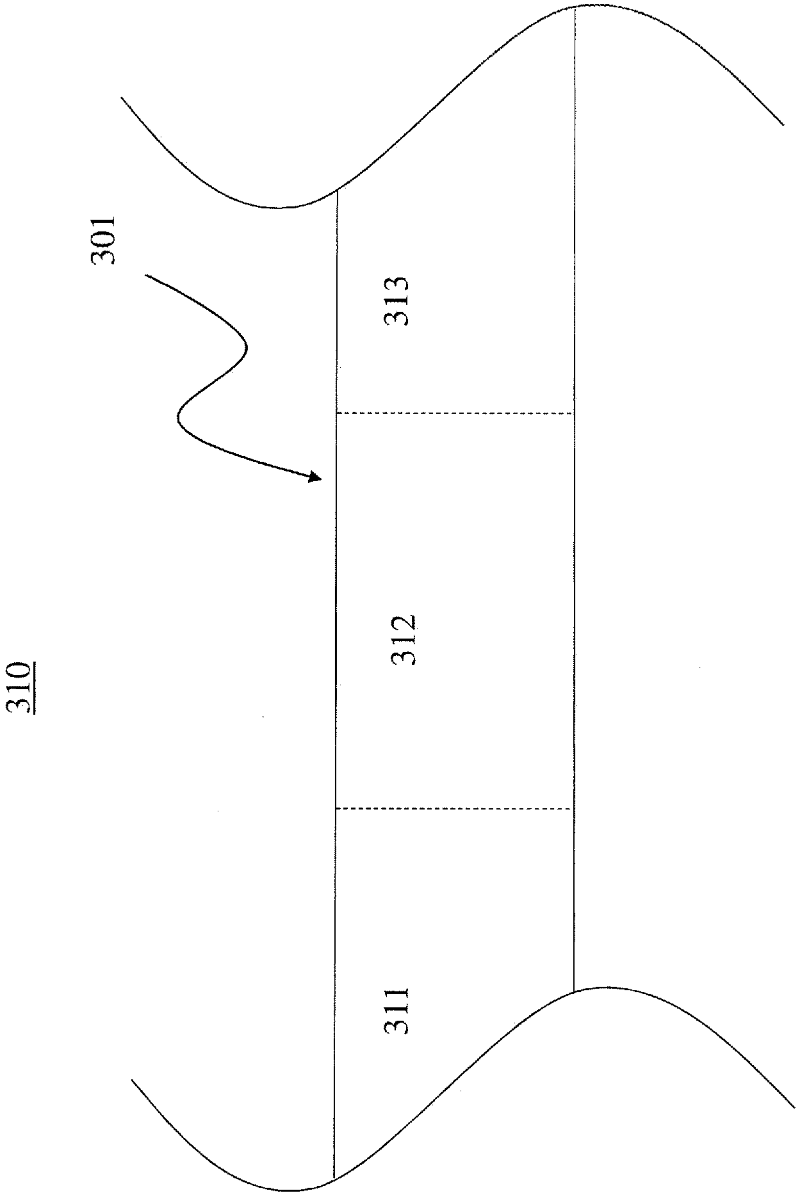

As shown in FIG. 3C, in some embodiments, area 325 may not be provided between sensing elements. For example, there may be no insulating material provided between the sides of adjacent sensing elements in cross-sectional view. The plurality of sensing elements may be contiguous in cross-sectional view. Isolation between adjacent sensing elements may still be achieved by other means, such as by controlling electrical field. For example, electrical field may be controlled between each sensing element.

Although the figures may show sensing elements 311, 312, and 313 as discrete units, such divisions may not actually be present. For example, the sensing elements of a detector may be formed by a semiconductor device constituting a PIN diode device. The PIN diode device may be manufactured as a substrate with a plurality of layers including a p-type region, an intrinsic region, and an n-type region. One or more of such layers may be contiguous in cross-sectional view. In some embodiments, however, sensing elements may be provided with physical separation between them. Further layers may also be provided in addition to the sensor layer, such as a circuit layer, and a read-out layer, for example.

As one example of a further layer, detector 300 may be provided with one or more circuit layers adjacent to the sensor layer. The one or more circuit layers may comprise line wires, interconnects, and various electronic circuit components. The one or more circuit layers may comprise a processing system. The one or more circuit layers may comprise signal processing circuitries. The one or more circuit layers may be configured to receive the output current detected from sensing elements in the sensor layer. The one or more circuit layers and the sensor layer may be provided in the same or separate dies, for example.

Figure 3D:
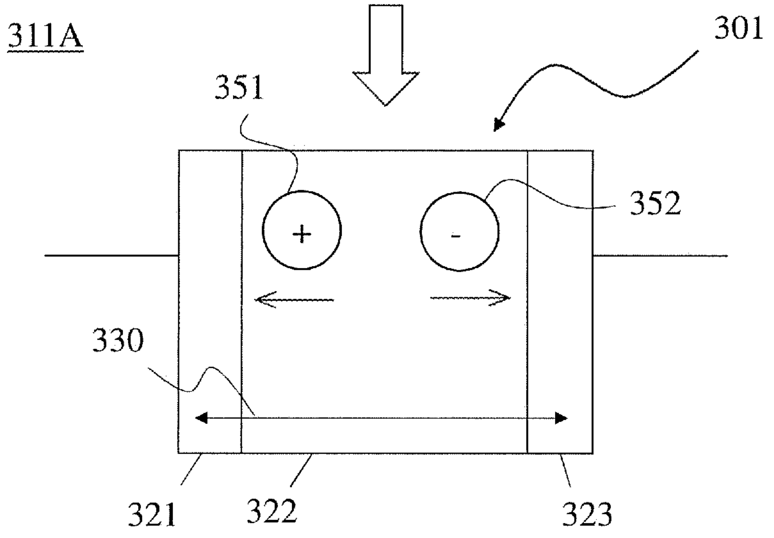
FIG. 3D and FIG. 3E are diagrams illustrating cross-sectional views of individual detector elements, consistent with embodiments of the present disclosure.
Figure 3E:
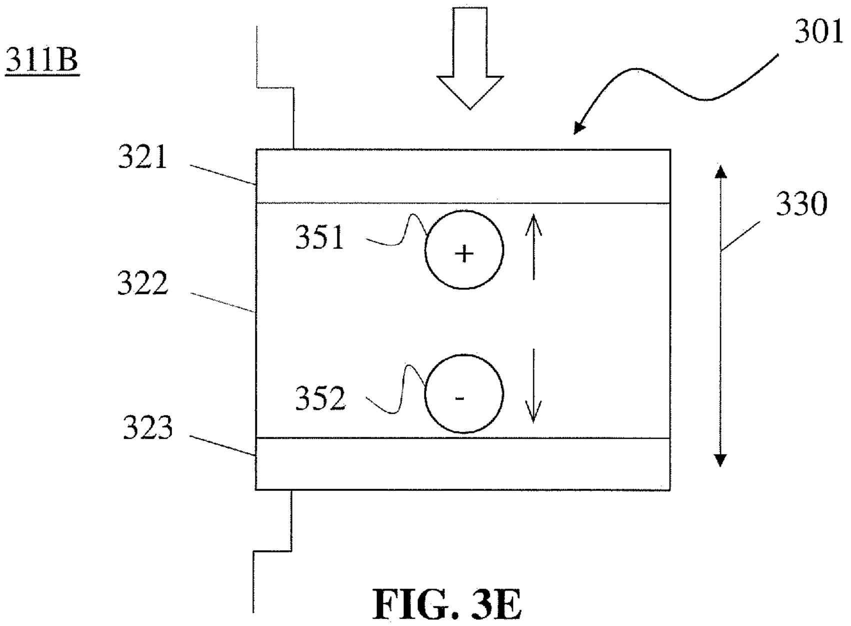

FIGS. 3D and 3E show schematic illustrations of individual sensing elements, which may be an example of one of sensing elements 311, 312, and 313. For example, in FIG. 3D, a sensing element 311A is shown. Sensing element 311A may include a semiconductor structure of a p-type layer 321, an intrinsic layer 322, and an n-type layer 323. Sensing element 311A may include two terminals, such as an anode and a cathode. Sensing element 311A may be reverse biased, and a depletion region 330 may form and may span part of the length of p-type layer 321, substantially the entire length of intrinsic layer 322, and part of the length of n-type layer 323. In depletion region 330, charge carriers may be removed, and new charge carriers generated in depletion region 330 may be swept away according to their charge. For example, when an incoming charged particle reaches sensor surface 301, electron-hole pairs may be created, and a hole 351 may be attracted toward p-type layer 321 while an electron 352 may be attracted toward n-type layer 323. In some embodiments, a protection layer may be provided on sensor surface 301.

As shown in FIG. 3E, a sensing element 311B may operate in a similar manner to that of sensing element 311A except that an orientation is changed. For example, p-type layer 321 may include sensor surface 301. P-type layer 321 may be exposed to incident charged particles. Thus, an incident charged particle may interact with p-type layer 321 and depletion region 330, and may generate electron-hole pairs. In some embodiments, a metal layer may be provided on top of p-type layer 321.

In operation, a depletion region of a detection element may function as a capture region. An incoming charged particle may interact with the semiconductor material in the depletion region and generate new charges. For example, the detection element may be configured such that a charged particle having a certain amount of energy or greater may cause electrons of the lattice of the semiconductor material to be dislodged, thus creating electron-hole pairs. The resulting electrons and holes may be caused to travel in opposite directions due to, for example, an electric field in the depletion region. Generation of carriers that travel toward terminals of the sensing element may correspond to current flow in the detection element.

In a comparative example, a photodiode may be configured to generate electric charge in response to receiving photons. A photon may have energy that corresponds to its wavelength or frequency. Typically, a photon in the visible light spectrum may have energy on the order of about 1 eV. However, in a semiconductor photodiode, it is typical that about 3.6 eV may be required to generate one electron-hole pair. Therefore, photodiodes may encounter difficulties in detecting current generation such as the following.

In general, a level of energy of a photon may be similar to that required to generate an electron-hole pair in a semiconductor photodiode. Thus, in order to generate electric current stably and reliably, it may be necessary that photons of high energy be incident on a semiconductor photodiode. A photon may have energy sufficient to generate one electron-hole pair when its frequency is at or above a certain level.

Furthermore, the electric current generated by electron-hole pairs in response to photon arrival events may be relatively low. Current generated in response to photon arrival events may not be sufficient to overcome background noise. Some diodes, such as a photodiode biased to avalanche or Geiger counting mode, may employ amplification to generate a larger level of electric current so that a useful detection signal can be generated. In some embodiments, a photodiode may be biased to avalanche operation mode. In some embodiments, amplification may be provided by gain blocks attached to the photodiode. An avalanche effect may be generated from strong internal electric fields resulting from bias voltage. The avalanche effect may be used to achieve amplification due to impact ionization.

Background noise in a detector may be caused by, among other things, dark current in a diode. For example, imperfections in a crystal structure of a semiconductor device acting as a diode may cause current fluctuation. Dark current in a detector may be due to defects in materials forming the detector and may arise even when there is no incident irradiation. "Dark" current may refer to the fact that current fluctuation is not related to any incoming charged particle.

A diode may be configured to generate electron-hole pairs when a particle (e.g., a photon) with no less than a certain level of energy enters the diode. For example, a photodiode may only generate an electron-hole pair when a photon with no less than a certain level of energy enters the photodiode. This may be due to, for example, the band gap of the materials that form the photodiode. A photon with energy equal to the certain level may be able to generate only one electron-hole pair, and even if a photon has more energy exceeding the certain level, it still may only generate one electron-hole pair. No additional electron-hole pairs may be generated. Meanwhile, an electron detector may be configured so that whenever an electron enters the depletion region of a detector sensing element, which may include a diode, as long as the electron has energy of not less than a certain amount, e.g., about 3.6 eV, electron-hole pairs may begin to be generated. If the electron has more energy than the certain amount, more electron-hole pairs may be generated during the arrival event of the incoming electron.

In a diode configured for photon detection, defects in the diode may cause random generation of electron-hole pairs in the diode due to, for example, imperfections in a crystal lattice of a semiconductor structure. Dark current may be amplified by amplification effects, such as an avalanche amplification. The signal resulting from dark current may go on to be input into a counting circuit where it may be recorded as an arrival event. Such an event may be referred to as a "dark count." Furthermore, amplifiers themselves may contribute to noise. Therefore, various sources of noise, such as dark current, thermal energy, extraneous radiation, etc., may cause unintended current fluctuations in a detector's output.

In contrast to a photon, an electron may have significantly more energy that may be useful in generating signals in a diode. Incident electrons on a sensing element of a detector may have significantly more energy than a threshold level of energy necessary to generate an electron-hole pair in the sensing element. Accordingly, incident electrons may generate numerous electron-hole pairs in a sensing element.

Figure 3F:
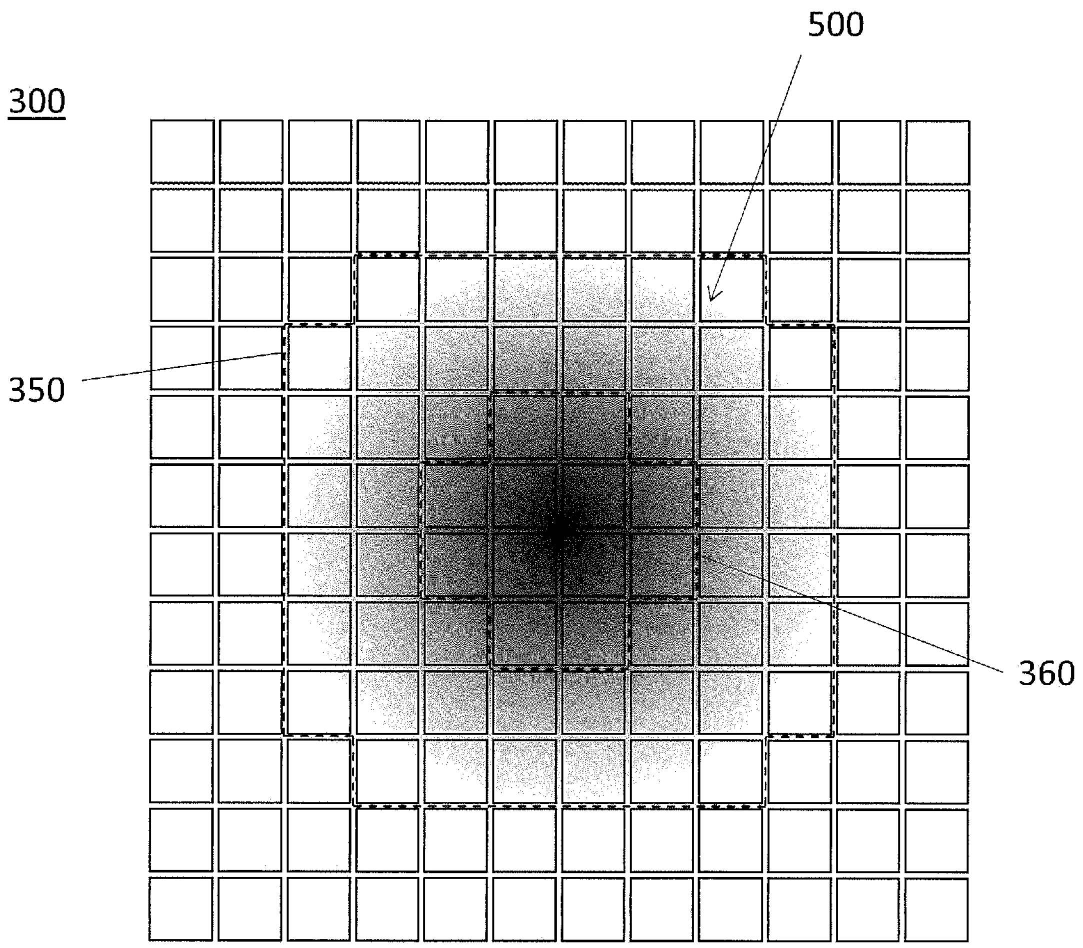
FIG. 3F is a diagram illustrating a detector, consistent with embodiments of the present disclosure.
Figure 3G:
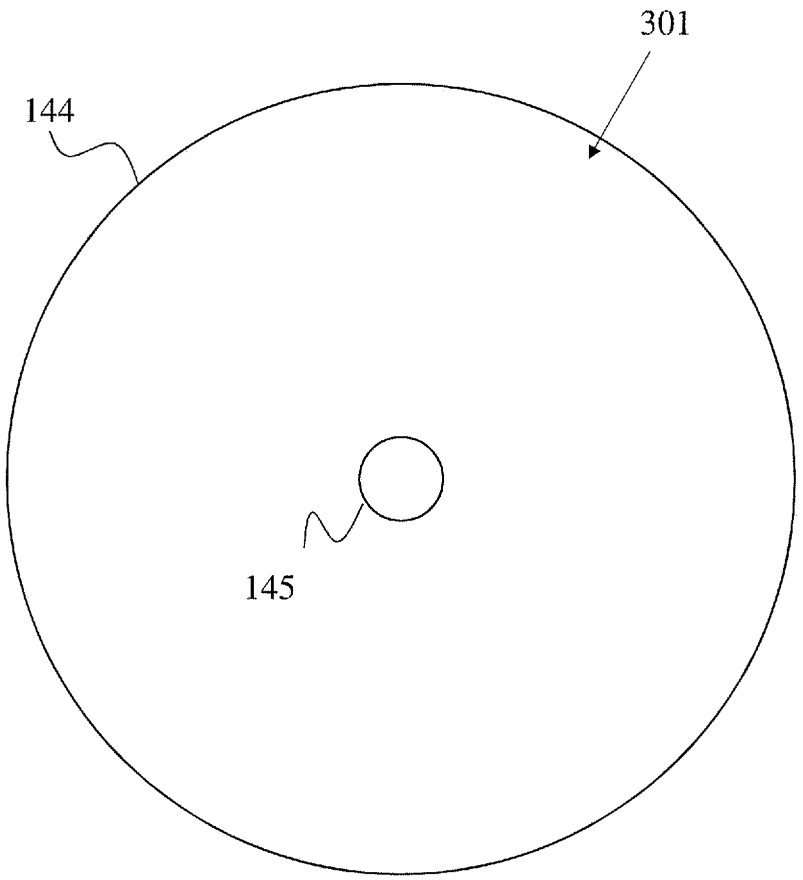
FIG. 3G is a representation of an exemplary structure of a detector, consistent with embodiments of the present disclosure.

Reference is now made to FIG. 3F, which shows an exemplary view of a charged particle beam spot 500 received on detector 300. Beam spot 500 may have a round shape with no loci offset, as illustrated. In some embodiments, the beam spot may have a shape other than round. For example, in a single beam system, a beam spot may have a shape that deviates from a circular shape due to aberration. Furthermore, in some embodiments, multiple beam spots may be incident on a detector, such as in a multi-beam system. Beam spots may deviate from a round shape in terms of, for example, location, shape, and grid spacing (e.g., the pitch between beam spots when multiple beam spots are formed). Deviations may be due to aberration, dispersion, drift in an electron optical system, or imperfections of components, for example.

In some embodiments, a detection system may include a controller that may be configured to determine that charged particles are incident on a detector. The controller may be configured to determine a number of charged particles incident on sensing elements of the detector within a frame. For example, the controller may perform charged particle counting, such as electron counting. Charged particle counting may be done frame-by-frame. The detector may be configured such that individual sensing elements (such as sensing elements 311, 312, and 313 of FIG. 3A) output a detection signal on a timewise basis. The detection signal may be transmitted to the controller. The detection signal may be, for example, a signal in amperes, volts, or arbitrary units commensurate with energy of electrons received at the respective sensing element. The controller may determine, based on the detection signal, that a discrete number of charged particles arrive at a sensing element. The number of charged particles may be discerned as a whole number.

The controller may be configured to determine a first group of sensing elements among the plurality of sensing elements provided in the detector based on a first grouping criteria. The first grouping criteria may comprise a condition that, for example, at least one charged particle is incident on each of a first number of sensing elements of the detector. The first number may be in terms of a raw number or a proportion of sensing elements. The controller may be configured to make the determination of the first group on a timewise basis within a period of one frame. The determination may be made repeatedly over a plurality of frames, such that the controller has a frame rate for performing processing, such as making charged particle counting determinations within each frame. The controller may also determine a boundary line. For example, as shown in FIG. 3F, a boundary line 350 may be determined. Boundary line 350 may be provided so as to encompass sensing elements that receive at least one charged particle. The sensing elements contained within boundary line 350 may be covered, at least partially, by the same charged particle spot.

Beam spot 500 may have a well-defined center, or locus. Near the center of beam spot 500, the intensity may be higher than near the outer periphery. The difference in intensities may be attributed to various factors including tip size of electron source 202, aberration of the electron optics system, electron dispersion, and other parameters of apparatus 100A, etc. Moreover, in some embodiments, variations in intensities may be caused by the sample topography of scattered electrons, material (for example in the case of back-scattered electrons), charging conditions on the sample surface, landing energy, etc. Thus, areas of high intensity may not necessarily be at the center of beam spot 500.

In areas of beam spot 500 where intensity is higher, there may be more than one electron incident on a sensing element of the detector. Thus, the controller may be configured to determine a second group of sensing elements based on a second grouping criteria. The second grouping criteria may comprise a condition that more than one charged particle is incident on each of a second number of sensing elements. The second group containing the second number of sensing elements may be determined among the first group containing the first number of sensing elements. That is, the second group may be a subset of the first group. The determination of the second group may be made concurrently with the determination of the first group. Thus, determinations of the first group and the second group may be for the same frame. The controller may also determine a second boundary line 360 that encompasses the sensing elements that receive more than one charged particle.

The controller may be configured to determine or adjust a frame rate (or period) of performing processing. The processing may correspond to image processing for generating a SEM image based on output from the detector, for example. The processing may also include determining the first group of sensing elements and the second group of sensing elements, as discussed above. The period of a first frame may be determined based on a first parameter, as follows. The period may be set so that a first predetermined number of sensing elements receive at least one incident charged particle in the first frame. The first predetermined number may be a proportion, for example A %, of sensing elements among all the sensing elements of the detector. The first predetermined number may also be a certain proportion of sensing elements among those in a particular region of the detector, and not necessarily among all of the sensing elements. For example, the first predetermined number may be a proportion of sensing elements in a first quadrant of the detector. The first predetermined number may also be a raw number, such as X sensing elements.

In addition, the period may be set based on a second parameter. The second parameter may be that a second predetermined number of sensing elements each receive more than one incident charged particle in the first frame. For example, the second parameter may be that among sensing elements that receive at least one incident charged particle, only a second proportion, for example B %, of the sensing elements receive more than one charged particle. The second predetermined number may also be a raw number, such as Y sensing elements. Parameters may be adjusted so that the first parameter is satisfied before the second parameter is satisfied.

The first parameter and the second parameter may define boundary conditions for determining the period of the first frame. The first parameter or the second parameter may be used. The first parameter and the second parameter may be used together. In addition to determining a period of the first frame, a frame rate for a plurality of frames may be determined. The frame rate may be a constant value that may be set based on, for example, a particular SEM setting. Thus, the frame rate may be the inverse of the period for the first frame. The frame rate may also be adaptive, that is, having a varying value. The adaptive frame rate may be set to adapt the signal intensity of the charged particle beam being detected.

In some embodiments, electron beam tool 100 may be configured so that the electron density within an electron beam spot is more evenly distributed. For example, controller 109 may control electron optics so that electron beams or beamlets are defocused. The electron optics may adjust the electron beam (or beamlets) so that its focal point is not coincident with the surface of detector 144 or electron detection device 244. Furthermore, a projection system in a secondary SEM column may be configured to defocus the secondary beam (or beamlets) to a certain extent. Additionally, magnification of the projection system in the secondary SEM column may be changed to enlarge the spot size of an electron beam or beamlet(s). The size of each beamlet spot may be enlarged. Magnification settings may be configured in consideration of crosstalk between beamlet spots.

FIG. 3G shows an example of a surface of detector 144 that may include a PIN detector. Detector 144 may include sensor surface 301 arranged so as to receive charged particles generated from a sample. In some embodiments of the disclosure, a PIN detector may be used as an in-lens detector in a retarding objective lens SEM column of EBI system 10. The PIN detector may be placed between a cathode for generating an electron beam and the objective lens. The electron beam emitted from the cathode may be potentialized at −BE keV (typically around −10 kV). Electrons of the electron beam may be immediately accelerated and travel through the column. The column may be at ground potential. Thus, electrons may travel with kinetic energy of BE keV while passing through opening 145 of detector 144. Electrons passing through the pole piece of the objective lens, such as pole piece 132*a* of objective lens assembly 132 of FIG. 2B, may be steeply decelerated down to landing energy LE keV as the wafer surface potential may be set at −(BE−LE) keV.

Figure 4A:
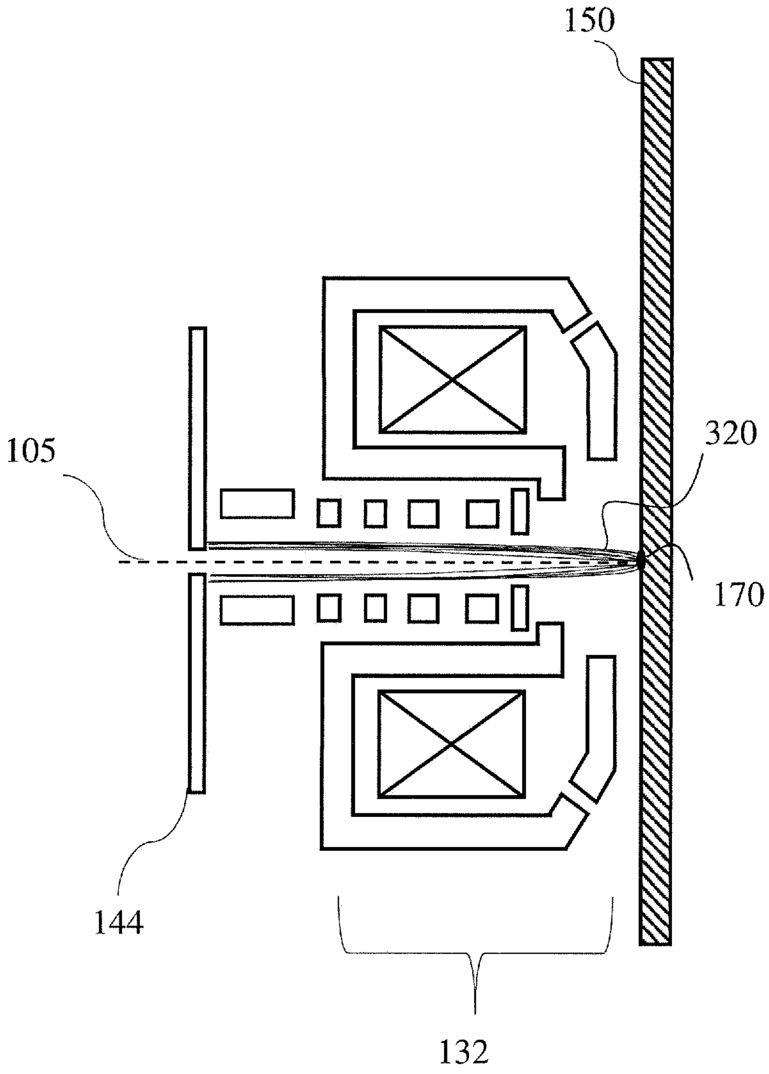
FIG. 4A is a view of a portion of FIG. 2B showing secondary electrons being projected toward a detector from a sample.

Secondary electrons emitted from the wafer surface by the impingements of electrons of the primary electron beam may be accelerated by an acceleration field (e.g., the retarding electrical field near the wafer may act as an acceleration field for secondary electrons) and travel backwards toward the PIN detector surface. For example, as shown in FIG. 4A, due to interactions with wafer 150 at probe spot 170, secondary electrons may be generated that travel back toward detector 144. Secondary electrons emitted from the wafer surface travelling along optical axis 105 may arrive at the surface of detector 144 with a distribution of positions. The landing positions of secondary electrons may be within a generally circular region with a radius of, for example, a few millimeters. A geometric spread of landing positions of secondary electrons may be due to electrons having different trajectories that may be dependent on, for example, initial kinetic energy and emission angles of the electrons.

Figure 4B:
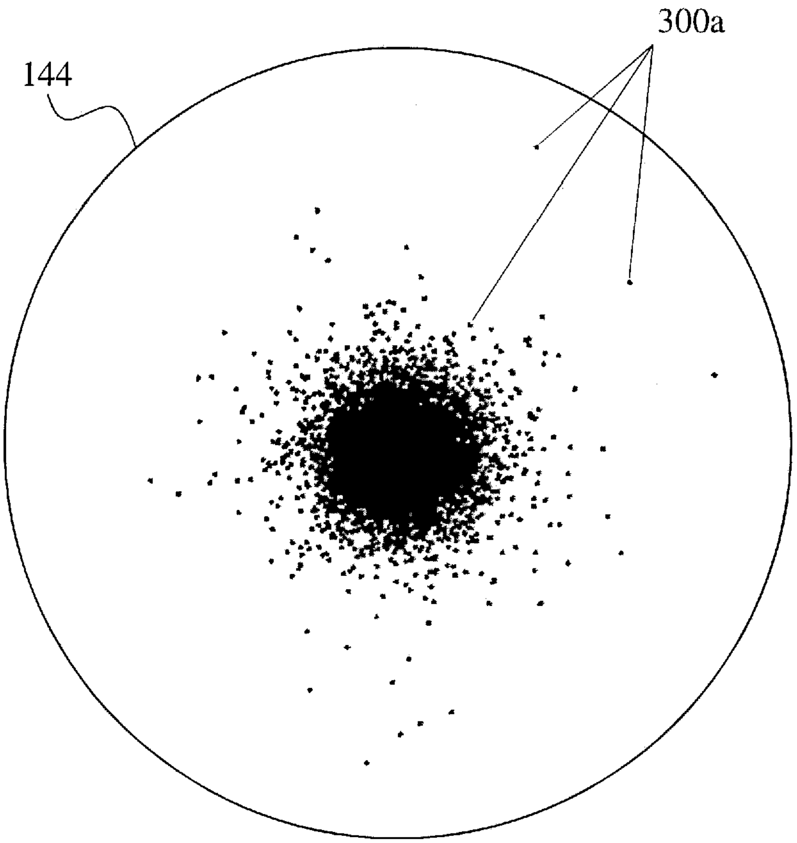
FIG. 4B illustrates an example of secondary electron landing point distribution on a detector surface, consistent with embodiments of the present disclosure.

FIG. 4B illustrates an example of secondary electron landing point distribution on a detector surface. Electrons 300*a* may land at different points on the surface of detector 144 while, generally, most may be clustered around the central portion of detector 144. Landing point distribution may shift depending on secondary emission position and SEM deflection fields (e.g., scan field). Therefore, in some applications, if a certain field of view (FOV) of an SEM image is required, the required size of an in-lens PIN detector may be substantially large. Typically, a detector may be 10 mm in diameter, or larger, for example. In some embodiments, a detector may be about 4 to 10 mm in diameter.

Electrons incident on the detection surface of a PIN detector may be converted to an electrical charge. The electrical charge may be collected at a terminal of the PIN detector and used as a detection signal that may be proportional to the incoming electron rate. In an ideal PIN detector, kinetic energy of an incoming electron having energy (BE−

LE) keV may be fully consumed by creating numerous electron-hole pairs at a rate of about 3.61 eV per pair. Therefore, for an incoming electron of 10,000 eV energy, approximately 2,700 electron-hole pairs may be created. In contrast to a photon arrival event that may generate just a single electron-hole pair, electron arrival events may generate significantly more electron-hole pairs.

A sensing element may be configured to generate numerous electron-hole pairs in response to an electron arrival event. In some embodiments, electrical current generated in response to electron arrival events in a sensing element may be usable as a detection current signal. Output of a sensing element in response to an electron arrival event may be used as-is or may undergo relatively small amplification. The need to provide amplification may be reduced or omitted. Omitting or providing reduced amplification may be beneficial for decreasing noise. Furthermore, an amplifier may indiscriminately apply amplification to all signals generated in a diode. Therefore, even so-called "dark counts" may be amplified and may contribute to erroneous detection signals.

In some embodiments according to the disclosure, dark current may generate only small output in comparison to charged particles that a sensing element is configured to detect. For example, dark current may be caused by a dislocation in the crystal lattice of a semiconductor structure of a diode may allow an electron to become dislodged. In some cases, dark current may thus result in only a single electron-hole pair being generated in a sensing element. However, as discussed above, in a sensing element configured to generate numerous electron-hole pairs in response to the arrival of a charged particle, such as a secondary electron, about 3,000 electron-hole pairs may be generated. Thus, there may be a ratio of signal to dark current noise of about 3,000:1.

A semiconductor diode, such as a diode having a PIN structure, may be operated in various modes. For example, in a first mode, the diode may be operated with normal reverse bias. In this mode, each incoming photon with high enough energy may generate only one electron-hole pair. When outside radiation (e.g., incoming photons) disappears, current flow in the diode may stop immediately.

In a second mode of operating a diode, the diode may be operated with higher reverse bias than that in the first mode. The second mode may introduce impact ionization. This may also be referred to as avalanche photodiode mode. In this mode, each incoming photon with high enough energy may generate one electron-hole pair. Then, due to internal impact ionization, this one pair may be multiplied by avalanche gain so that several electron-hole pairs may eventually be generated. Thus, each incoming photon may result in several electron-hole pairs being generated. When outside radiation disappears, current flow in the diode may stop immediately. The second mode may include a linear region and a nonlinear region.

In a third mode of operating a diode, the diode may be operated with even higher reverse bias than that in the second mode. The third mode may introduce stronger impact ionization. The third mode may enable photon counting. The third mode may include Geiger counting mode. In the third mode, each incoming photon with high enough energy may generate one electron-hole pair. Then, due to internal impact ionization, this one pair may be multiplied by the avalanche gain so that several electron-hole pairs may eventually be generated. Thus, each incoming photon may result in several electron-hole pairs being generated. Due to strong internal electric field from high reverse bias voltage, the multiplication process may continue. Multiplication may be self-sustaining. When outside radiation disappears, current flow in the diode may not necessarily stop. Current in the diode may be stopped by disconnecting the diode from a power supply. After disconnection, current in the diode may then subside. Current output of a diode operated in the third mode may exhibit behavior including a long tail. For example, the output may gradually decrease after an initial peak. In the third mode, the diode may be provided with a quenching circuit. The quenching circuit may include a passive or an active quenching circuit. Actuating the quenching circuit may allow the diode to be shut down after each photon arrival event. Quenching may be used to reset a diode.

A diode may be configured to operate with a level of gain. For example, a diode may be configured to operate with gain below 100. This may refer to a gain imparted by operation of the diode by application of voltage. The gain may amplify a signal up to, for example, 100 times relative to its original strength. It will be appreciated that other specific levels of gain may be used as well.

The use of a gain effect, such as that by a diode biased to avalanche mode or Geiger counting mode, may involve time-dependent phenomena. For example, a diode biased to avalanche mode may impart gain through avalanche multiplication. There may be a finite time associated with the gain effect. A diode may have a speed that is related to the time it takes for the gain effect to occur. A diode biased to avalanche mode, but not to Geiger counting mode, may have a speed that is at least equal to a speed of the diode under normal bias conditions. A diode biased to avalanche mode may also have a speed that is higher than that of the diode under normal bias conditions. In some situations, there may be a recovery time after an arrival event of a charged particle at the diode. A diode operated in Geiger counting mode may have an associated recovery time. Recovery time may limit the ability of a diode to detect discrete signals in close succession. A diode operated in Geiger counting mode may need to be quenched after a charged particle arrival event in order to accurately detect the next event.

If, for example, detectable events occur in close succession, issues may be encountered in applying a gain effect to amplify signals of subsequent events after the first event because an initial avalanche and its related effects are still ongoing. In contrast to a traditional diode operated in avalanche mode, a detector in accordance with some embodiments of the present disclosure may address issues related to recovery time. For example, as shall be discussed in more detail below, a PIN detector may be configured to generate electron-hole pairs with high gain, without requiring reverse biasing to, e.g., avalanche mode or Geiger counting mode. Gain provided in a PIN detector may be related to the kinetic energy of an incoming charged particle, such as an electron. A detector may include a sensing element having a PIN structure and a circuit. The need for providing a quenching circuit may be omitted. A detector may be configured to generate electron-hole pairs corresponding to a pulse lasting about 3 to 5 ns, or less, for example.

In an exemplary PIN detector, holes may be excited in a depletion region in an intrinsic area of the PIN detector and may drift by the field created by reverse bias in the PIN detector toward the anode. Then, the holes may be collected at the anode. Electrons generated in the depletion region may drift in an opposite direction to the holes. Thus, electrons may be collected at the cathode, which may be grounded. The holes and electrons created in the depletion region may be recombined with opposite charges within the PIN detector. The recombination rate may be high outside the depletion region. The depletion region may encompass part of the P+ region, which may act as the anode, due to the reverse bias. Recombination of holes or electrons on the side of the P+ region where incident electrons enter the detector may contribute to energy loss and will not contribute to detector current at the anode terminal. Therefore, it may be desirable to configure the electrode on the side where incident electrons enter the detector to be thin, e.g., to reduce energy loss. For example, in a PIN detector, it may be desirable to configure the P+ layer thickness to be as thin as possible.

Reverse bias applied to a PIN detector may involve voltage application. A diode may be configured to operate with a reverse voltage of a certain amount or less. In some embodiments, the certain amount may be 100 volts. The diode may be operated within a linear region.

In some embodiments, both secondary electrons and backscattered electrons may reach the detector. For example, in a comparative example, approximately 20 to 30% of incoming electrons on a PIN detector may be back-scattered electrons having energy approximately equal to energy of the electrons in the primary beam (e.g., BE). Back-scattered electrons may be the same electrons included in the primary beam generated by an electron source, only having been reflected back off a sample without losing a substantial amount of energy.

Furthermore, some electrons, not having been back-scattered, may lose their kinetic energy by causing a lattice atom in the PIN detector (e.g., in a silicon substrate, a Si atom) to emit its characteristic X-ray photons. Other excitation, such as phonons, etc., may also be generated. Thus, the number of charges created by a single incoming electron having a fixed kinetic energy may vary. That is, electron gain (e.g., the number of charges collected at the terminals of the diode per incoming electron) may vary between incoming electrons. However, in a typical PIN detector, even if electron gain varies, it should not exceed electron gain for an ideal PIN detector, as discussed above. Typically, the distribution of actual electron gain has a distinct peak at gain 0, representing detection loss due to electron scattering by the Si crystal.

Charges collected at the terminals of the PIN detector may form a current signal. The current signal may follow the modulation of incoming electron rate as an electron beam scans over a wafer surface.

Figure 5:
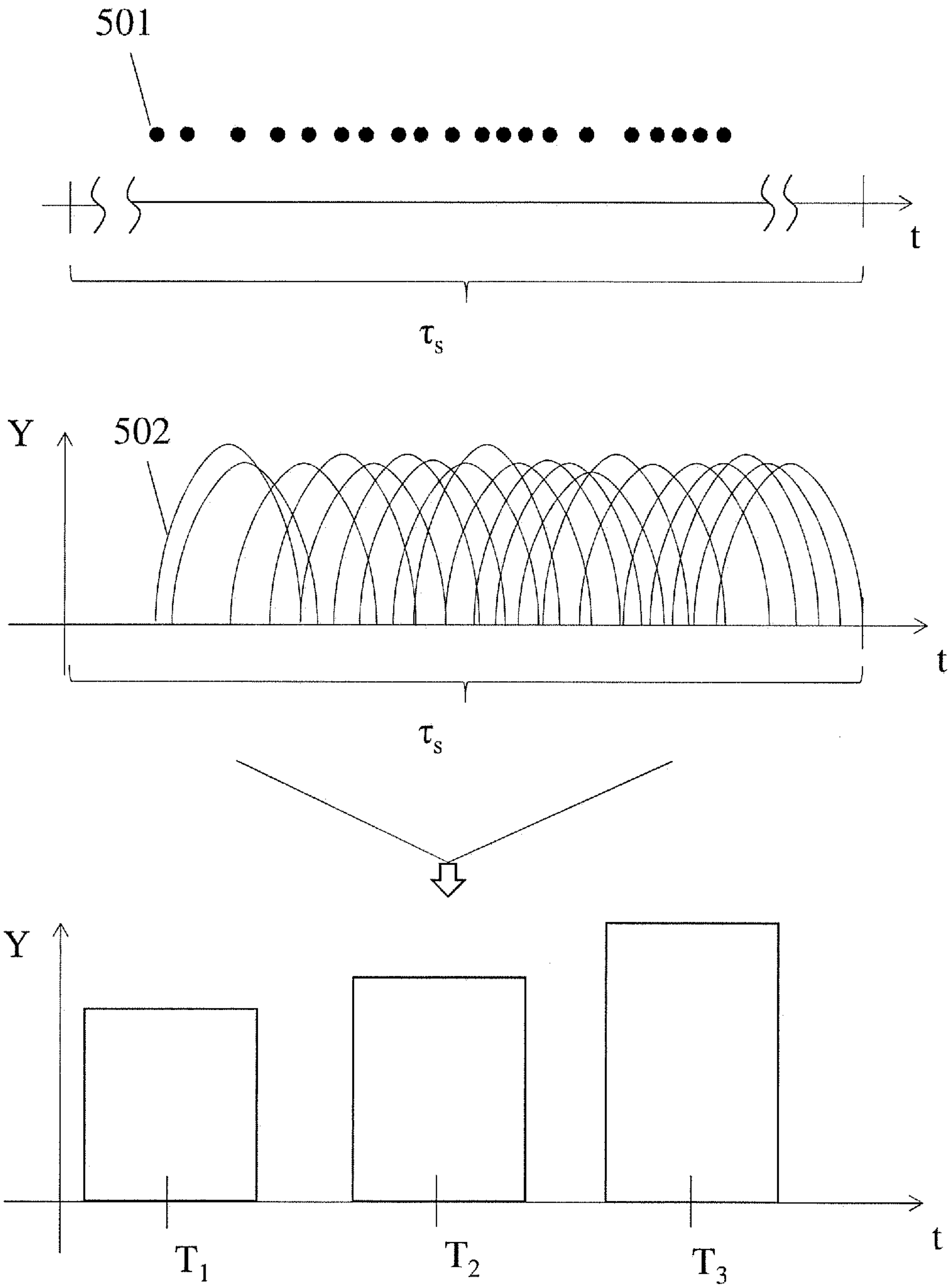
FIG. 5 a schematic representation of electron arrival events and their relationship to current signal.

FIG. 5 shows a schematic representation of electron arrival events and their relationship to current signal. In each of the three graphs of FIG. 5, the t-axis represents time. In the top graph of FIG. 5, single electrons 501 may be incident on the surface of a PIN detector at particular time points. As shown in the middle graph of FIG. 5, a plurality of theoretical signal pulses 502 may be generated in the PIN detector in response to an electron arrival event. The Y-axis may represent signal intensity in arbitrary units. Signal pulses may rise and fall with time and may have a pulse width that may be determined based on, for example, characteristics of the PIN detector and a circuit connected to the PIN detector. As discussed above, signal pulses may have an amplitude that may vary in accordance with how many electron-hole pairs may be generated in response to an electron arrival event. Signal pulse 502 may represent, for example, an ideal signal pulse corresponding to generation of electron-hole pairs in response to an electron arrival event at a rate of 3.61 eV per pair. Because electrons may arrive on the detector surface in close succession, signal pulses may overlap with one another. It will be understood that the illustrated signal pulses are merely schematic.

In one sampling period Is, there may be multiple electrons incident on the detector in close succession and therefore, when current signal is read, signal pulses of individual electrons may be substantially overlapped. An output signal at the time the signal is read may correspond to electrical current generated in response to multiple electron arrival events. As shown in the bottom graph of FIG. 5, a single output signal at time $T_2$ may correspond to electron arrival rate at that instant. Signal output will be read at different time points, e.g., time $T_1$, $T_2$, $T_3$, and so on, as the electron beam scans over the wafer surface, receiving different rates of electrons at each time. Accordingly, a timewise signal may be generated that may be used to reconstruct an image.

In some embodiments, raw detector current signal may be fed to a pre-amplifier. The pre-amplifier may include a current buffer and a transimpedance amplifier (TIA). Then, the signal may be further amplified by a main amplifier. The fully amplified signal is the signal that may be sampled and may be converted by an analog-to-digital converter (ADC) at each pixel period. A pixel period may correspond to a period of time for which data is associated with one pixel of a SEM image. The digital signal (typically, an 8-bit signal) may be sent to an image processor. The image processor may generate a frame image (e.g., a 2-D array of pixel data) as the primary electron beam completes one cycle of a raster scan over a region of a specimen. The image processor may have an aggregating (or accumulation) function that may use multiple frame images taken over the same scanned area for improving the SNR of the acquired image. In some applications, a certain level of SNR may be desired for performing defect detection or critical dimension (CD) measurement.

Figure 6:
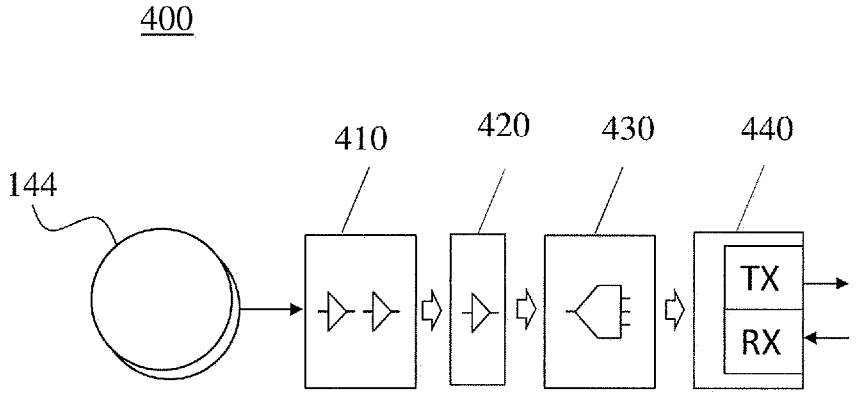
FIG. 6 is a representation of a detection system architecture using an analog signal.

Reference is now made to FIG. 6, which shows a representation of a detection system architecture that may be configured for handling an analog signal from a detector. A detection system 400 may be provided that includes detector 144, a signal conditioning circuit 410, an analog signal processing path 420, an ADC 430, and a digital interface 440. Signal conditioning circuit 410 may include circuitry that is configured to process an output of a detection element of detector 144, such as a PIN diode. Signal conditioning circuit 410 may include a current buffer and a transimpedance amplifier. Analog signal processing path 420 may include a main amplifier. ADC 430 may convert analog signal to an 8-bit digital signal. Digital interface 440 may communicate with components of EBI system 10, for example, a deflection and image control (DIC) unit via a transceiver, which may include a transmitter TX and receiver RX. Digital interface 440 may also include a digital switch, a digital control unit, or a controller configured to perform image processing, among other things. Further circuitries may be provided in the architecture, such as a signal processing path that is configured to provide gain and offset control, for example.

At high electron beam current, such as a case where a 4 nA beam of secondary electrons is incident on a detector, it is known that the average number of electrons arriving at the detector may be a certain number, for example, about 250 electrons per 10 ns sampling period for a pixel. That is, in one pixel period of 10 ns (corresponding to 100 MHz sampling rate), there may be an average of about 250 electrons arriving at the detector. The detector may generate current in response to receiving electrons on the detection surface, as described above. Width of current pulses may be related to the speed of the detector, the signal path, or the combination of the detector and signal conditioning circuits. The speed of the detector may be also partially determined by the energy of incoming electrons. Individual current pulses induced by single electron arrival events may be closely overlapped, and thus, a relatively smooth current signal may be generated at a terminal of the detector. The modulation of the current signal may follow the incoming electron rate. In this way, an output signal may be generated and fed into a detection system, such as detection system 400, and may be used for image reconstruction.

However, when the electron beam current is reduced to lower values, it is less likely that a smooth current signal of closely overlapped electron pulses can be generated. For example, at 40 pA, there may be an average of about 2.5 electrons arriving per 10 ns sampling period. When a current pulse generated by a single electron arrival event at a PIN detector has a pulse width of, for example, 3 to 5 ns, electron pulses may not substantially overlap. Instead, there may be separation between subsequent electron pulses such that excitation nearly recedes before subsequent electrons arrive. Thus, electrical signal generated in a PIN detector measured at the time of sampling may not accurately reflect the number of electrons received during the whole sampling period. Shot noise of the electron beam may contribute to fluctuation in the signal current from the detector. Due to the statistical variance in the nature of secondary electron and back-scattered electron generation processes, it is less likely that a consistent signal may be generated. Furthermore, there may be a fixed electrical noise floor with respect to a proportionally decreasing signal current from a PIN detector, which may cause a sharp drop-off in SNR around, for example, 200 pA. Thus, SNR may deteriorate at lower values of electron beam current. Reduction in SNR may also be represented by the fluctuation of signal from the detector due to the random arrival time of signal pulses. In addition, the speed of the detector, signal path, or combination of the detector and signal conditioning circuits which may determine the overall bandwidth of the detection system may also affect the SNR.

Figure 7:
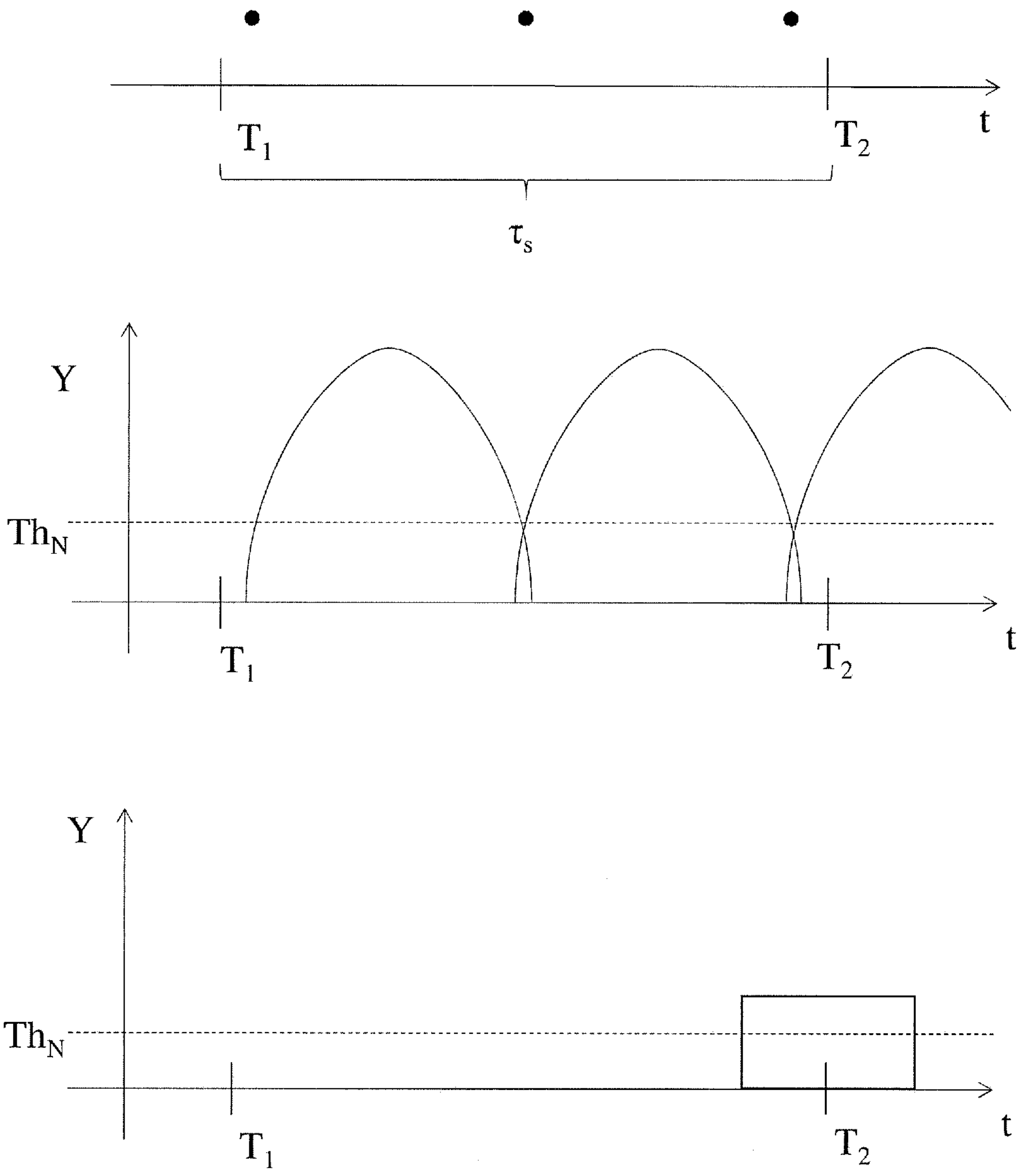
FIG. 7 is a schematic representation of electron arrival events and their relationship to current signal.

FIG. 7 shows a schematic representation of electron arrival events and their relationship to a current signal when electron beam current is relatively low. For example, as discussed above, at 40 pA of beam current, only two or three electrons may be received at a PIN detector during a sampling period. The sampling period $\tau_s$ may be 10 ns. The signal pulse generated by a single electron arrival event may have a pulse width of about 5 ns. Thus, signal read at time $T_1$ or time $T_2$ may not account for all of the electrons that arrived during a respective sampling period. Furthermore, measured signals may be close in value to a noise threshold $Th_N$.

To address fluctuation in current signal, a detection system may be configured to extend an integration period to smooth out fluctuations. Alternatively, the bandwidth of the detection system may be reduced. Within one imaging pixel period of, for example, 10 ns, current signal may appear only at certain time points. The overall period of signals may be less than the whole pixel period. Therefore, an integration period may be extended to cover the signals. However, extending integration time may involve other drawbacks. For example, noise from the detector sensing element and associated circuits may exist within the whole pixel period. Integration within the pixel period may cause noise energy to also be captured which may result in overall SNR reduction. Noise present during sub-periods between electron arrival event signals may be included in a pixel period along with noise present during electron arrival event signal pulses. A method of counting particles may address this by, for example, measuring signal only when it is determined that an electron arrival event is occurring.

In applications that demand accuracy at lower electron beam currents, such as critical dimension SEM (CD-SEM), other types of detectors, such as an Everhart-Thornley detector (ETD), may be useful. An ETD may combine a scintillator and a photomultiplier tube (PMT) and may be effective in detecting individual electron arrival events that occur without substantial overlap. An ETD may have good SNR in ranges of probe current of about 8 to 100 pA. However, a scintillator's light yield may degrade over time with accumulated electron dose and thus has a limited lifetime. Therefore, an ETD may have a short service life if used with instruments that use higher probe current or that operate continuously, especially in inspection tools that operate constantly with high throughput such as in a semiconductor manufacturing facility (e.g., a fab). Furthermore, an ETD coupled with a scintillator may exhibit poor performance due to energy conversion steps and signal loss associated with detection signal paths.

In contrast to an ETD, a PIN detector may exhibit excellent robustness against radiation damage. Furthermore, in some embodiments, a semiconductor detector, such as a PIN detector, may achieve higher SNR with a high performance signal path.

In a comparative embodiment, a PIN detector may have reduced SNR at low electron beam current. The primary cause of SNR reduction at probe current below, e.g., 100 pA may be electrical noise at the front end of an amplifier before entering an ADC. For example, there may be large capacitance, thermal noise, or dark current generated by various electrical components. Additionally, some sources of background noise may be proportional to the detection surface area of a detector. Furthermore, capacitance-based noise may increase with the cube of frequency, and thus, there may be many limitations on designing a high bandwidth detector due to SNR reduction. Such limitations may be addressed by, for example, providing a detection system employing charged particle counting with a detector including sensing elements such as PIN diodes.

Some embodiments of the disclosure may provide a detector that includes a sensing element having a size such that an area of the sensing element is configured to receive no more than a predetermined number of charged particles, such as electrons, per sample period. The area of the sensing element may be based on a geometric spread of the charged particles incident on the detector. The area of the sensing element may be determined in consideration of a region of the detector where the highest density of charged particles are incident.

Figure 8:
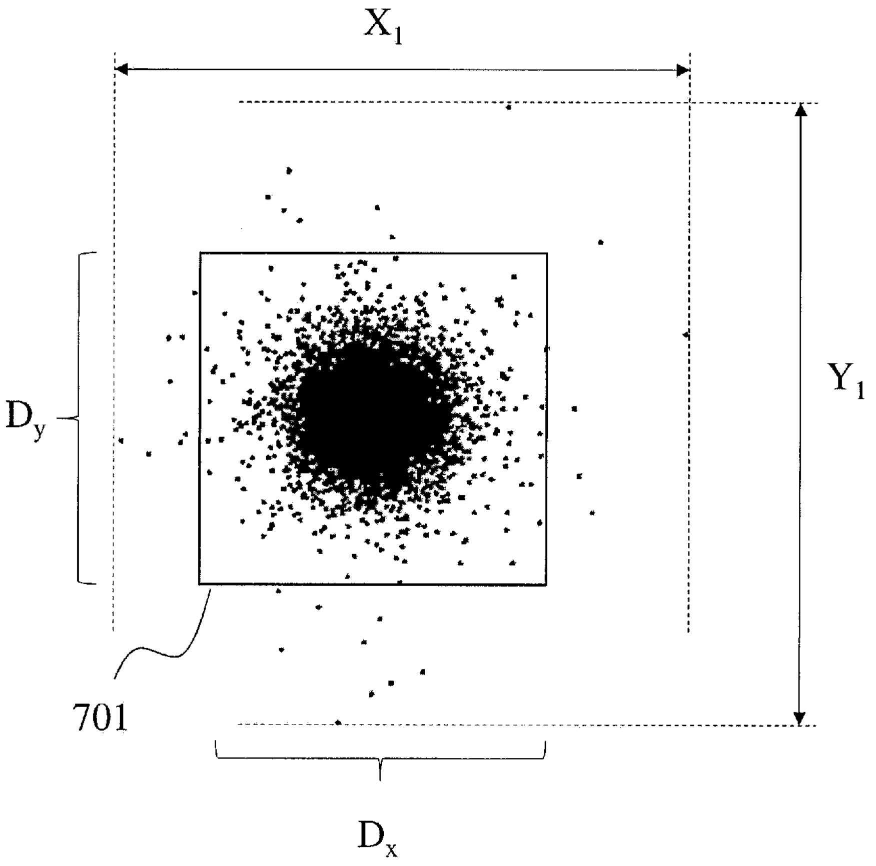
FIG. 8 illustrates an example of a detector element that is sized relative to secondary electron landing point distribution on a detector surface, consistent with embodiments of the present disclosure.

Some embodiments of the disclosure may provide a detector that includes a sensing element having a size smaller than that of a spread of secondary electrons. Reference is now made to FIG. 8, which illustrates an example of a sensing element that is sized relative to secondary electron landing point distribution on a detector surface.

As shown in FIG. 8, a natural geometric spread of secondary electrons may be determined based on, for example, initial kinetic energy and emission angles of electrons. Although a primary electron beam may be focused to a relatively small spot size on the surface of a sample, secondary electrons that are emitted from the sample may produce a beam spot on a detector that is larger than the sample spot. Size of the beam spot on the detector may be dependent on energy and angle of electrons emitted from the sample surface. The size of the beam spot on the detector may be several times larger than the sample spot. A secondary optical system may be provided that projects a secondary electron beam onto the detector. The design or operating conditions of the secondary optical system including, for example, a parameter of magnification, may affect the size of the beam spot on the detector. For a given set of imaging conditions, a geometric spread of secondary electrons incident on a detector may be determined. For example, dimensions $X_1$ and $Y_1$ may represent the bounds of the expected geometric spread of secondary electrons on a detector surface. Dimensions $X_1$ and $Y_1$ may be based on a statistical confidence that a predetermined proportion of electrons will land in an area. For example, $X_1$ and $Y_1$ may represent a 99.5% confidence interval. In some embodiments, a 95% confidence interval may be used. In some embodiments, a 90% confidence interval may be used.

Sensing element 701 may be sized to be smaller than the geometric spread of secondary electrons. Sensing element 701 may have a rectangular shape with sides of length $D_x$ and $D_y$. $D_x$ may be set to be less than $X_1$, and $D_y$ may be set to be less than $Y_1$. Sensing element 701 may be sized such that a number of electrons less than a total amount of electrons incident on a detector surface are received in the area of sensing element 701.

In some embodiments, a beam spot on a detector surface may be larger than a beam spot on a sample surface. Accordingly, the overall size of a detection surface of a detector may be configured to be large enough to accommodate a broad beam spot. The beam spot on the detector surface may be on the order of a few millimeters in diameter. However, increasing a size of a detector may contribute to noise effects. For example, the capacitance of a detector may be proportional to an area of a detector surface. Some sources of noise, such as that due to components being coupled to a detector (e.g., an amplifier), may be related to capacitance.

In some embodiments, a detector may be followed by a signal conditioning circuit with very low input impedance. Most of the charges generated in response to an electron arrival event may extracted with low loss. In other embodiments, however, some loss may be introduced that may be related to capacitance. For example, a detector may exhibit behavior similar to that of a diode and may have a corresponding capacitance for generating a particular voltage. Voltage from the detector may be fed into another component in a detection system, such as an amplifier. The detector may need to generate a voltage that is larger than a background noise level seen by the component. As an example, a component may have a background noise level of a certain amount due to thermal noise. In order to overcome the thermal noise as seen by the component, and thus input a meaningful signal into the component, a voltage greater than the certain amount should be input. Therefore, if capacitance of a sensing element increases along with the area of the sensing element, the current necessary to achieve voltage greater than the certain amount also increases. Accordingly, the detector may be required to generate more current as the capacitance increases to deliver suitable voltage.

In some embodiments, the area of a sensing element may be reduced by configuring the sensing element to be smaller than the geometric spread of secondary electrons incident on a whole detector surface. Signal and capacitance of a detector sensing element may be proportional to the area of the sensing element in a case where the sensing element is fully covered by a beam spot. In some cases, the sensing element may be only partially covered by a beam spot. SNR reduction due to capacitance may be mitigated by decreasing the sensing element area when the sensing element is not fully covered by a beam spot.

Furthermore, dark current may also be related to the area. The greater the area of a sensing element, the greater the dark current noise. For example, with a larger-area sensing element, it is more likely that a larger number of imperfections may exist in the crystal structure of a semiconductor diode device, and thus, there may be greater chance for a dark count to occur. A sensing element configured to generate numerous electron-hole pairs in response to the arrival of a charged particle, such as a secondary electron, and having a relatively small area, may be advantageous for reducing the influence of dark current events because the relatively small noise signal generated by dark current may be dwarfed by signal generated in response to a charged particle arrival event. In some embodiments, SNR may be improved by reducing size of a sensing element in a case where the sensing element is not fully covered by a beam spot such that noise effects are reduced at a rate greater than a reduction in signal strength.

Sensitivity of a reduced-area sensing element may be enhanced. For example, a sensing element configured to detect single electron arrival events may have the following advantages. Considering two sensing elements having different areas, each configured to receive no more than one electron per sample period, the sensing element having the smaller area may have lower capacitance and less influence of dark current noise. Therefore, the amount of current required to generate a signal for feeding into another component in a detection system, and to overcome, e.g., thermal noise of the component, may be less. Furthermore, in some cases, a beam spot of a secondary electron beam on a detector surface may only partially cover a sensing element. Some of the detector area may not be actively receiving incident electrons. However, all of the material of the sensing element under the detection surface may contribute to generating current signal in response to receiving an incident electron by impact ionization. The number of electron-hole pairs generated in response to an electron arrival event may be similar regardless of whether the sensing element is fully covered by a beam spot. Considering the two different sized sensing elements, the sensing element with the smaller area may be more likely to generate a signal that overcomes noise because it may require less electrons to generate a particular voltage in response to individual electron arrival events.

In some embodiments, an area ratio, which may be the ratio of area of an individual sensing element to that of the entire surface of a detector, may be varied. The area ratio may have a corresponding relationship to SNR. For example, in some embodiments, decreasing the size of a sensing element to be 1/1,000 of the area of a detector may correspond to a 1,000× increase in SNR.

In some embodiments, a detector may include an array of sensing elements. The array may include a plurality of sensing elements each having dimensions of $D_x$ and $D_y$, or less, for example. The sensing elements may be arranged in a planar, two-dimensional array, the plane of the array being substantially perpendicular to an incidence direction of incoming charged particles. In some embodiments, the detector may be arranged so as to be inclined relative to the incidence direction.

Figure 9A:
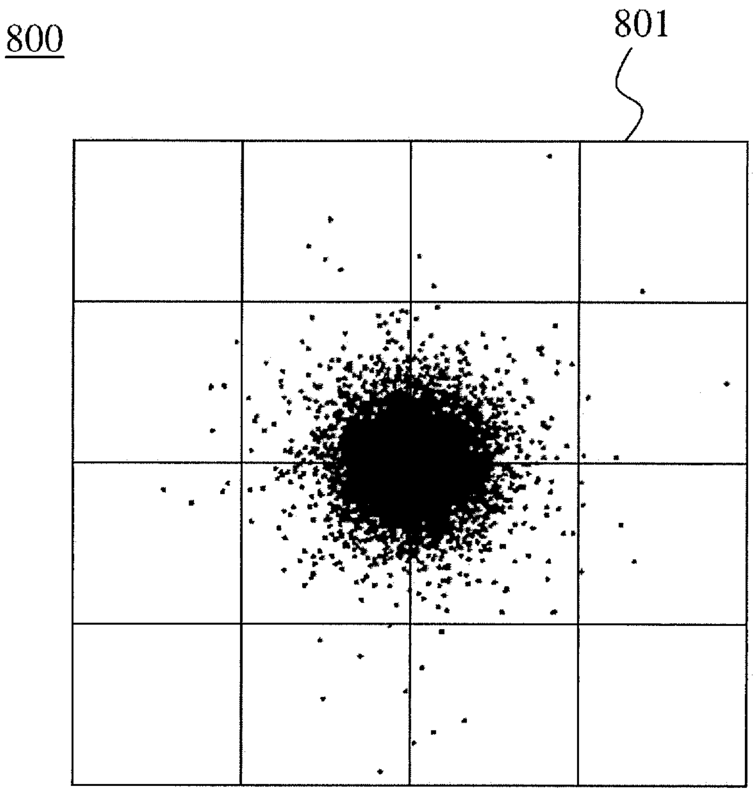
FIGS. 9A and 9B illustrate examples of a detector including an array of detector elements, consistent with embodiments of the present disclosure.

FIG. 9A shows an example of a detector 800 including an array of sensing elements. A sensing element 801 of detector 800 may be sized such that some number of electrons less than the total amount of electrons incident on the surface of detector 800 are received in sensing element 801. Sizes of sensing elements in the array may be uniform. The total size of the detector may be based on the geometric spread of secondary electrons such that all or substantially all electrons may be captured by the detector. Thus, detector 800 may have a total area corresponding to a predetermined FOV. For example, detector 800 may include a circular plate having a diameter of 4 to 10 mm.

The detection area of detector 800 may be divided into an array of smaller-area PIN diode elements. Each of the PIN diode elements may correspond to a discrete detection cell. A PIN diode may be pixelated into separate detection cells in various forms. For example, semiconductor detection cells may be divided by virtue of internal fields generated due to internal structures. Furthermore, in some embodiments, there may be physical separation between adjacent sensing elements. That is, in some embodiments, a detector array may be provided with sensing elements that are physically spaced apart from one another. There may be some isolation area provided between adjacent sensing elements.

In other embodiments, when separate detection cells are formed by internal fields, a plurality of doped semiconductor structures having different conductivity (such as P+ type and N+ type semiconductor regions) may be formed at the bottom of a detector. Meanwhile, the top surface of the detector may be provided with a detection surface and a cathode formed by a single layer of doped semiconductor. An intrinsic semiconductor region spanning the plurality of semiconductor structures of different conductivity may be substantially continuous. Thus, in some embodiments, dead area between adjacent sensing elements may be reduced. Such a detector may have a structure capable of forming internal electrical fields, which may be configured to guide the carriers generated due to the electrons incident on each detection sub-region to a corresponding detection cell.

In contrast to an ETD, which may not be pixelated easily, a variety of forms may be available to configure a PIN diode with an array of segmented sensing elements. Also, a PIN diode may have other advantages including small capacitance and low background noise as compared to an ETD.

Figure 9B:
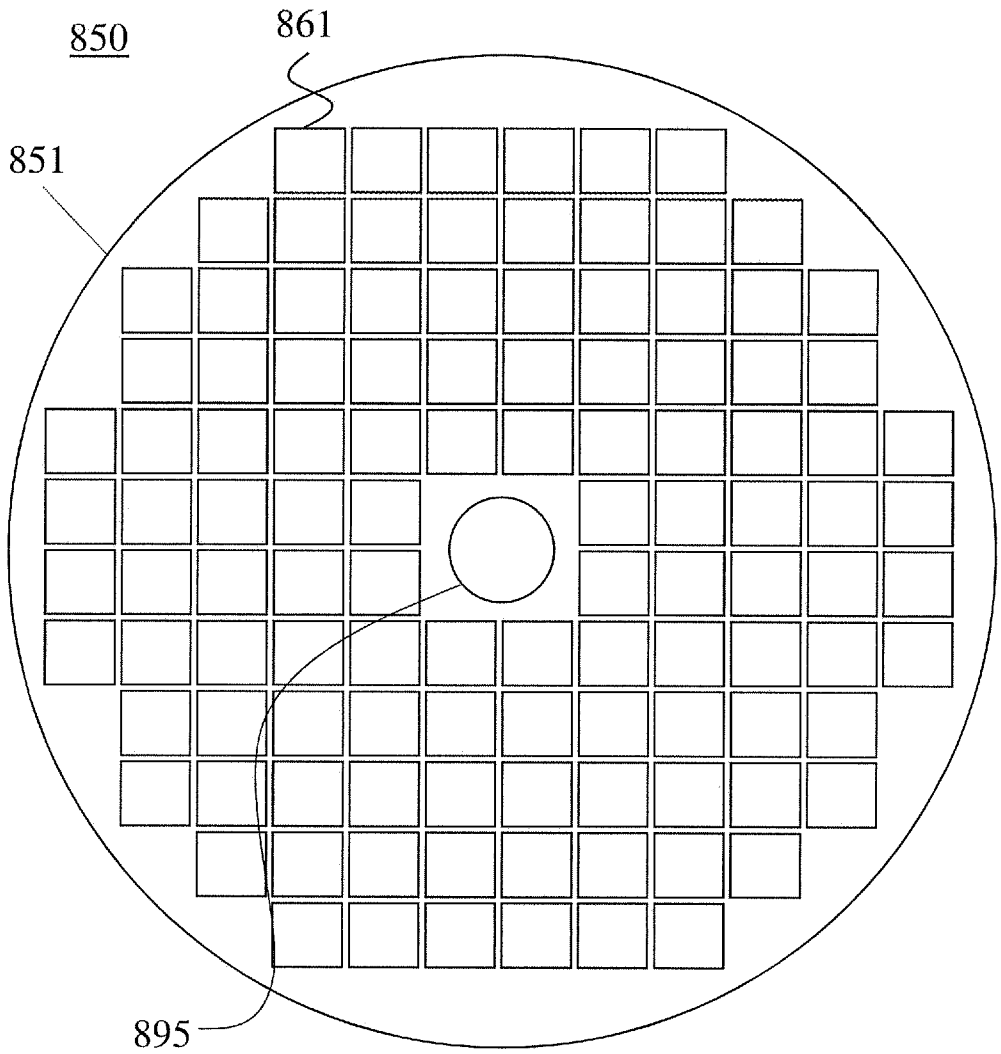

FIG. 9B shows another example of a detector 850 including an array of sensing elements. Detector 850 may include a plate 851, wherein a plurality of sensing elements 861 are formed thereon. Plate 851 may include opening 895 for allowing a primary electron beam to pass through plate 851.

When an individual sensing element of a detector is made smaller than the geometric spread of secondary electrons incident on the detector, electron counting may become more manageable. For example, each sensing element may have its own counting unit comprising circuitries configured to measure an output signal from the sensing element. When sensing elements are made smaller, the electron rate on each sensing element becomes smaller, and thus electron counting at each sensing element may become enabled. Electron counting will be discussed with reference to the following exemplary validation study.

As discussed above with reference to FIG. 4B, electrons incident on a detector may be spread out over an area. When one single sensing element is used to measure output current for the entire detector surface, it may be overwhelmed by the large number of electrons incident in a short time frame. For example, for an electron beam of 1 nA beam current, there may be a certain number, e.g., 6.4 billion secondary electrons incident on a detector in one second. This corresponds to 64 electrons per 10 ns sampling period of a detection system running at a 100 MHz pixel rate. It may be difficult for a detector with a single sensing element to handle such a high rate of electrons, and thus, it may not be practical to count individual elections while maintaining reasonable circuit complexity, miscounting rate, and power consumption. However, when the detector is subdivided, individual sensing elements may be made to have a size such that the number of electrons incident in a sampling period is low enough to enable electron counting to proceed. Furthermore, a detector divided into a plurality of sensing elements may have numerous advantages such as those discussed above with respect to reduction in noise, capacitance, and increase in SNR.

Figure 10:
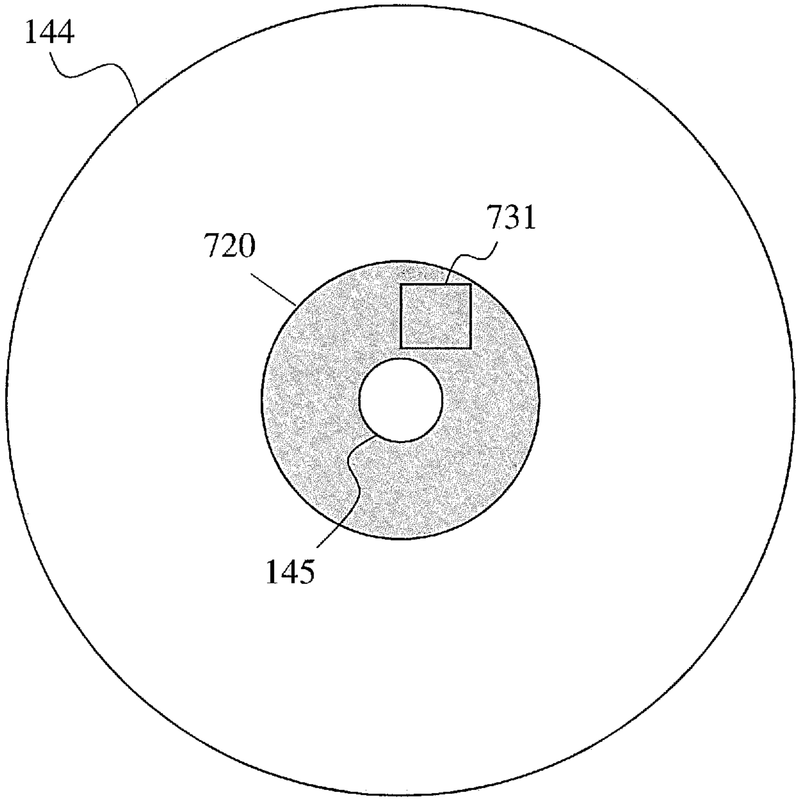
FIG. 10 illustrates a detector and a region of high-density electron arrival rate, consistent with embodiments of the present disclosure.

The distribution of electrons shown in FIG. 4B may represent the simulated landing positions of 10,000 electrons. Assuming that opening 145 may be formed in the center of detector 144, the densest distribution of electrons landing on the detector may be in an annular ring-shaped region immediately surrounding opening 145. For example, FIG. 10 shows an annulus 720 around opening 145. It may be simulated that, for example, in annulus 720 of inner diameter 0.5 mm and outer diameter 1.0 mm, a first number of the total 10,000 simulated electrons may land in this region. The first number may be 1,669. The total area of annulus 720 may be determined to be 0.589 $mm^2$. Thus, the average number of electrons incident on the detector in the region of annulus 720 may be 2,834 per unit area. Furthermore, the proportion of electrons received in annulus 720 may be 16.69% of the total.

In some embodiments, an individual sensing element may have a 50 μm×50 μm square shape. For example, FIG. 10 shows a sensing element 731 having a square shape inside the region of annulus 720. Such a sensing element has an area of 0.0025 $mm^2$. Multiplying the number of electrons per unit area in annulus 720 by this area yields: 7.084 electrons per square-shaped sensing element.

Although the simulated 10,000 electrons is smaller than the number of electrons in a typical 1 nA beam (e.g., 6.4 billion per second), these results may be extended to such levels of beam current. That is, the distribution of secondary electrons from a 1 nA electron beam may be substantially similar to that discussed above, but higher in absolute number. Therefore, in the case of a 1 nA beam, 16.69% of the total 6.4 billion electrons per second incident on detector 144 in FIG. 10 may land in annulus 720, as discussed above. Accordingly, about 1.8 billion electrons per second may land in the region of annulus 720.

If a sensing element is sized as discussed above, for example like sensing element 731, about 4.5 million electrons may land in the 50 μm×50 μm square area of the sensing element in one second. This is three orders of magnitude less than a detector using a single electron sensing element, which may have all 6.4 billion electrons per second arriving in the one electron sensing element. By dividing a detector into a segmented array, the electron arrival rate at respective sensing elements can be significantly reduced. This may contribute to enabling electron counting. For example, the average separation time of subsequent electron arrival events (as shall be discussed in detail later) may be about 200 ns when 4.5 million electrons are incident in one sensing element in one second. By comparison, the sampling period of a 100 MHz detector is 10 ns. With an average separation time of 200 ns, it is not likely that two electrons will arrive in one 10 ns sampling period. Thus, the detector may have an area that is configured such that no more than a predetermined number of electrons is received in a sensing element during a sampling period. The predetermined number may be one.

Furthermore, although the example above is discussed with reference to detector 144 having opening 145 at its center, other structures of detectors may be similarly applied. For example, in the case of an off-axis detector, all of the electrons in the central region may be incident on the detector surface. In this case, there may be no hole provided in the center of a detector plate. Therefore, the region of highest density of electron arrival rate may be the center. However, even at the center, an electron arrival rate may not be significantly larger than that of an annulus around the center. For example, in the simulation of 10,000 electrons, a sensing element having a 50 μm×50 μm square area placed in the center of the detector may receive a second number of electrons. The second number may be about 8.9 electrons. Thus, extending to the case of a 1 nA beam, about 5.7 million electrons may land in the 50 μm×50 μm square area of the sensing element in one second. Even at this rate of electron arrival events, the average separation time may be about 175 ns, which is still significantly higher than a sampling period of 10 ns.

Figure 11A:
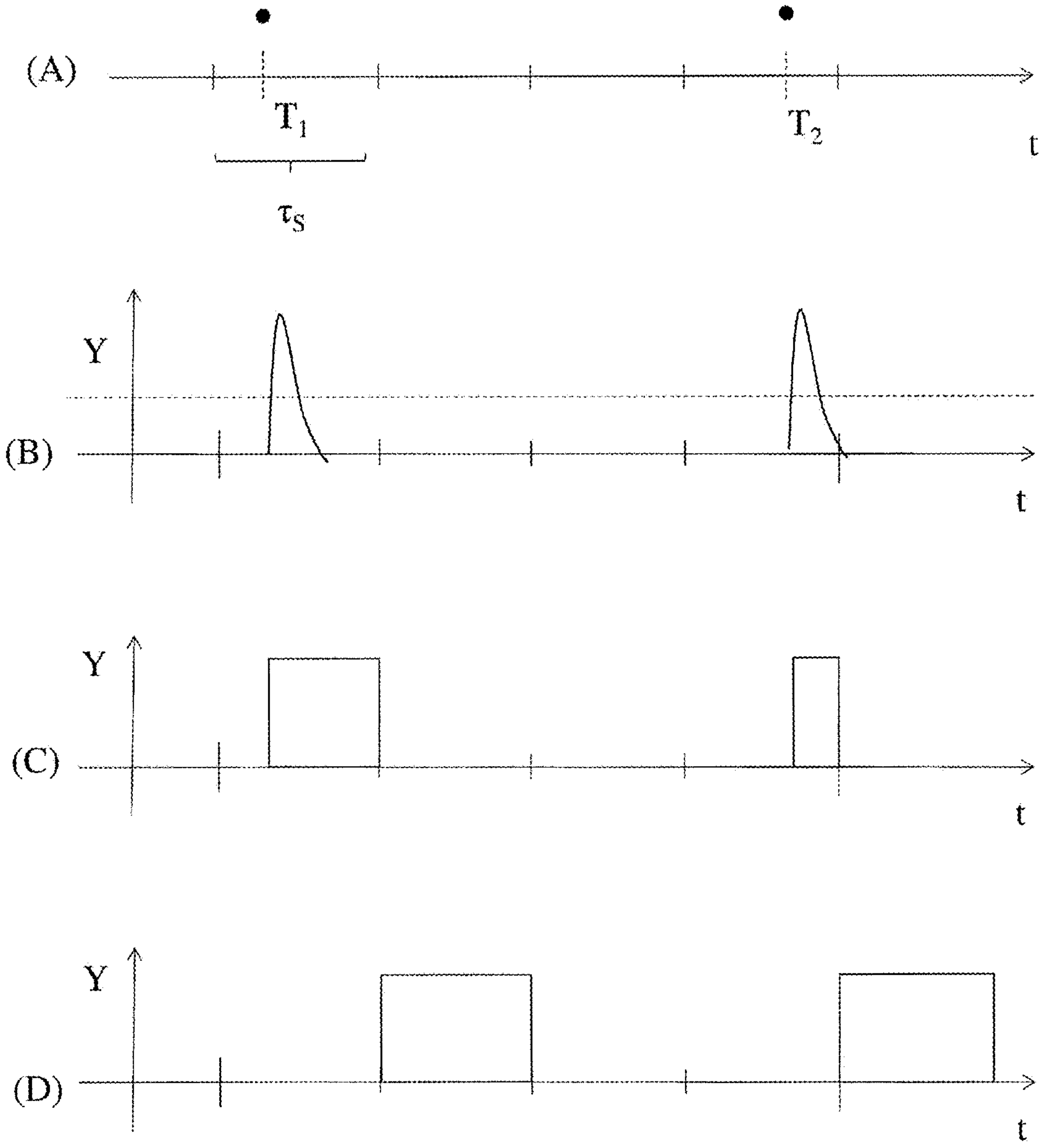
FIGS. 11A and 11B shows schematic representations of electron arrival events and their relationship to detector output signals, consistent with embodiments of the present disclosure.

FIG. 11A shows a schematic representation of electron arrival events and their relationship to an output of a detector element. A detector may be provided with an array of detector elements. The array of detector elements may include an array of sensing elements, each of the sensing elements having a size configured so that no more than one electron is received in a sensing element during a sampling period is corresponding to a respective detector element. As in the example above, the separation time between two adjacent electron arrival events may be, for example, 200 ns. A detector may have a sampling rate of, merely as an example, 20 MHz, corresponding to a sampling period of 50 ns. Thus, as shown in the lower graph of FIG. 11A, because the separation time between electron arrival events is greater than the sampling period, no more than one electron is received per sampling period.

In FIG. 11A, graph (A) may represent a timeline. It may indicate that at a time point T1, a first electron arrives at a detector and at a time point T2, a second electron arrives at the detector. Graph (B) may represent event signal of a circuit associated with a sensing element of the detector. Pulse height of event signals may correspond to energy of incident electrons. Pulse height of event signals may be compared to a threshold, as shown by the dashed line in graph (B). When pulse height exceeds the threshold, a detection pulse may be registered, as shown in graph (C). A count may be output in a next sampling period, as shown in graph (D).

Figure 11B:
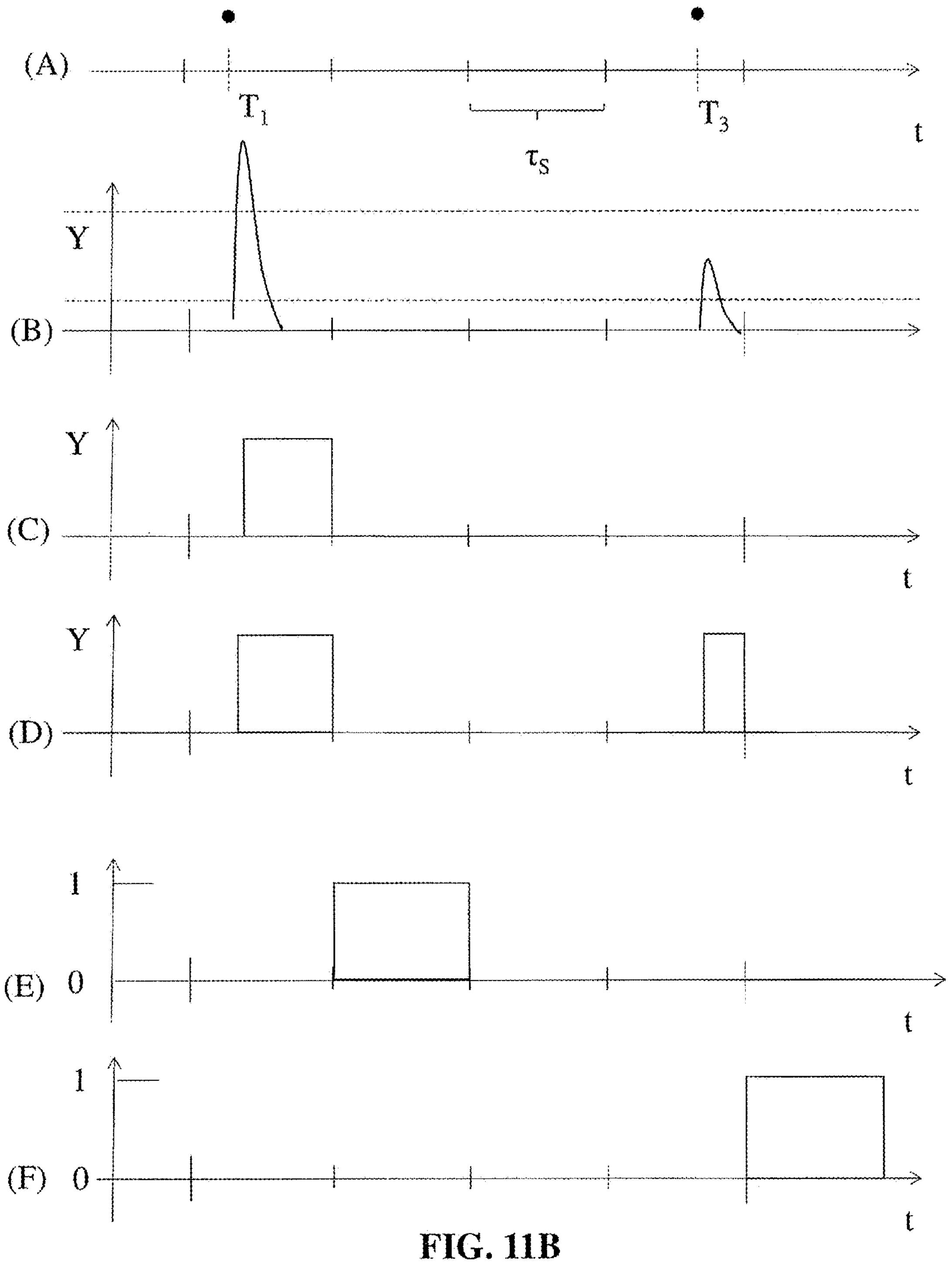

FIG. 1B shows another example of a schematic representation of electron arrival events according to a timeline in graph (A). As shown in graph (B) of FIG. 11B, pulse heights of event signals corresponding to different electron arrival events may be different. Detection pulses may be registered based on a first threshold or a second threshold. For example, as shown in graph (D) of FIG. 11B, detection pulses may be registered when pulse height of event signals exceeds the first threshold. As shown in graph (C) of FIG. 11B, detection pulses may be registered when pulse height of event signals exceeds the second threshold. Counts may be output based on registered detection pulses, such as in graphs (E) or (F) of FIG. 11B.

The arrival of electrons on a detector may be a stochastic process. Thus, although some deterministic properties may be determined for describing electron arrival events, electron arrival events on a detector may inherently involve some randomness. For example, although an average separation time between adjacent electron arrival events may be determined to be a certain value, some electron arrival events may have separation time that is less than or more than the average separation time. Accordingly, a sensing element may have an area that is configured to receive no more than a predetermined number of electrons per sampling period with at least a level of confidence. The level of confidence may be based on statistical parameters. For example, the level of confidence may correspond to a statistical probability that no more than the predetermined number of charged particle will be received in the sensing element per sampling period. In some embodiments, the level of confidence may be, for example, 90%. The sensing element may have an area that is configured to receive no more than a predetermined number of electrons (e.g., 1 or 2) per sampling period with at least a 90% level of confidence. In some embodiments, at least 90% of electron arrival events may occur such that no more than the predetermined number of electrons are received in the area of the sensing element per sampling period.

Statistical parameters that describe a distribution of electron arrival events may include mean or median separation time between electron arrival events, standard deviation of separation time between electron arrival events, variance, probability density, cumulative distribution function, skewedness, entropy, and so on. In some embodiments, electron arrival events may be modeled by a Poisson distribution. In some embodiments, other types of distributions may be used to model electron arrival events.

In some embodiments, average separation time may be associated with average current coming into a detector element l at $I_{d,l}$, where $I_{d,l}$ is average incoming electron current incident on detector element l. While it is assumed here that total current incident on a detector and its spatial distribution are constant across an SEM image frame, it will be appreciated that total current incident on a detector may be modulated according to pixel location in a SEM image frame. When a sampling period zs is given, an average number of electrons, h, coming into detector element l, may be described below, where e is electron unit charge:

$$h = I_{d,l}\tau_S / e \tag{1}$$

Assuming that each electron arrival is a random event and has no correlation with others, a Poisson distribution may be applied. According to a Poisson distribution, the probability of no electrons arriving during a sampling period may be given by:

$$P(0) = e^{-h} \tag{2}$$

The probability of one electron arriving during a sampling period may be given by the following, where is an average number of events in the sampling period:

$$P(1) = he^{-h} \tag{3}$$

The probability of two electrons arriving during a sampling period may be given by:

$$P(2) = \frac{1}{2}h^2e^{-h} \tag{4}$$

The probability of three electrons arriving during a sampling period may be given by:

$$P(3) = \frac{1}{3!}h^3 e^{-h} \tag{5}$$

The probability of k electrons arriving during a sampling period may be given by:

$$P(k) = \frac{1}{k!}h^k e^{-h} \tag{6}$$

Summing probabilities for all possible independent cases of electron arrival events yields 1, as follows:

$$P(0) + P(1) + P(2) + P(3) + \cdots = 1 \tag{7}$$

Summation of products kP(k) should be equal to h, as follows:

$$1P(1) + 2P(2) + 3P(3) + \cdots = h \tag{8}$$

A counter implemented in an electrical circuit may have its own maximum count up to which the counter represents the number of electron arrival events occurring in its count buffer. If the count buffer is constructed with only one bit, the maximum count of events is 1. When an additional event (or events) occurs following the first event within the same sample period, the count buffer value may remain 1 while the additional events may be miscounted. If the count buffer is constructed by two bits, the maximum count of events may be either 2 or 3, depending on its implementation. FIG. 12 summarizes the relationship between number of events to be counted and number of events missed, depending on configuration of counter and number of events in a sample period.

Based on the above, confidence levels of having no more than a predetermined number of electrons (e.g., 1 or 2) arrive in a sampling period may be expressed as the following:

$$\begin{aligned} C_h(1) &= \frac{P(1) + P(2) + P(3) + P(4) + \cdots}{h} \\ &= \frac{(P(0) + P(1) + P(2) + P(3) + P(4) + \cdots) - P(0)}{h} \\ &= \frac{1 - P(0)}{h} \\ &= \frac{1 - e^{-h}}{h} \\ &= 1 - \frac{1}{2}h + \frac{1}{6}h^2 + \cdots \end{aligned} \tag{9}$$

And $$\begin{aligned} C_h(2) &= \frac{(P(1) + 2P(2) + 2P(3) + 2P(4) + \cdots)}{h} \\ &= \frac{(2P(0) + 2P(1) + 2P(2) + 2P(3) + 2P(4) + \cdots) - 2P(0) - P(1)}{h} \\ &= \frac{2 - 2P(0) - P(1)}{h} \end{aligned} \tag{10}$$

-continued $$\begin{aligned} &= \frac{2 - 2e^{-h}\frac{1}{2}he^{-h}}{h} \\ &= 1 - \frac{1}{6}h^2 + \cdots \end{aligned}$$

"Confidence levels of having no more than a predetermined number of electrons (e.g., 1 or 2) arrive in a sampling period" are expressed here as a ratio of average number of electrons counted to average number of entire electrons incident on a sensing element in a sample period, e.g., a capture rate. The examples discussed herein may differ in particular counter functionality, limitations, or maximum number of events which can be counted in a sample period, (e.g., 1 or 2).

Figure 13A:
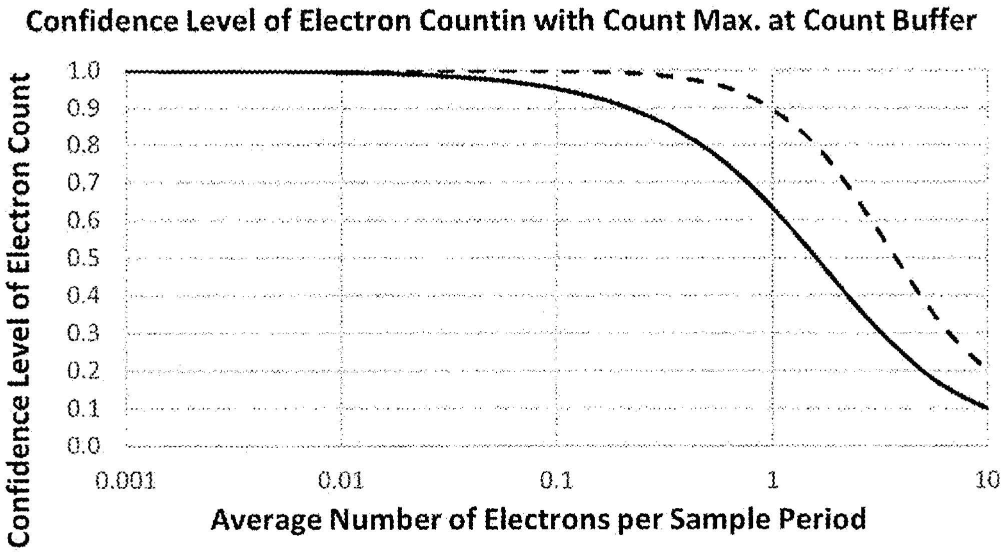
FIG. 13A illustrates a graph that may represent a confidence level of electron counts at a particular count buffer, consistent with embodiments of the present disclosure.

FIG. 13A illustrates a graph that may represent a confidence level of electron counts at a particular count buffer. The x-axis in FIG. 13A may represent average number of electrons arriving at a sensing element per sampling period. The y-axis in FIG. 13A may represent a confidence level of the detected electron count. The solid line in FIG. 13A may represent a confidence level with a max count of 1. The dashed line in FIG. 13A may represent a confidence level with a max count of 2.

Event counting loss rate due to a Count Buffer Limitation, $L_h(n)$, where n is maximum count of the Count Buffer may be expressed as follows:

$$\begin{aligned} L_h(1) &= 1 - C_h(1) \\ & 1 - \frac{1 - e^{-h}}{h} \\ &\approx \frac{1}{2}h \text{ for } h \ll 1 \end{aligned} \tag{11}$$

And $$\begin{aligned} L_h(2) &= 1 - C_h(2) \\ & 1 - \frac{2 - e^{-h} - \frac{1}{2}he^{-h}}{h} \\ &\approx \frac{1}{6}h^2 \text{ for } h \ll 1 \end{aligned} \tag{12}$$

Figure 13B:
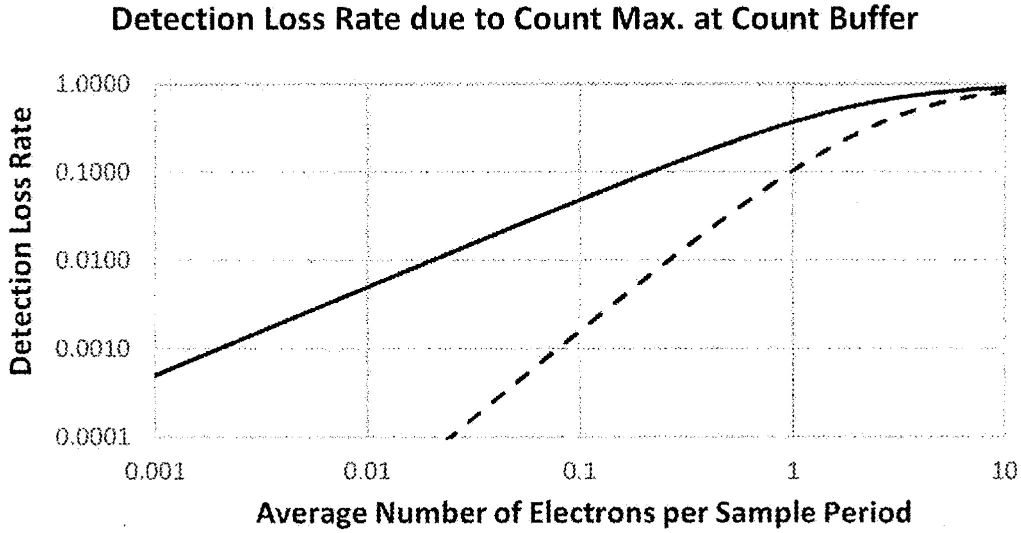
FIG. 13B illustrates a graph that may represent detection loss rate due to count max at a particular count buffer, consistent with embodiments of the present disclosure.

FIG. 13B illustrates a graph that may represent detection loss rate due to count max at a particular count buffer. The x-axis in FIG. 13B may represent average number of electrons arriving at a sensing element per sampling period. The y-axis in FIG. 13B may represent a detection loss rate. Similar to FIG. 13A, the solid line in FIG. 13B may represent a confidence level with a max count of 1. The dashed line in FIG. 13B may represent a confidence level with a max count of 2.

Figure 14A:
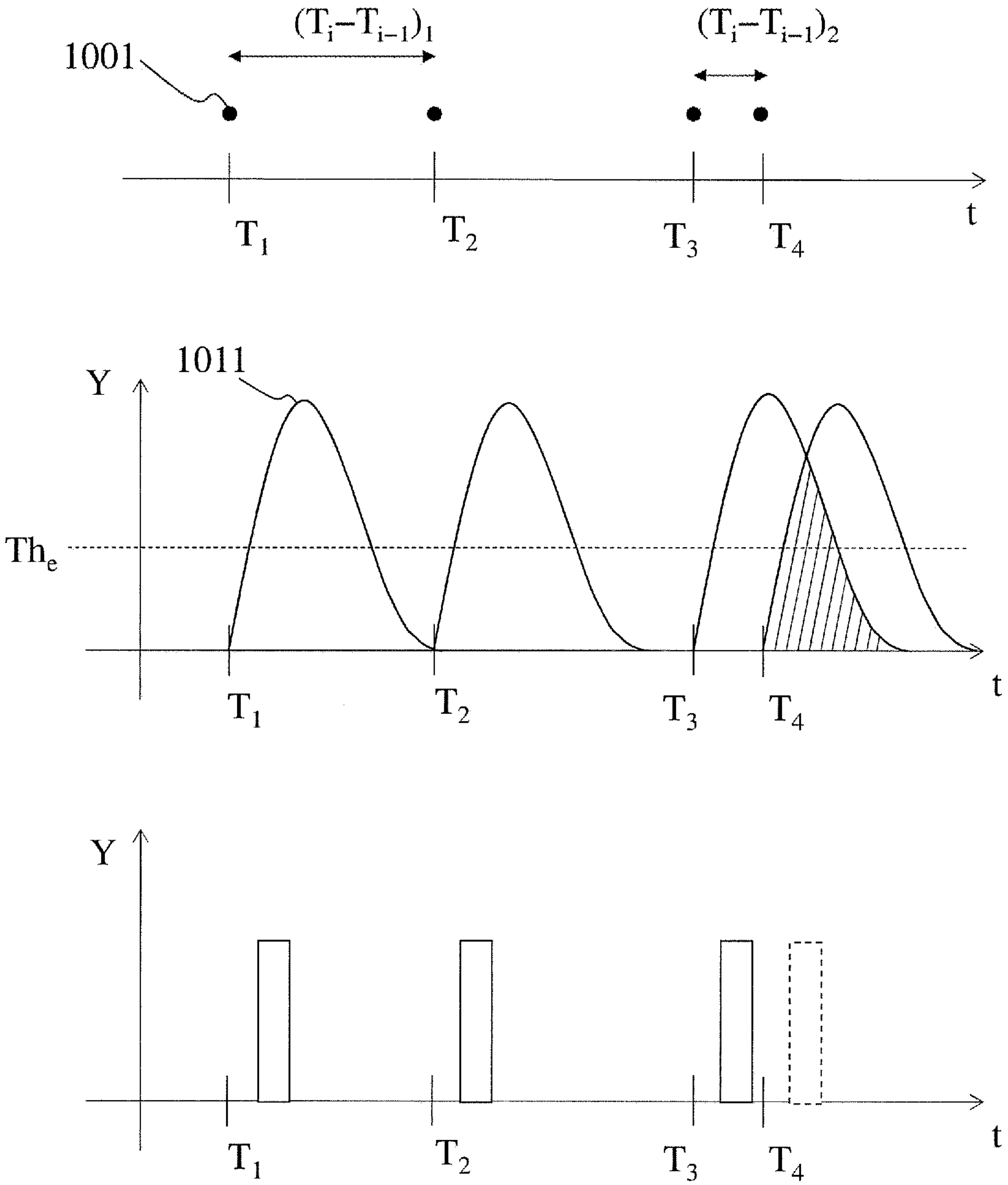
FIG. 14A shows a schematic representation of electron arrival events and their relationship to output signals, consistent with embodiments of the present disclosure.

Reference is now made to FIG. 14A, which shows a schematic representation of electron arrival events and their relationship to output signal, consistent with embodiments of the disclosure. In each of the three graphs of FIG. 14A, the t-axis represents time. In the top graph of FIG. 14A, single electrons may be incident on the surface of a detector at particular time points. For example, an electron may arrive at time $T_1$, at time $T_2$, at time $T_3$, and at time $T_4$, respectively. Electron arrival events at time $T_1$, at time $T_2$, at time $T_3$, and at time $T_4$ may occur at one detector element in a detector. The detector element may include a sensing element. There may be statistical variation in electron arrival events, and thus, electrons may arrive at the surface of a sensing element with non-uniform separation time. As shown in the middle graph of FIG. 14A, signal pulses 1011 may be generated in a detector element in response to an electron arrival event. As discussed above, a PIN diode may be used in a detector element, and signal pulses may resemble a waveform. The amplitude of the waveform may relate to the number of electron-hole pairs being generated in response to electron arrival events. The Y-axis of the middle and lower graphs of FIG. 14A may represent signal intensity in arbitrary units.

Time between subsequent electron arrival events may be given by $T_i-T_{i-1}$, where i is an index representing arrival order of individual electrons. In some situations, time between subsequent electron arrival events may be large enough that signals do not interfere with one another. For example, time between electron arrival events at $T_1$ and $T_2$, given by $(T_i-T_{i-1})_1$, may be long enough that an electrical signal generated in a sensing element rises and falls before the next electron arrival event occurs. In some situations, the time between subsequent electron arrival events may be short such that signals may merge. For example, the time between electron arrival events at $T_3$ and $T_4$, given by $(T_i-T_{i-1})_2$, may be short such that electrical signals generated in a detector may overlap with each other. The merged signal may be exemplified by the hatched area in the middle graph of FIG. 14A.

The bottom graph of FIG. 14A may demonstrate a process related to a count buffering operation. A count corresponding to an electron arrival event may be recorded when a rising edge of an incoming analog signal crosses a threshold $Th_e$. A functional block may generate an impulse (e.g., a detection pulse) in an output channel (e.g., a value of 1) when the corresponding channel of the input transitions from a value below threshold $Th_e$ to a value above threshold $Th_e$. The block may keep the value at 0 when the corresponding channel of the input does not transition from below threshold $Th_e$ to above threshold $Th_e$. Detection pulses may be counted for a given time period and then the count may be put on a count buffer for the next sampling period, as exemplified in the bottom graph of FIG. 14A. A sampling period of a detector may be given by $\tau_S$. In some embodiments, a detector may use a sampling rate of 400 MHz, corresponding to a sampling period of 2.5 ns. As noted above, in a detector using a PIN diode, pulse width of signals generated in response to electron arrival events, e.g., event pulses, may be about 3 to 5 ns. In such embodiments, two detection pulses may not be generated within a time period equal to event signal pulse width, which may be even larger than sampling period is. An event count for any sampling period may be either 0 or 1. Therefore, configuring a count buffer with 1 bit may be effective, even though there may be two or more electrons arriving at a sensing element within a sampling period. When $T_i-T_{i-1}$ is sufficiently long, an event signal waveform may rise and fall corresponding with single electron arrival events. A discriminator block may be configured to detect a leading edge of event signal pulses as an electron arrival event occurs. The discriminator block may be configured to make a determination based on a reference value that may include a reference level. For example, circuitry may be provided that compares an incoming event signal against a reference level and causes detection signal to transition to 1 when the incoming signal crosses the reference level. The detection signal may return to 0 after a short period of time or hold the value and return to 0 at the end of the sampling period. The circuitry may include logical operators, for example. In the example of FIG. 14A, a threshold $Th_e$ may be set that corresponds to an expected energy level of a secondary electron. For example, when one electron with about 9 keV of kinetic energy penetrates into a detection cell of a PIN diode, the event may excite about 2,000 electron-hole pairs in a depletion zone. The electrons of those pairs may be collected at the cathode of the diode. The collected electrons at the cathode may form a small current pulse signal that is fed into a circuit including front-end electronics, where the current pulse signal may be converted into a voltage pulse and amplified to an appropriate voltage level for discriminator input. Such processing may form an event signal pulse. Threshold $Th_e$ may be set in consideration of the expected event signal pulse. For example, threshold $Th_e$ may be a predetermined percentage of the expected peak value of the event signal pulse initiated by a secondary electron of a given energy level arriving at a sensing element. In some embodiments, threshold $Th_e$ may be 60% of the expected peak value of the event signal pulse initiated by, e.g., a 9 keV secondary electron.

When $T_i-T_{i-1}$ is short, however, event signal pulse waveforms may represent electrons from electron-hole pairs generated from multiple electron arrival events even though there may be a significant broadening and reshaping of a waveform from an original current pulse shape due to front-end electronics bandwidth and characteristics. For example, at time $T_4$ in FIG. 14A, an electron arrival event may occur and initiate another event signal pulse before the event signal from the previous electron arrival event at $T_3$ tails down. Therefore, after time $T_4$, a signal reading may rise relative to the previous reading and may continue to rise thereafter before receding to below threshold $Th_e$. Thus, a discrimination operation based on a comparison of the signal reading to threshold $Th_e$ may not accurately account for two separate electron arrival events, and a signal overlap miscounting may occur.

In some embodiments, to address such miscounting, a comparison to another threshold may occur. For example, a further comparison to a different threshold may occur. Another threshold value may be set to be different from threshold $Th_e$ and in some embodiments, may represent an overflow state. When an overflow state is detected, it may be determined that more than one electron is incident on a sensing element in a short interval.

In some embodiments, the overflow state may correspond to a status where the sensing element has reached a limit of signal output generation. Overflow may occur when two electron arrival events occur in close succession. In some embodiments, overflow may occur when merged event pulses built up to a level higher than the analog signal dynamic range of a particular detector element. Output signal may be capped by an overflow threshold $Th_o$. In some embodiments, overflow threshold $Th_o$ may be a theoretical limit. In some embodiments, overflow threshold $Th_o$ may be set as a predetermined percentage of the output limit of the sensing element. In some embodiments, threshold $Th_o$ may be 90% of the expected limit. In some embodiments, a sensing element may be capable of generating output signal corresponding to more than one electron arrival event in a short interval (e.g., two, three, four electron arrival events, and so on). Overflow threshold $Th_o$ may be set to a multiple of the expected event signal pulse initiated by a secondary electron of a given energy level. In some embodiments, detection of a signal exceeding $Th_o$ may correspond to a single electron arrival event while detection of signal exceeding $Th_o$ may correspond to two (or more) electron arrival events.

In some embodiments, a detector element may be unequipped to handle an event pulse overlap situation, and such an occurrence may lead to an event pulse overlap miscounting. For example, a detector element may be configured to generate, at most, an event signal of amplitude that may be less than the sum of amplitudes of event signals of two separately occurring electron arrival events. A detector element receiving more than one electron in close succession may experience overflow cutoff.

Figure 14B:
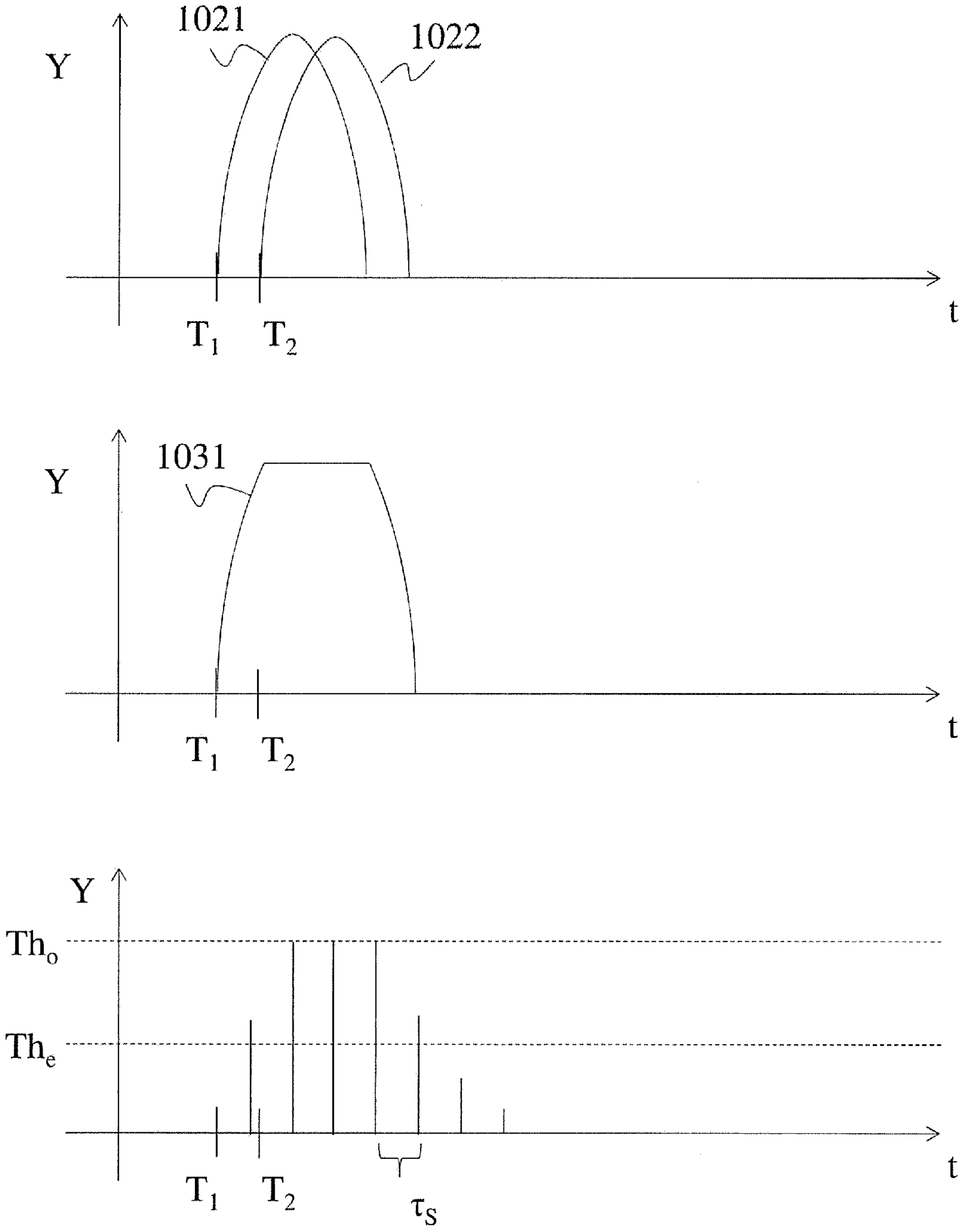
FIG. 14B shows a schematic representation of electron arrival events and an overflow cutoff, consistent with embodiments of the present disclosure.

FIG. 14B shows a schematic representation of electron arrival events and an overflow cutoff, consistent with embodiments of the present disclosure. As shown in the upper graph of FIG. 14B, two electron arrival events may occur in quick succession. A detector may be provided having detector elements, each of the detector elements including a sensing element and a circuit. The circuitry associated with a sensing element may include front-end electronics, such as a pre-amplifier. Theoretical signal pulses 1021 and 1022 may each represent an event signal when electron arrival events occur at a sensing element in a state where the sensing element and its associated circuitry has been fully recovered. For example, the detector element may generate signal pulse 1021 in response to an electron arrival event, and then after signal pulse 1021 has dissipated, the detector element may generate signal pulse 1022. In a situation where the sensing element or its circuitry does not have time to recover, signal pulses 1021 and 1022 may be closely overlapped and may appear superimposed on top of each other. As shown in the middle graph of FIG. 14B, output signal generated in a sensing element may resemble a signal pulse 1031 having a flat top. Signal pulse 1031 may be generated when the energy generated in the detector element in response to two or more electron arrival events reaches a limit. Signal pulse 1031 may represent electrons from electron-hole pairs generated from incident electrons arriving on the sensing element.

In FIG. 14B, a time $T_1$ may correspond to the beginning of a first electron arrival event, and a time $T_2$ may correspond to the beginning of a second electron arrival event occurring before the detector element has finished generating a signal in response to the first electron arrival event. The signal may rise starting from time $T_1$ and may be urged to continue to rise at $T_2$. However, at time $T_2$, an output limit of the sensing element may have been reached, and the output of the detector element may not further rise but may instead remain constant. As shown in the bottom graph of FIG. 14B, when another signal is read at time $T_2$ or thereafter, this signal does not exceed a cutoff threshold that may be equal to threshold $Th_o$. A discrimination operation based on a comparison of the signal reading only to threshold $Th_e$ may thus not accurately account for two separate electron arrival events, and a signal overlap miscounting may occur.

A detector element may be configured to receive no more than a predetermined number of charged particles within a period with at least a level of confidence. Level of confidence may be expressed as an event capture rate. The capture of an event may refer to the fact that an electron arrival event is recorded by a detector. In some embodiments, a level of confidence may depend on a miscount rate. Miscount rate may be defined as 1 minus capture rate. The miscount rate may include event signal overlap miscounting, as discussed above. A detector element of a detector array may be configured to have the miscount rate satisfying a condition related to a first miscount threshold. The detector element may include a sensing element and a front-end electric circuit. The condition may be satisfied when the miscount rate is less than or equal to the first miscount threshold. The first miscount threshold may be a value corresponding to an acceptable level of miscounts. For example, in some embodiments, a detector element may be configured so that no more than a predetermined number of electrons are received in the area of the sensing element in a certain time period, causing no more than a predetermined miscount rate, the predetermined miscount rate corresponding to 10% or less of total electron arrival events. In such examples, no more of than 10% of total electron arrival events, counted as single electron arrival events, may actually be cases where two or more electrons are received in the area of the sensing element.

Although electron arrival events occurring in quick succession may cause miscounting, such as by event signal overlap miscounting, a level of miscounting may be below a statistically acceptable amount. For example, electron arrival events may generally follow a Poisson distribution and the miscount rate may be expressed with Poisson distribution terms, e.g., P(k).

In some embodiments, it may be assumed that two successive electrons reach a sensing element of a detector at successive arrival time points, e.g., $T_{i-1}$ and $T_i$. A dead time $\tau_D$ may be defined such that when the following expression is satisfied, an electron arriving at $T_i$ is not counted (e.g., the electron is miscounted):

$$T_i - T_{i-1} \leq \tau_D \tag{13}$$

Dead time, as shall be discussed in further detail herein, may be primarily determined by characteristics of a detector element. A detector element may include a front-end circuit. The dead time may be influenced by design or characteristics of an event detector or other characteristics such as a threshold level set for determining that an arrival event has occurred. In addition to the expression of equation (13), the dead time may also be such that when the following expression is satisfied, an electron arriving at $T_i$ is counted:

$$T_i - T_{i-1} > \tau_D \tag{14}$$

In some implementations of a circuit, detection of an event may not be so explicit. Detection may be assisted or suppressed by circuit noise or other random factors. An electron arriving slightly earlier than, for example, the condition as expressed in equation (13) may have some possibility to be detected (e.g. an arrival event may be counted). Similarly, an electron arriving slightly later than the condition as expressed in equation (14) may have some probability of being missed. In some embodiments, detection probability may be interpreted as 50% when $T_i - T_{i-1} = \tau_D$.

In some embodiments, a condition for an electron arriving at time $T_i$ to be counted may be that there is no electron arriving at a detector sensing element during the immediately prior time period $[(T_i - \tau_D), T_i]$.

Furthermore, $\lambda$ may be determined as follows, where $I_{d,l}$ is average incoming electron current incident on sensing element l, and e is electron unit charge:

$$\lambda = I_{d,l}\tau_D / e \tag{15}$$

Poisson distribution may be a function of time period and does not depend on where the time period is located in a time axis. A Poisson distribution may be used for expressing electron arrival events for a time period of $\tau_D$. The probability of no electron arriving during the time period $[(T_i-\tau_D), T_i]$ may be given as follows:

$$P(0) = e^{-\lambda} \tag{16}$$

The probability of electrons being counted may be P(0), which may correspond to a confidence level. A miscount rate, an example of which may include an event signal overlap or dead time induced miscount rate, $P_{Miscount}$ may be given as:

$$P_{Miscount} = 1 - P(0) \tag{17}$$

$$= 1 - e^{-\lambda} \tag{18}$$

For very small numbers of $\lambda$, the following may hold:

$$P_{Miscount} \cong \lambda \tag{19}$$

Figure 15:
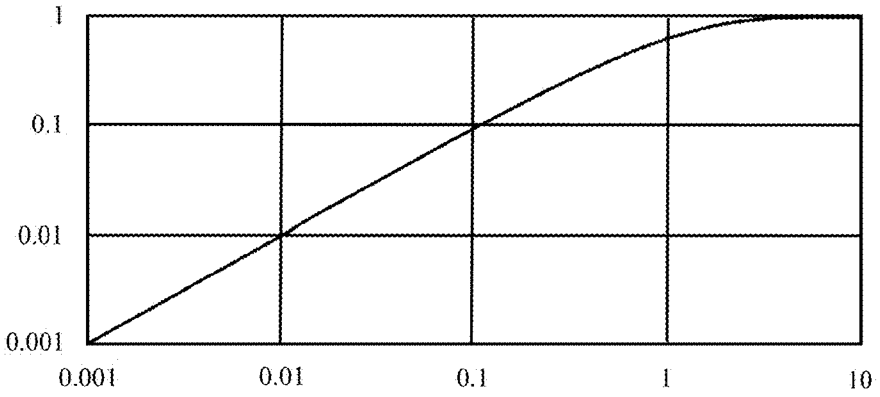
FIG. 15 illustrates an estimated miscount rate plotted against average incoming electron arrival rate, consistent with embodiments of the present disclosure.

FIG. 15 illustrates a graph that may represent a Miscount Rate, $P_{Miscount}$ as a function of $\lambda$. $P_{Miscount}$ may initially increase linearly as $\lambda$ increases. As a saturation limit is approached, for example near the value of $\lambda$=1, $P_{Miscount}$ may begin to increase at a lower rate. The x-axis of FIG. 15 may represent $\lambda$ average number of electrons arriving at a sensing element in a time period equal to dead time, $\tau_D$. The y-axis of FIG. 15 may represent the Miscount Rate.

As can be seen in FIG. 15, to stay within a miscount rate of, e.g., 10% for a given dead time and a given electron arrival location distribution on the detector surface, a sensing element may be configured to have an area such that the incoming current to any sensing element is limited to a particular value of $\lambda$. For example, the average number of incoming electrons on the sensing element over a period of time equal to the dead time may be set to stay below 0.1 electrons/$\tau_D$.

In some embodiments of the disclosure, a detector may be provided with an array of sensing elements each having a predetermined area. For example, in one embodiment, the size of individual sensing elements may be 100 μm×100 μm. However, other sizes of sensing elements may be used as well. The sensing elements may be segmented. By providing an array of multiple sensing elements, the rate of electrons incident on each sensing element may be significantly reduced as compared to a comparative PIN detector case where the entire detection area consists of a single element, as discussed above, or a limited number of detecting segments, e.g., 8 segments. For example, even when a beam of electrons having current of 1 nA arrives at a detector, e.g., at a rate of ~6.4 billion electrons per second, the number of electrons incident on a 100 μm×100 μm sensing element of an array may be about 20 million per second even in a high-density electron arrival region. In comparison, all 6.4 billion electrons would be incident on one sensing element in one second in the case of a single-element detector. Incidentally, the number of electrons incident on a sensing element that has ¼ of the area of a 100 μm×100 μm sensing element (e.g., a 50 μm×50 μm sensing element) may be four times less, e.g., about 5 million per second, which may correspond to about 0.025 electrons per 5 ns.

There may be a number of criteria for determining an area of individual sensing elements. For example, a first area determination criteria may be based on avoiding miscounts. In some embodiments, miscounts may be related to an average separation time $(T_i-T_{i-1})$ of electron arrival events on a sensing element of a given size. The size (e.g., area of a surface configured to receive electrons) of a sensing element may influence the number of electrons received on the sensing element in a given sampling period. The sampling period associated with a sensing element may be determined based on parameters of a detector element that may include the sensing element (e.g., providing a detector using a sampling rate of 400 MHz). A size of the sensing element may be determined such that there may be no more than a certain statistical likelihood that a predetermined number of electrons is received in the sensing element in the sampling period. The sampling period may be related to dead time that may be associated with the sensing element. For example, the sampling period may be set to be less than dead time. Dead time may be independent of the sensing element size.

In some situations, average electron separation time may be short such that the probability of miscounts is high. The larger the average electron separation time, the lower the probability of miscounts may be. Area of a sensing element may be set such that average electron separation time will be no more than a certain value. Average electron separation time may be set to be greater than a value, such as a multiple of a detector element sampling period, e.g., $\tau_S$. Thus, a sampling period of a detector may be set as a factor (e.g., a number between 0 and 1) of average electron separation time. In some embodiments, average electron separation time may be set to be greater than two times sampling period is. In other words, sampling period us may be set to be less than one half of average electron separation time $(T_i-T_{i-1})$. As discussed above, the average electron separation time $(T_i-T_{i-1})$ may be controlled by adjusting the electron beam current or by changing the area or position of sensing elements. Furthermore, sampling period is may be defined by the sampling frequency of the detector (e.g., sampling rate). For a given electron beam current, sampling rate, and a maximum electron arrival rate (at the region of highest electron arrival density) of a detector, average electron separation time $(T_i-T_{i-1})$ may be determined for a unit area.

Figure 16A:
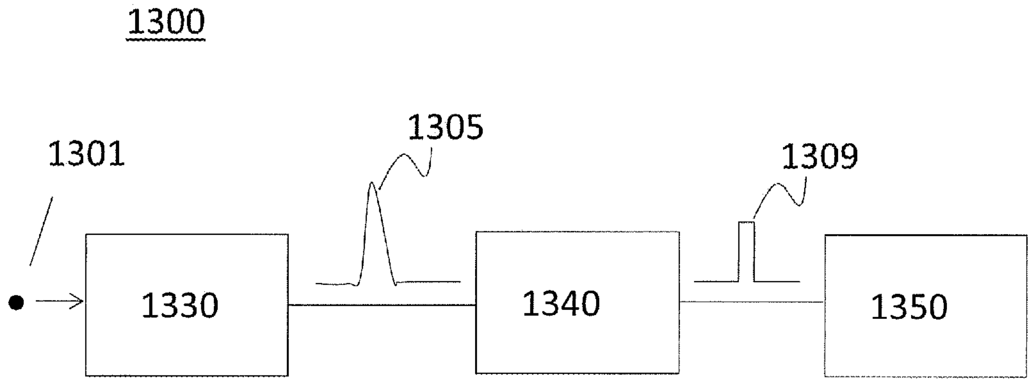
FIGS. 16A and 16B illustrate signal flow in a detection system, consistent with embodiments of the present disclosure.

In some embodiments, a detection system may include a sensing element and a circuit that may be used for counting charged particle arrival events. FIG. 16A illustrates a signal flow in a detection system 1300. Detection system 1300 may include a detector element 1330, a first circuit 1340, and a second circuit 1350. Detector element 1330 may include a transimpedance amplifier (TIA). In some embodiments, detector element 1330 may consist of a sensing element and a front-end circuit. The front-end circuit may be called a signal conditioning circuit and may include a TIA. First circuit 1340 may include an event detector. First circuit 1340 may be configured to implement a function of event detection. First circuit 1340 may include a discriminator, such as a pulse height analyzer. Second circuit 1350 may include a count buffer. Second circuit 1350 may be configured to implement a function of count buffering. Second circuit 1350 may include a scaler.

Detection system 1300 may be configured to perform a detection operation that may include generating a pulse signal, by the detector element, in response to an electron

1301 arriving at detector element 1330. The pulse signal may include an event signal 1305 that may be output to first circuit 1340. The detection operation may allow detection system 1300 to determine that an electron arrival event has occurred. The detection operation may begin from detector element 1330 generating event signal 1305 in response to electron 1301 arriving at detector element 1330. Event signal 1305 output from detector element 1330 may be fed into first circuit 1340 and analyzed to determine that an electron was received at detector element 1330. The determination may include comparing pulse height of event signal 1305 to a predetermined value. If the height of the event pulse signal exceeds the predetermined value, an electron event may be detected. In response to an electron event being detected, a counter may be incremented. First circuit 1340 may include a single-bit counter. First circuit 1340 may include an event flag detector. First circuit 1340 may set a flag when an electron arrival event is detected. First circuit 1340 may output a detection pulse 1309. Detection pulse 1309 may be fed to scaler 1350.

Output from first circuit 1340 may include a single bit of information. For example, in response to determining that an electron arrival event has occurred, by e.g., a pulse height analyzer determining that an input event signal exceeds a predetermined value, first circuit 1340 may output a signal of 1. In some embodiments, first circuit 1340 may be configured to output data in multiple bits. For example, first circuit 1340 may include 2-bit or 3-bit counters.

Figure 16B:
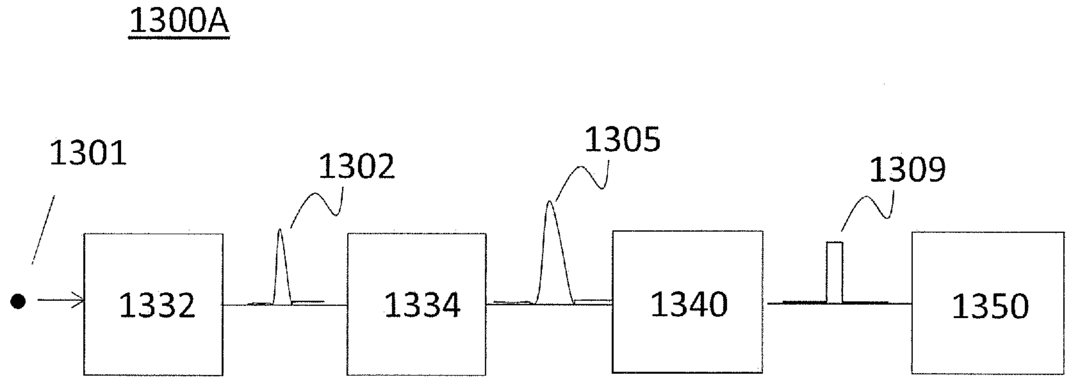

In some embodiments, a detection system 1300A may be provided, as shown in FIG. 16B. Detection system 1300A may include first circuit 1340 and second circuit 1350 similar to detection system 1300 of FIG. 16A. Detection system 1300A may further include a sensing element 1332 and a third circuit 1334. Third circuit 1334 may include front-end electronics, such as a pre-amplifier. Third circuit 1334 may include a transimpedance amplifier. A signal 1302 output from sensing element 1332 may be processed by third circuit 1334. Signal 1302 may include a current pulse signal. The current pulse signal may be converted to a voltage pulse signal and amplified to form event signal 1305. Event signal 1305 may be output from third circuit 1334.

In some embodiments, dead time may relate to event signal 1305. Event signal 1305 may have a width over which pulse height rises and falls. Characteristics of a diode that forms a sensing element may influence the shape and width of event signal 1305. Dead time may relate to event signal 1305 and other processing involving detection system 1300 or 1300A. Dead time may refer to a time during which detection of a subsequent electron arrival event may be impeded. In some situations, arrival of electron 1301 at sensing element 1332 may trigger signal 1302 to be generated. Due to the arrival of electron 1301, event signal 1305 may be output from third circuit 1334. Event signal 1305 may be processed by first circuit 1340. When a second signal, for example, a signal subsequent to signal 1302 is caused to be generated at sensing element 1332, there may be a situation where two separate event signals may not be reliably generated, and a dead time effect may occur. Due to dead time effects, electron arrival events occurring in close succession may not be reliably counted. Such an effect may refer to event detector dead time. For example, an event detector included in first circuit 1340 may be configured to determine that an electron arrival event has occurred when pulse height of event signal 1305 rises above a threshold. Detection of another electron arrival event may occur after it is determined that pulse height of event signal 1305 falls below the threshold. However, when a subsequent electron arrival event prevents pulse height of event signal 1305 from falling, a miscount may occur. Event detector dead time may be related to width of event signal 1305 and a threshold used for determining an electron arrival event. For example, event detector dead time may relate to the distance between the left and right sides of event signal 1305 at a pulse height equal to the threshold. Other factors and characteristics of a detection system may also affect dead time. For example, stray capacitance of an interconnect from a sensing element to a circuit may contribute to dead time.

Dead time may be associated with a particular sensing element. For example, there may be a dead time associated with sensing element 1332. The dead time may be related to characteristics of sensing element 1332 or its associated circuitry. The dead time may be related to first circuit 1340, which may include an event detector.

Circuitry included in detection system 1300 or 1300A may be configured to make various determinations. First circuit 1340 may be configured to determine a characteristic of a signal input therein. Similarly, second circuit 1350 and third circuit 1334 may be configured to determine characteristics of input signals. Third circuit 1334 may be configured to determine a first characteristic of signal 1302, which may be a current pulse. The first characteristic may be a magnitude of the current pulse. Other determinations may be based on the determined first characteristic. For example, it may be determined that an electron incident on a sensing element is a first type of electron or a second type of electron based on the magnitude of its current pulse. Such a determination may involve a comparison to threshold energy levels, as shall be discussed in further detail herein. It will be understood that such determinations may be based on event signal 1305, as well.

In a SEM system, a generated image of a sample may include a plurality of pixels. Each of the pixels may display information, such as a gray level, that may correspond to information derived from a detector. The information may include counts of numbers of electrons received in a sampling period. The counts of numbers of electrons may be summed from a plurality of sensing elements. In some embodiments, a pixel may use data from multiple sampling periods of a sensing element. A pixel period may be defined that uses information derived from a detector over a plurality of sampling periods of individual sensing elements. Pixel period may be determined by an operator. For example, pixel period may be a user-defined value that may be selected from a list of available values. In some embodiments, a user may choose D number of sampling periods out of a list of available integer values, such as 1, 2, 4, 8, and so on. Pixel period may be set at D times sampling period. For each pixel, a value (e.g., a gray level) may be determined based on successively sampled data of D sampling periods. The gray level may be determined by, for example, summing or averaging data of D sampling periods. In some embodiments, pixel period may be predetermined based on parameters of an inspection system instrument. For example, pixel period may be preset for a particular machine.

A SEM system may scan a primary electron beam across a sample in a pattern, such as a raster pattern. Pixels to be generated in an image may be associated with locations of the scanned sample surface. The pixels may be correlated with a particular scan time. Data from a detector may be correlated with the scan time. A scaler may be used to correlate data received from a detector to a particular scan time. A scaler may be configured to correlate detector data with a scan time (and thus, a pixel) based on a delay time. For example, a scaler may record a time at which data associated with an electron arrival event is received and apply a correction based on a delay from a trigger. The trigger may correspond to an electron of a primary electron beam impinging on a sample. The delay may take into account travel time of electrons (e.g., secondary electrons) from the sample to the detector, or time for a signal pulse in a sensing element to be generated and output. In some embodiments, a detector may include an array of sensing elements. A scaler may include a plurality of channels so that data from each sensing element may be allocated to its own channel.

Output of first circuit 1340, as in FIG. 16A or 16B, may be fed into second circuit 1350. Second circuit 1350 may include a scaler. The scaler may be a multi-channel scaler. Second circuit 1350 may be configured to determine counts of electron arrival events to be correlated with a pixel of an image. Second circuit 1350 may take into account time-channel width, which may be based on a pixel period and a number of channels. The number of channels may be based on the number of pixels per line of a scan. A base time channel width may be set to be less than a dead time.

A detection system that records discrete events, such as electron arrival events, may experience dead time. Dead time may refer to the time after an event where the detection system is unable to record another event. For a detector element in a detector that may be configured to detect an electron arrival event, there may be a period of time directly after an electron arrival event in which subsequent electron arrival events may not be captured and recorded accurately.

Dead time may include paralyzable or non-paralyzable dead time. Non-paralyzable dead time may refer to a situation in which an event occurring in the dead time goes unrecorded. For example, the event may be simply ignored. Paralyzable dead time may refer to a situation in which an event occurring in the dead time goes unrecorded, and in addition, the subsequent event causes the dead time period to restart. Paralyzable dead time may also be called extended dead time.

In some embodiments, a sensing element may be configured to generate electron-hole pairs in response to an incident electron (e.g., a secondary electron) arriving at the sensing element. The electron arrival event may trigger a cascade of electron-hole pair generation in the sensing element due to the energy of the incident electron being consumed in the sensing element. The timewise behavior of the cascade may resemble a pulse. During the cascade of electron-hole pair generation due to one electron arrival event, a subsequent electron arrival event may cause the cascade to continue, thus extending the time it takes for the sensing element to return to a normal state. A sensing element in a detector array may be affected by paralyzable dead time. For example, a diode biased to Geiger counting mode may require a recovery time to pass or may require quenching before being able to accurately detect subsequent electron arrival events. Some embodiments of the disclosure may avoid a paralyzable dead time associated with a sensing element. For example, a detector may be configured such that dead time associated with a sensing element does not include paralyzable dead time. A sensing element may be provided that has high internal gain such that it is not necessary to bias the sensing element to a region where the sensing element may be affected by paralyzable dead time. The sensing element may be operated with reverse bias in a linear region. The kinetic energy of an incoming electron may provide for high gain while maintaining speed of detector elements. A detector element may have a speed that is at least as high that of a detector element operated under normal bias conditions. In some embodiments, the speed of the detector element may be higher than that of a detector element operated under normal bias conditions due to an avalanche effect. Long tail behavior of a detector element may be avoided.

Consideration of dead time may be used to determine whether a subsequent charged particle arrival event may be detectable by a detector. For example, when electron arrival events occur in quick succession, only one electron arrival event may be recorded in a sampling period although two or more electrons may have arrived during the sampling period. Thus, an electron arrival event may be miscounted. Miscounting may be based on dead time arrival events if the sampling period is set shorter than dead time. Occurrence of miscounts in a detector may be acceptable when the level of miscounting is below a certain level. In some embodiments, the certain level may be 10%. In some embodiments, the certain level may be 5%. In some embodiments, the certain level may be 2.5%.

In some embodiments, dead time may correspond with pulse width of event signal initiated by an electron arrival event. In some embodiments, dead time may be different from total pulse width of an event signal generated in response to an electron arrival event. For example, dead time may be measured from a time at which an electron arrival event is recorded until the output level of the event signal has receded below a detection threshold. The detection threshold may be set to some level above a background noise amount. The electron arrival event may be recorded when the level of the event signal has exceeded the detection threshold.

Figure 17:
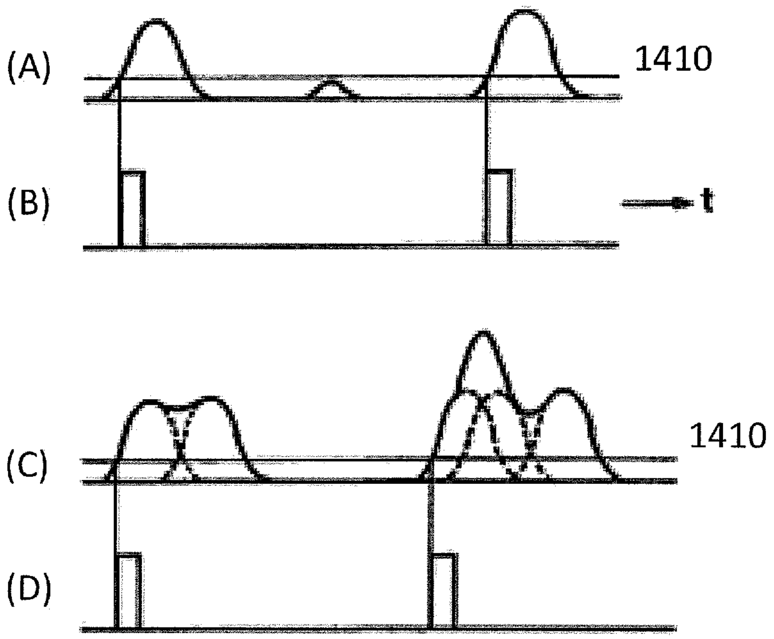
FIG. 17 shows exemplary representations of dead time miscounting, consistent with embodiments of the present disclosure.

FIG. 17 shows exemplary representations of dead time miscounting. A graph (A) in FIG. 17 may show an exemplary output of detector element 1330 (as discussed with respect to FIG. 16A) on a timewise basis. Event signal pulses may be relatively dispersed. The signal shown in graph (A) of FIG. 17 may be fed into a pulse height analyzer. Event signal pulses may be compared to a detection threshold 1410. Signals below detection threshold 1410 may be filtered out as noise. A graph (B) in FIG. 17 shows a signal output from a pulse height analyzer corresponding to an input signal from graph (A) of FIG. 17. In graphs (A) and (B) of FIG. 17, there are no miscounts.

As shown in graph (C) of FIG. 17, when event signal pulses are closely overlapped, miscounting may occur. For example, when an electron arrival event is configured to be detected upon a signal level exceeding a fixed threshold, such as threshold 1410, a signal may be counted as one pulse because it does not reduce to below the threshold before rising again above it. Graph (C) of FIG. 17 shows two types of dead time miscounting occurrences. As shown in a graph (D) of FIG. 17, multiple arrival events may be counted as single events.

As discussed above, miscounting may include dead time miscounting. In some embodiments, dead time miscounting may be considered as follows. In a first dead time miscounting analysis, it may be assumed that an $i^{th}$ electron arrives at a sensing element at a time $t_i$. Whether the $i^{th}$ electron is countable or not may depend on whether any other electrons have arrived in a previous dead time period. For example, an electron may have arrived in the period from $(t_i-\tau_D)$ to $t_i$, where $\tau_D$ is event detector dead time. This period may be expressed as $[(t_i-\tau_D), t_i]$.

In the first dead time miscounting analysis, a Poisson distribution may be used to model electron arrival events on a detector. A probability P of k events occurring during a time period $\Delta t$, where $\lambda$ is an average number of events per time period $\Delta t$, may be given as:

$$P(k) = e^{-\lambda}\frac{\lambda^k}{k!} \quad (20)$$

For the relevant time period of $[(t_i-\tau_D), t_i]$, $\Delta t$ may be equal to $\tau_D$. Substituting values for k into equation (20) may yield the following:

$$P(0) = e^{-\lambda} \quad (21)$$

$$P(1) = \lambda e^{-\lambda} \quad (22)$$

$$P(2) = \frac{1}{2}\lambda^2 e^{-\lambda} \quad (23)$$

P(0) may represent the probability that no electrons arrive during the period $[(t_i-\tau_D), t_i]$, and thus, the $i^{th}$ electron should be countable because its arrival event will not be influenced by dead time. P(1) may represent the probability of one electron arriving during the period $[(t_i-\tau_D), t_i]$, in which case, the $i^{th}$ electron may not be countable. P(2) may represent the probability of two electrons arriving during the period $[(t_i-\tau_D), t_i]$, in which case, the $i^{th}$ electron may not be countable. In the first dead time miscounting analysis, it may be assumed that the $i^{th}$ electron may be countable only when no other electrons have arrived in the period $[(t_i-\tau_D), t_i]$, that is, directly before the $i^{th}$ electron arrival event. In the first dead time miscounting analysis, a sampling period of a sensing element may be less than event detector dead time $\tau_D$. P(k) may be independent from arriving time of electrons for a Poisson assumption as far as A remains constant over time.

The probability of an electron being counted for a given dead time may be expressed by P(0). Since the sum of probability of a miscount and probability of successful counting should be 1, the miscount probability of an electron should be 1−P(0). Ddue to dead time according to the first dead time miscounting analysis, $P_{miscount}$, may be given as follows:

$$\begin{aligned} P_{miscount} &= 1 - P(0) \quad (24) \\ &= 1 - \left(1 - \lambda + \frac{1}{2}\lambda^2 - \frac{1}{6}\lambda^3 + \cdots\right) \\ &= \lambda - \frac{1}{2}\lambda^2 + \frac{1}{6}\lambda^3 + \cdots \\ &\approx \lambda \text{ for } \lambda << 1 \end{aligned}$$

As can be seen from equation (24), above, probability of a miscount due to dead time according to the first dead time miscounting analysis, $P_{miscount}$, may be approximated as being equal to for small values of $\lambda$. As noted above, $\lambda$ may be the average number of electron arrival events in a time interval. The relevant time interval may be event detector dead time $\tau_D$.

Accordingly, probability of a miscount due to dead time according to the first dead time miscounting analysis, $P_{miscount}$, may also be given as:

$$P_{miscount} = I_{d,i}\tau_D / e \quad (25)$$

As an illustration, the following scenario is considered. A primary electron beam may irradiate a sample. A beam of secondary electrons may be generated that is directed to a detector. Beam current incident on the detector may be $I_{Det}$. For simplicity, it may be assumed that $I_{Det}$ is equally distributed over a detector's sensing area $S_{Det}$. $S_{Det}$ may include a circular area of 4 mm diameter, and thus, $S_{Det}=4\pi$ mm$^2$. Assuming a detector includes an array of segmented sensing elements, each having a size of 100 μm×100 μm, sensing element area may be given as $S_{Seg}=0.01$ mm$^2$.

With exemplary values of $S_{Det}=4\pi$ mm$^2$, $S_{Seg}=0.01$ mm$^2$, $I_{Det}=1$ nA, and $\tau_D=5$ ns, miscount due to dead time according to the first dead time miscounting analysis, $P_{miscount}$, may be given as:

$$P_{miscount} = \lambda = \frac{I_{seg}\tau_D}{e} = 1*10^{-9}*\left(\frac{0.01}{4*\pi}\right)*5*10^{-9}/1.602*10^{-19} = 0.025 \quad (26)$$

Thus, a miscount rate of 2.5% or less may be achievable. Even at relatively high levels of beam current incident on the detector, such as 1 nA as in the example above, a miscount rate may be limited to the relatively low level of 2.5%. It should be noted that equation (26) may be based on an assumption that beam density of the beam incident on the detector is evenly distributed. Nevertheless, such a miscount rate may be acceptable in a variety of applications. Furthermore, in some embodiments, statistical correction of an electron count may be used when the miscount rate is less than 10%. Thus, even when miscounts are present, they may be corrected by statistical correction. In comparison to a beam current level of 1 nA incident on a detector, some application, such as high-throughput CD (critical dimension) measurement may use primary beam current of 250 pA, or less, leaving a margin in spontaneous peak secondary yield up to 4λ at the edge lines of printed patterns on wafer surfaces. In some applications, a system's standard beam current may be set to on the order of 10 pA. Thus, miscount rate may be further reduced in some applications. Meanwhile, a detector may be configured to handle situations of high secondary electron local yield which may push up electron current arriving at a detector, such as at metal pattern edges (e.g., edge enhancement signals).

In some embodiments, rather than being evenly distributed over all of the sensing elements on a detector, beam current may be distributed unevenly. Even when beam current is distributed unevenly, a case of maximum beam current in regions of higher expected electron arrival may be accounted for. For example, a region of higher density of electron arrival events may be around the center of the detector. A detector may be configured so that miscount rate does not exceed a predetermined level in sensing elements at regions of higher electron arrival.

In some embodiments, with all incident electrons arriving on a detector in a diameter of 6 mm, a size of individual sensing elements may be set to a uniform square shape in which $S_{Det}$3,125 is approximately equal to 0.009 mm$^2$, which may correspond to about a 100×100 μm sensing element. Thus, a sensing element size of 100×100 μm may be appropriate for obtaining an acceptable miscount rate, even when beam current is high. As will be apparent, other sizes of sensing elements may be used while achieving an acceptable miscount rate. Furthermore, other parameters, such as sampling period, may be adjusted to achieve an acceptable miscount rate.

Because the miscount rate may be lower when the sampling period is less than the sensing element dead time, it may be desirable to set a sampling period to less than dead time. In some embodiments, the sampling period of a sensing element may be set to less than 5 ns. When the sampling time is less than the dead time, a counter may be configured to count only one electron arrival event at a time.

A detector may be configured such that no more than a predetermined number of charged particles is received on a sensing element in a sampling period with no more than a predetermined miscount rate. The sampling period may be less than or equal to sensing element dead time. The sensing element may be one of an array of sensing elements making up the detector. The predetermined number may be one. In some embodiments, the predetermined number may be two, three, or more, for example. Various parameters of a detection system may be set based on the predetermined miscount rate. For example, assuming a detection system is used with a primary charged particle beam having a maximum beam current, parameters of sensing element size and sensing element number may be determined based on the predetermined miscount rate. Beam current of a primary charged particle beam may relate to beam current of a beam of secondary charged particles incident on the detector. For example, a yield factor may indicate a collection rate of charged particles of a secondary beam and may be used to determine beam current of the secondary beam from the primary beam. Yield factor may be affected by material of a sample under inspection, settings of a charged particle beam system that includes the detection system, and structure of the charged particle beam system. Furthermore, assuming the array of sensing elements of the detector includes sensing elements of a fixed size, operating conditions of the detection system may be set, including sampling rate and beam current. In some embodiments, a detector's miscount rate may be maintained at a predetermined level even when beam current is increased to a level that may be required for certain applications. As an example, when high-resolution SEM is needed, beam current may be reduced. When throughput is needed, beam current may be increased. An e-beam wafer inspection system may use relatively high beam current. In some embodiments, for example, subdividing a detector into an array of sensing elements, wherein the sensing elements are smaller than the overall detector, may lower the miscount rate. The smaller the sensing elements, the smaller the miscount rate may become.

Dead time may be a characteristic of a detector's sensing elements and other components that may be determined by their construction. For example, a semiconductor diode used as a sensing element, as discussed herein in some embodiments, may influence dead time due to phenomena related to an electron-hole pair generation mechanism. Dead time may be fixed when a circuit and sensing element array is designed and fabricated. Dead time may be a non-adjustable parameter once a detection system is constructed. Rather, dead time may be constant for a given sensing element array and accompanying circuitry.

A sensing element may be connected to a circuit. The circuit may include a first circuit, a second circuit, or a third circuit, for example as discussed above with reference to FIGS. 16A and 16B. The circuit may be configured to determine a number of charged particles incident on the sensing element in a sampling period. The circuit may include an event pulse detector. The event pulse detector may include a discriminator, a comparator, or a pulse height analyzer, etc. The circuit may include an eliminator. The eliminator may be configured to filter out noise signals. The circuit may be configured to compare an input signal to a threshold and produce an output when the input signal exceeds the threshold. The output may include a bit indicating that a charged particle has been received at a sensing element in a sampling period. In some embodiments, the output may include a multi-bit signal. Sampling period may include a time channel width of a multi-channel scaler. In some embodiments, the output may include an event flag and an overflow flag.

Figure 18:
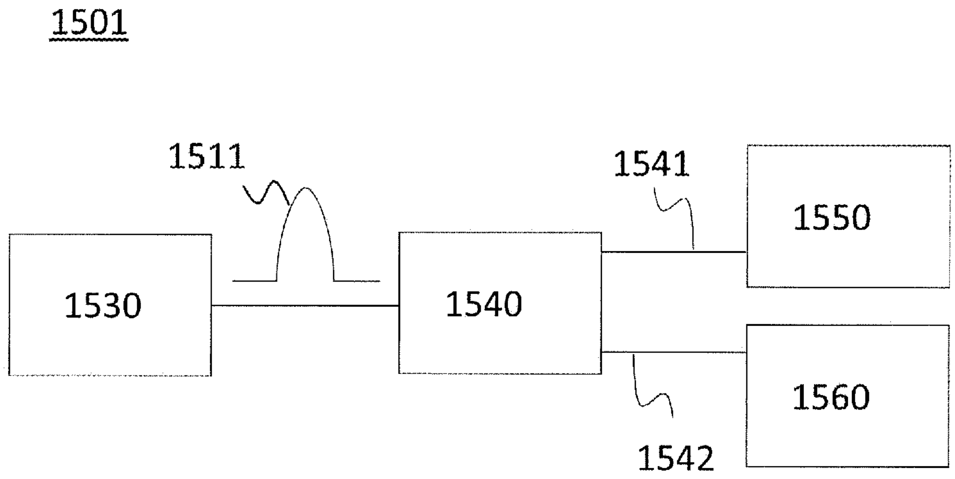
FIG. 18 shows a detection system configured to detect a charged particle arrival event with an output including an event flag, consistent with embodiments of the present disclosure.

FIG. 18 shows a detection system 1501 configured to detect a charged particle arrival event with an output including an event flag, consistent with embodiments of the present disclosure. Detection system 1501 may include a detector element 1530, a first circuit 1540, a second circuit 1550, and a third circuit 1560. Detector element 1530 may include a diode and a pre-amp. Detection system 1501 may be configured to perform a detection operation that may include generating a pulse signal 1511, by the detector element, in response to an electron arriving at detector element 1530. Pulse signal 1511 may include an event signal, similar to event signal 1305 shown in FIG. 16A or 16B, as discussed above. In some embodiments, pulse signal 1511 may include overlapped or superimposed pulses, such as those shown in graph (C) of FIG. 17. Pulse signal 1511 may be input to first circuit 1540. First circuit 1540 may include a pulse height analyzer. First circuit 1540 may generate an event flag 1541 that may be transmitted to second circuit 1550. Second circuit 1550 may increment a counter. Second circuit 1550 may include an event flag detector. Meanwhile, first circuit 1540 may generate an overflow flag 1542 that may be transmitted to third circuit 1560. An overflow flag may be generated in response to energy of a pulse signal exceeding a threshold. Third circuit 1560 may include an overflow flag detector. Configuring circuits as event flag detectors, for example, may be advantageous in terms of system simplification.

In some embodiments, a detection system may include multiple timing scales. Detector element sampling period may be set to be less than an event detector dead time. The detector element sampling period may correspond to a time channel width of a multi-channel scaler. An electron arrival event may be detected by a circuit including an event detector, such as a discriminator, comparator, pulse height analyzer, etc. Detection of electron arrival events may occur asynchronously to channel boundary timing. A circuit may be configured to, following an electron arrival event detection, increment a value in a specified time channel, where the event time lies within a time window. Overall system timing may be configured to be faster than timing for individual detector elements (e.g., detector element sampling period). For example, a time channel may be configured as a one-bit counter (e.g., using an event flag), while another circuit may be configured to realize the number of event flags set during a time channel period at a rate faster than the rate that event flags are pushed out from a component of the detection system. The circuit may be configured to run faster than individual event flag detectors corresponding to detector elements when time channel width is greater than dead time. In some embodiments, the circuit may be configured to run faster than individual event flag detectors when time channel width>>dead time.

In some embodiments, there may be provided a one-bit counter with a detector element, wherein the detector element sampling period may be set to be less than event detector dead time. When detector element sampling period is set to be less than event detector dead time, a situation may be achieved where no miscounts occur due to event detector dead time. In one sample period, there may be no multiple event signals that are input to the event detector. Electron arrival events may occur in close succession, and in some cases may cause a merged event signal, but an event detector corresponding to the detector element may count no more than one charged particle arrival event in a sampling period. This configuration may enhance system simplification and allow high bandwidth. A detector may be manufactured using readily available techniques and may achieve running at 400 MHz or greater. The detector element may not need to be configured to detect more than one electron arrival event at a time. A misdetection may occur, for example when multiple electrons arrive at a sensing element within a time period less than event detector dead time. However, such a misdetection may be exceedingly rare. The statistical probability of multiple electron arrival events within the event detector dead time may be below a predetermined level. For example, a detector may be configured to have a size such that there may be at least a predetermined level of confidence that the arrival of two or more electrons within event detector dead time will not occur.

Circuitry connected to a sensing element may be provided on a per-sensing element basis. For example, in a detector including an array of sensing elements, each sensing element of the array may be connected to a circuit. The circuit may be configured to count a number of charged particles incident on the sensing element in a sampling period. In some embodiments, the number may be one or zero. A detection system may include a global circuit that may be configured to sum up counts of multiple sensing elements in the array. A total number of charged particles received in the array may be determined by adding the numbers of charged particles received on multiple sensing elements.

Figure 19A:
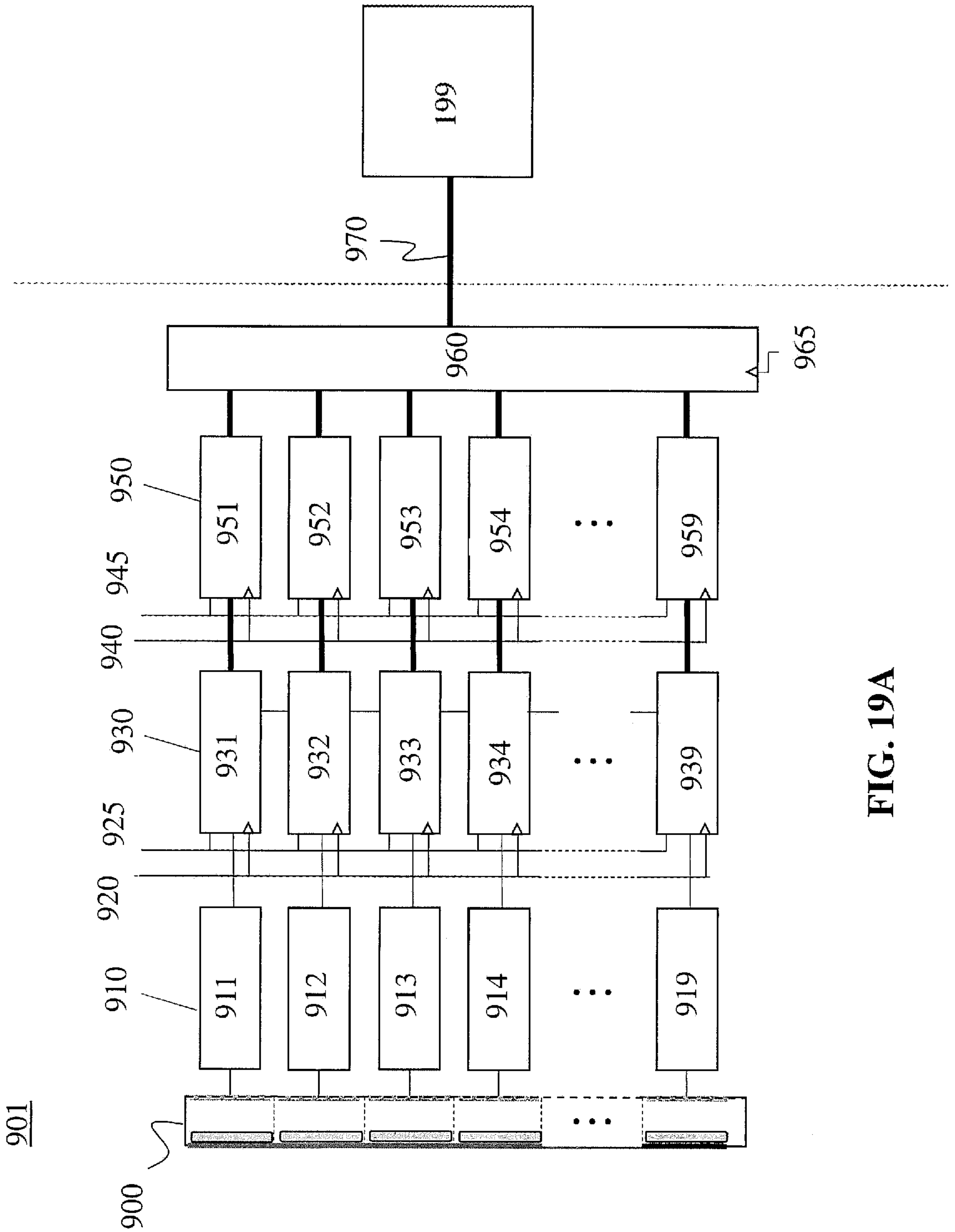
FIGS. 19A and 19B illustrate schematic representations of exemplary architectures of detection systems, consistent with embodiments of the present disclosure.

Reference is now made to FIG. 19A, which illustrates a schematic representation of an exemplary architecture of a detection system 901. The detection system may be provided with detector 900 including an array of sensing elements. As seen in cross section, detector 900 may have a structure resembling a back-side illumination CMOS image sensor. Electrons may be incident on an exposed front (incidence) surface side of detector 900. At the front side, there may be a P+ layer that may serve as the anode of a diode included in a sensing element array. The anode may be negatively biased by a voltage source with zero sourcing impedance. When, for example, an electron with about 9 keV of kinetic energy penetrates into a sensing element of detector 900, the event may excite about 2,000 electron-hole pairs in a depletion zone of the sensing element. The electrons of those pairs may be collected at the cathode of the sensing element and may contribute to a detection signal. For example, current pulses may be generated with magnitudes substantially proportional to kinetic energy of the incident electrons.

Raw detection signal from sensing elements in the form of sharp current pulses may be fed into an electronic circuit. For example, there may be provided front-end electronics 910. Front-end electronics 910 may include individual circuits 911, 912, 913, 914, and so on, for example up to an nth circuit 919. Each of the individual circuits of front-end electronics 910 may correspond to one sensing element of the array of detector 900. Each individual circuit of front-end electronics 910 may include a current buffer and an amplifier, such as a transimpedance amplifier, a charge amplifier, or a charge transfer amplifier.

In some embodiments, components may be integrated with detector 900. Detector 900 may be provided as a semiconductor substrate including an array of sensing elements. The array of sensing elements may include a diode. A low-gain amplifier may be built up in the back side of a semiconductor substrate that includes the PIN diode. The amplifier may be configured to operate in a linear mode and may avoid a region where the amplifier may exhibit recovery time. The semiconductor substrate may include a plurality of segmented diodes. A plurality of amplifiers may be configured such that a respective amplifier of the plurality of amplifiers is attached to each of the diodes.

In some embodiments, an array of sensing elements may be constructed with Low Gain Avalanche diode (LGAD) segments. LGAD may provide relatively small current gain, for example around 10× to about 20×, operating very fast while remaining in a linear mode, unlike conventional avalanche diodes that may go into avalanche current flow following a triggering event and require a mechanism to reset the current flow to be ready for the next triggering event for detection. Supplying extra current gain of an LGAD may be helpful for precise detection timing or simplifying front-end electronics 910. LGAD may not require bias current. Furthermore, LGAD may be helpful to reduce power consumption of a detection system.

After amplification, signal output from each of the individual circuits of front-end electronics 910 may be fed into event detector 930. Event detector 930 may include individual circuits 931, 932, 933, 934, and so on, for example up to an nth circuit 939. Each of the individual circuits of event detector 930 may correspond to one sensing element of the array of detector 900. Each individual circuit of event detector 930 may include a discriminator, a discriminator block, a pulse height analyzer, or the like.

The detection system of FIG. 19A may differ from that of FIG. 6 (and, for example, a CMOS sensor) in that event detector 930 may be provided instead of an ADC block, among other things. Event detector 930 may be useful in counting electrons.

Returning to FIG. 19A, event detector 930 may include discriminator blocks. The discriminator blocks may include logical operation processing that may be implemented using hardware such as an electronic circuit. The discriminator block may compare incoming signal, e.g., event signal, against a reference level and output a signal such as a detection pulse or an event detection flag when a rising edge of the incoming signal crosses the reference level. For example, as discussed above with respect to FIG. 14A, a measured current signal may be compared to threshold $Th_e$. The may be set sufficiently higher than a background noise level. In some embodiments, discriminator blocks may be implemented by a controller. Event detector 930 may also include other types of circuitries, such as a comparator configured to compare incoming voltages, current, or other types of signals, to a reference level.

The detection system of FIG. 19A may also include a pixel count buffer 950. Pixel count buffer 950 may include individual circuits 951, 952, 953, 954, and so on, for example up to an nth circuit 959. Each of the individual circuits of pixel count buffer 950 may correspond to one sensing element of the array of detector 900. Output from each of the circuits of event detector 930 may be fed into a respective circuit of pixel count buffer 950.

The detection system of FIG. 19A may also include a count summing unit 960. Output from each of the circuits of pixel count buffer 950 may be fed into count summing unit 960. Counts of received electrons from each of the sensing elements in detector 900 may be combined to, for example, obtain a gray level of an image to be used in image processing. Combining counts of received electrons may comprise summing counts across multiple sensing elements, multiple sampling time periods, or multiple frames. Data from sensing elements may be combined based on properties of charged particle arrival events. For example, data from sensing elements may be combined on the basis of a charged particle arrival event's time stamp, sensing element location, scan action of a primary beam of a charged particle beam apparatus, or properties of the charged particle beam apparatus. Combined data may be used for reconstructing an image of a sample. For example, a pixel count sum 970 may be fed into image processing system 199. Count summing unit 960 may include logical operation processing that may be implemented using hardware such as an electronic circuit, or, for example, by a controller.

There may be provided various signal lines, and so on, connecting various elements in the detection system of FIG. 19A. For example, there may be a pixel clock 920 connected to each of the individual circuits of event detector 930. Furthermore, a detection control 925 may be connected to each of the individual circuits of event detector 930. Similarly, there may be another pixel clock 940 connected to each of the individual circuits of pixel count buffer 950. Furthermore, a detection control 945 may be connected to each of the individual circuits of pixel count buffer 950. Also, a delayed pixel clock 965 may be connected to count summing unit 960. Pixel clocks 920, 940, and 965 may run at the same or different speeds.

The detection system of FIG. 19A may use relatively simplified electronic components and may achieve high speed while enabling good packaging flexibility. For example, components may be integrated on a semiconductor chip. Front-end electronics 910, event detector 930, pixel count buffer 950, or count summing unit 960 may be provided in a semiconductor package, such as a single monolithic semiconductor chip. For example, front-end electronics 910, event detector 930, pixel count buffer 950, and count summing unit 960 may be provided as layers in a semiconductor chip that may be connected to detector 800, and to image processing system 199. The dashed line shown between image processing system 199 and count summing unit 960 in FIG. 19A may represent a division between on-chip structure and off-chip structure. In some embodiments, front-end electronics 910, event detector 930, pixel count buffer 950, and count summing unit 960 may be provided as separate modules.

Counting electrons may have numerous advantages as compared to detecting an analog signal. A semiconductor chip including a detector and detection system, for example as discussed in embodiments herein, may achieve higher speed and may avoid processing bottlenecks. As discussed above, the overlap of signal pulses in adjacent electron arrival events may impede detection accuracy. Therefore, it may be important for a detector to have high speed. In some devices, front-end electronics may impose a limit on bandwidth. However, as discussed with respect to embodiments herein, when front-end electronics or other components are integrated in a semiconductor chip, high speed may be achieved. In some embodiments, components configured to count a number of charged particles, such as by providing output in the form of an event flag, may be relatively simple and may allow system simplification, and high speed. Rather than sampling an analog signal to represent beam intensity, it may be advantageous to detect individual events and count the number of individual events occurring over a time period.

Counting electrons may be particularly effective in some types of applications, such as CD SEM, high-resolution high-throughput inspection, or metrology of manufactured semiconductor devices. In some embodiments discussed herein, a detection system may enable electron counting for electron beams of, for example, 100 pA and up.

In a comparative example, some detectors may be provided in high-energy particle physics analysis instruments. For example, a particle accelerator may propel charged particles at high speeds and energies. Charged particles may collide with materials or other particles and collision products may be detected by detectors. A detector may be configured to receive a particle. However, in a high-energy physics instrument, detectors may be configured such that particles pass through detectors. For example, a calorimeter may measure the energy that a particle loses as it passes through the calorimeter.

In contrast to a calorimeter, for example, a sensing element configured to count a number of charged particles may receive a charged particle and, in response to the charged particle arriving at the sensing element, generate electron-hole pairs in the sensing element until the energy of the charged particle is consumed. Furthermore, a circuit connected to a sensing element may be configured to discriminate a level of energy of the incident charged particle, as shall be discussed herein. Further still, a circuit connected to the sensing element may be configured to sum counts of charged particle arrival events occurring at multiple sensing elements in an array. A detector may derive information from a sensing element including a timing at which a charged particle was received, as well as its energy level.

In Scanning Electron Microscopes (SEM), secondary electrons (SE) and back scattered electrons (BSE) may be emitted from a specimen. It may be useful for a SEM system to distinguish SE and BSE and generate two separate images, an SE image and BSE image, simultaneously. The two images may show different properties of the specimen in 2-dimensional space because of the two different mechanisms of SE and BSE generation processes at the specimen in response to electron impingement on the specimen.

In some embodiments, multiple thresholds may be set to acquire SE and BSE images simultaneously. Event signal pulses coming into an event detector may be fairly proportional to the energy of the incoming electron that caused the event signal pulse of interest. Average energy of a BSE is higher than that of a SE. There may be a clear separation of energy distributions between SEs and BSEs. In such cases, for example, a first threshold may be set at a value equivalent to 60% of average height of event signal pulses caused by SEs. A second threshold may be set between the SE event signal pulse height average and BSE event signal pulse height average. Corresponding to the two thresholds, two detection flags, for example, flagLow and flagHigh, may be defined. Each flag may be set when it is determined that an event signal crosses the corresponding threshold in its rising edge. Therefore, both flags, flagLow and flagHigh, may be set by an event signal pulse caused by a BSE, and only flagLow may be set by an event signal pulse caused by a SE while flagHigh may stay in a reset state. By a simple logic, an event detector may determine which type of electron was detected. The logic may be implemented either in event detector 930 or count buffer 950, for example. In some embodiments, the count buffer may be an advantageous location, for example, where count buffer functions are less timing critical and where summing may be executed over a number of clock cycles in pipeline architecture. Adding one cycle for executing the logic prior to the series of clock cycles for summing may not harm overall performance of the detector system. Under such functionality setting of a detector system, such as detector system 901, summing may be done independently between SE counts and BSE counts, and summing unit 960 may output the two sums at each delayed pixel clock cycle. For precision of SE and BSE discrimination, additional thresholds may be added.

Figure 19B:
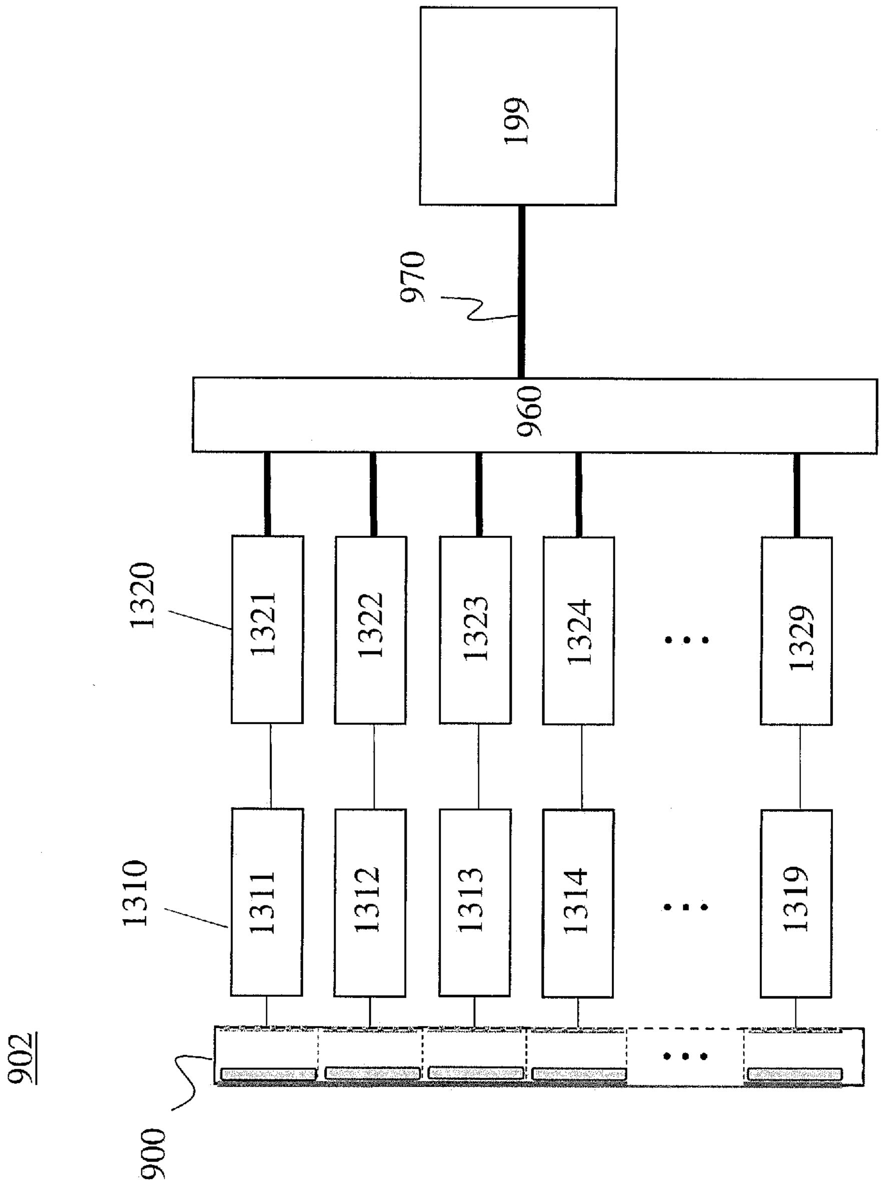

Reference is now made to FIG. 19B, which illustrates a schematic representation of another exemplary architecture of a detection system, consistent with embodiments of the present disclosure. A detection system 902 of FIG. 19B may be similar to detection system 901 of FIG. 19A except that detection system 902 provides an energy storage device 1310 that is connected to detector 900 including an array of sensing elements, among other differences. Energy storage device 1310 may include individual energy storage units 1311, 1312, 1313, 1314, and so on, for example up to an nth energy storage unit 1319. Each of the individual energy storage units may correspond to one sensing element of the array of detector 900. Energy storage units 1311 to 1319 may be configured to accumulate energy in response to an output signal from respective sensing elements of the array of sensing elements of detector 900 being fed thereto. Each energy storage unit may include a micro-capacitor, for example.

Raw detection signal from sensing elements may be fed into energy storage units. Energy accumulated in the energy storage units may be stored until the energy storage units are reset. For example, when the energy storage device 1310 includes a capacitor, energy level may be reset when the capacitor is discharged. While energy is being fed into energy storage device 1310, the stored energy level may be read. Energy level may be maintained for a duration until reset.

In some embodiments, energy associated with sensing element output may be reset by an active reset or a passive reset. An active reset may include affirmatively causing an element to reduce its energy level. For example, the active reset may include discharging a capacitor. A passive reset may include passively allowing the energy level to be reduced. For example, in some devices, the energy level may decay over time. In a sensing element itself, the energy generated in response to an electron arrival event may be dissipated as time passes. In some embodiments, as discussed above, a current pulse generated by a single electron arrival event at a PIN detector may have a pulse width of, for example, 3 to 5 ns, and thus, sensing elements may be passively reset after about 3 to 5 ns.

In some embodiments, energy storage device 1310 may be omitted. For example, sensing elements themselves may function as energy collection units and may inherently reset periodically as surges of electron-hole pairs generated in response to electron arrival events gradually dissipate.

Detection system 902 may also include a detection circuit array 1320. Detection circuit array 1320 may include individual circuits 1321, 1322, 1323, 1324, and so on, for example up to an nth circuit 1329. Each of the individual circuits of detection circuit array 1320 may correspond to one sensing element of the array of detector 900. Each individual circuit of detection circuit array 1320 may include an event pulse detector. An event pulse detector may be configured to detect an arrival event of a charged particle on a sensing element. For example, an event pulse detector may be configured to detect a charged particle arrival event by detecting an amount of energy in a sensing element and may be configured to increment a counter thereby indicating that a charged particle has been counted. In some embodiments, other ways to detect output signal from a sensing element may be used. For example, output from a sensing element may be read by being sampled at a predetermined time. Detection circuit array 1320 may include a clock. In some embodiments, a global clock may be provided. Using a global clock, operations of sensing elements and their associated circuitry may be synchronized. In some embodiments, individual sensing elements and their associated circuitry may have their own clocks.

A circuit of an event pulse detector may include comparators. In addition, various other circuit components may be provided, such as voltage references. In some embodiments, energy captured in energy storage units may exceed an overflow limit, and counting of charged particles may be impeded. For example, a miscount may occur when more than one charged particle is received in a sensing element and the received energy may not be indicative of the total number of charged particles received. Energy accumulated in an energy storage unit may remain the same even after subsequent charged particles are received. Thus, it may be beneficial to provide circuitry for processing data of sensing elements on a timewise basis. Detection circuit array 1320 may include a storage for storing sensing element data that may be associated with a time stamp.

Detection system 902 may also include a count summing unit 960. Output from each of the circuits of detection circuit array 1320 may be fed into count summing unit 960. Counts of received charged particles from each of the sensing elements in detector 900 may be summed to obtain a gray level of an image to be used in image processing. For example, a pixel count sum 970 may be fed into image processing system 199. Count summing unit 960 may include logical operation processing that may be implemented using hardware such as an electronic circuit, or, for example, by a controller.

There may be provided various signal lines, and so on, connecting various elements in detection system 902. Detection system 902 may include further components, such as amplifiers, signal processing circuitry, and others, for example. It will be understood that various connections and other elements, such as that shown in FIG. 19A, may be added to detection system 902.

In some embodiments, a sampling period $\tau s$ for a detector may be set to be smaller than dead time $\tau_D$, where electron count in any sampling period must be either 0 or 1 because any successive two detection pulses will be separated by one sampling period or more. Therefore, a count buffer may be configured with one bit, e.g., as a flag. In some embodiments, when applied to a SEM, a detector's fastest pixel rate may be configured to be $1/\tau_S$ Hz. While sampling period is fixed, an SEM image with a slower pixel rate, e.g., 1/(NTs) (where N=2, 3, . . . ) may be constructed in an image processor by grouping and summing each consecutive count results and representing one pixel with the sum of all counts of the group. If $1/\tau_S$ is set to, for example, 400 MHz, SEM images with variable but discrete pixel rates of 400/N MHz (N=1, 2, 3, . . . ) can be supported.

In some embodiments, sampling period $\tau_S$ may be set to be larger than dead time $\tau_D$, where an event detector may generate multiple detection pulses within a single sample period. Therefore, a count buffer may be configured in multiple bits. The count buffer may be configured in multiple bits so that additional miscounts may be avoided and overall miscount rate may be maintained at an acceptable level. Forming SEM images with a slower pixel rate at an image processor end while keeping the detector end running at the fixed sampling period $\tau_S$ as mentioned above may be advantageous. For example, because modern-day foundry chips may enable 400 MHz clock operation, the cases of $\tau_S > \tau_D$ may be rare.

Figure 20A:
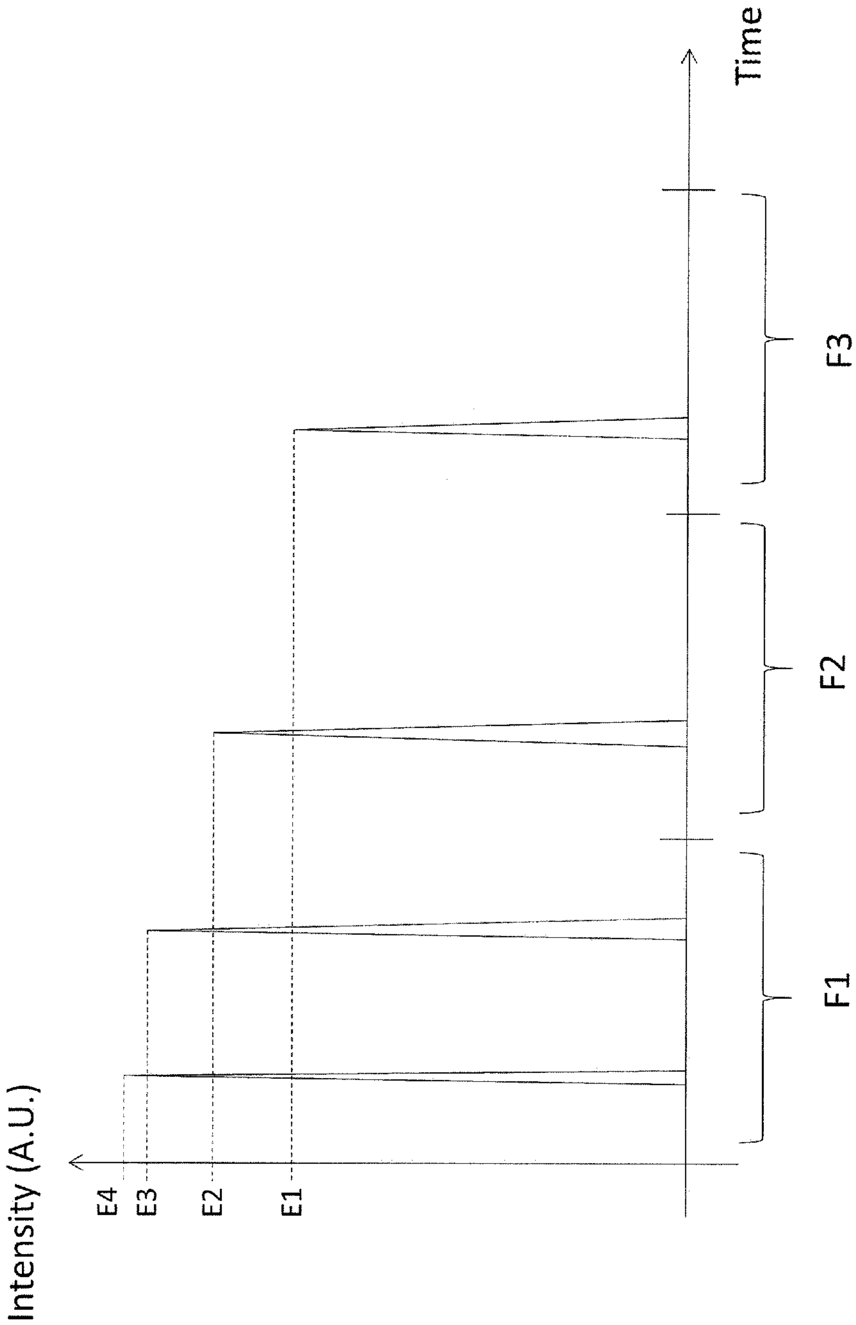
FIG. 20A, FIG. 20B, and FIG. 20C are graphs illustrating exemplary representations of output signals from sensing elements, consistent with embodiments of the present disclosure.

Reference is now made to FIG. 20A, which shows an exemplary representation of output signal of a sensing element coupled to a circuit, where sensing elements may be connected to circuits on a per-sensing element basis. As used herein, the term "output signal," "sensing element output," or "output of a sensing element," etc., may refer to output of a sensing element or its associated circuit. Output signal may be generated by a sensing element and its output may be coupled to a corresponding circuit. Then, a controller, such as a central electronic control unit, may receive the output from the circuit rather than directly from the sensing element. The controller may receive output from multiple circuits. In some embodiments, a sensing element may include not only a PIN diode, but some other component that may form an in-sensing element circuit. Then, output of a sensing element may be directly connected to a controller. A controller may be configured to receive the output of sensing elements through respective circuits coupled to each of the sensing elements.

A sensing element may output a signal on the basis of time. The circuit may include functional blocks that may process the signal from the sensing element to yield a detection signal. FIG. 20A is a graph that may represent detection signal (intensity) in arbitrary units on the ordinate axis plotted against time on the abscissa axis. A detector may be configured to have a speed such that individual charged particle arrival events at each sensing element may be distinguished. For example, as shown in FIG. 20A, an abrupt increase in signal may correspond to a charged particle arrival event. A charged particle arrival event may have a corresponding energy level, such as E1, E2, E3, E4, etc.

FIG. 20A shows a plurality of frames, F1, F2, and F3 at a constant data frame rate. Frames F1, F2, and F3 may be data frames. The data frames may refer to a group of data acquired by a detection system within a specified period of time. A frame may include one or more sampling periods of a sensing element. The frame rate may be that of a controller that performs processing, such as making charged particle counting determinations, determining the first group, determining the second group, processing data for image processing, etc., within each frame. The frame rate may relate to a system clock rate, for example. The frame rate may be set according to the first parameter and the second parameter, as discussed above. The first parameter or the second parameter may be based on predetermined criteria, and may include or cover a first predetermined frame criteria or a second predetermined frame criteria, as will be discussed below.

Figure 20B:
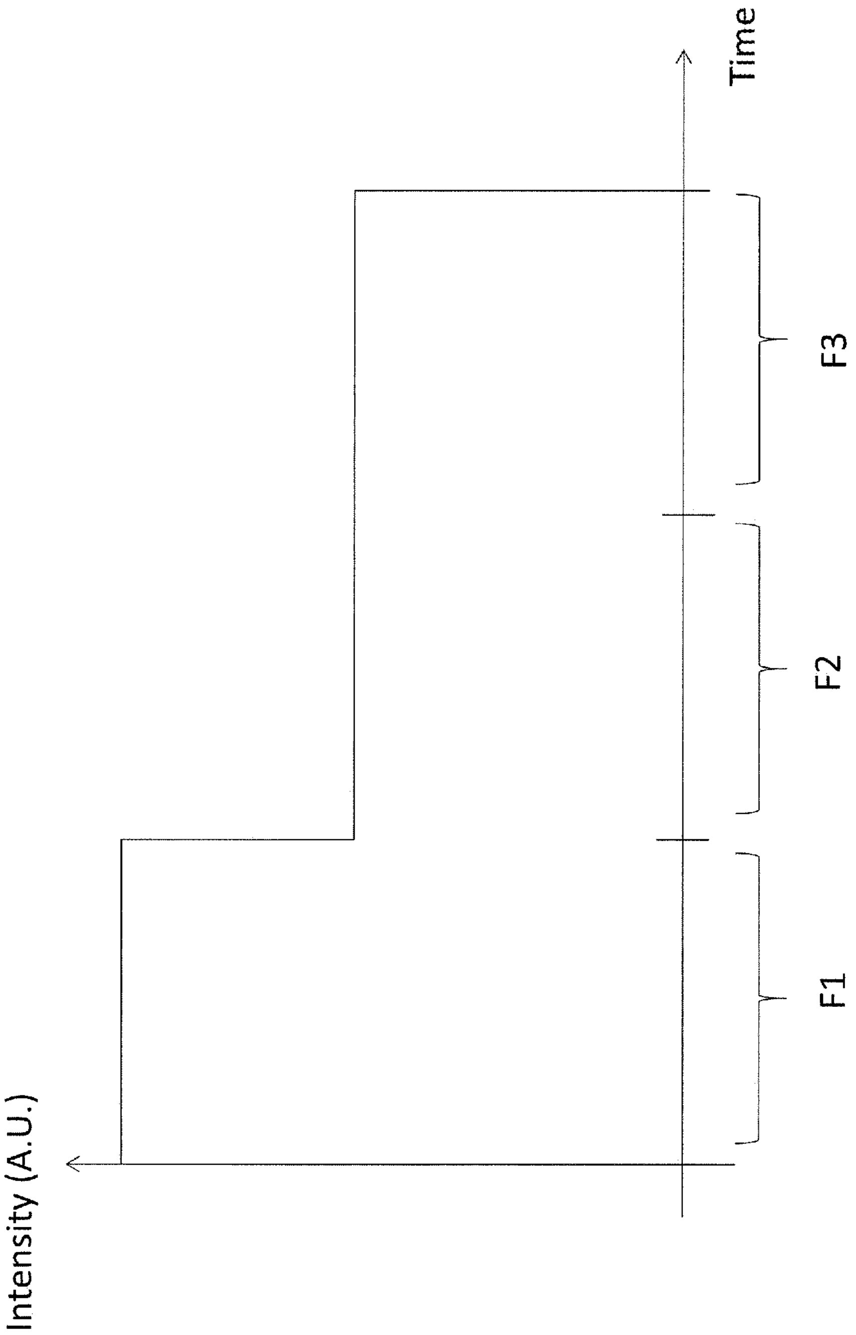

FIG. 20B shows another representation of a graphical display of an exemplary output signal of a sensing element. Differing from FIG. 20A, an output signal of a sensing element may be represented as being constant for a whole frame. Thus, for one frame, a sensing element may be considered to have one value in some embodiments. When multiple charged particle arrival events occur during one frame, signal intensity may be higher than that when only one charged particle arrival event occurs.

Figure 20C:
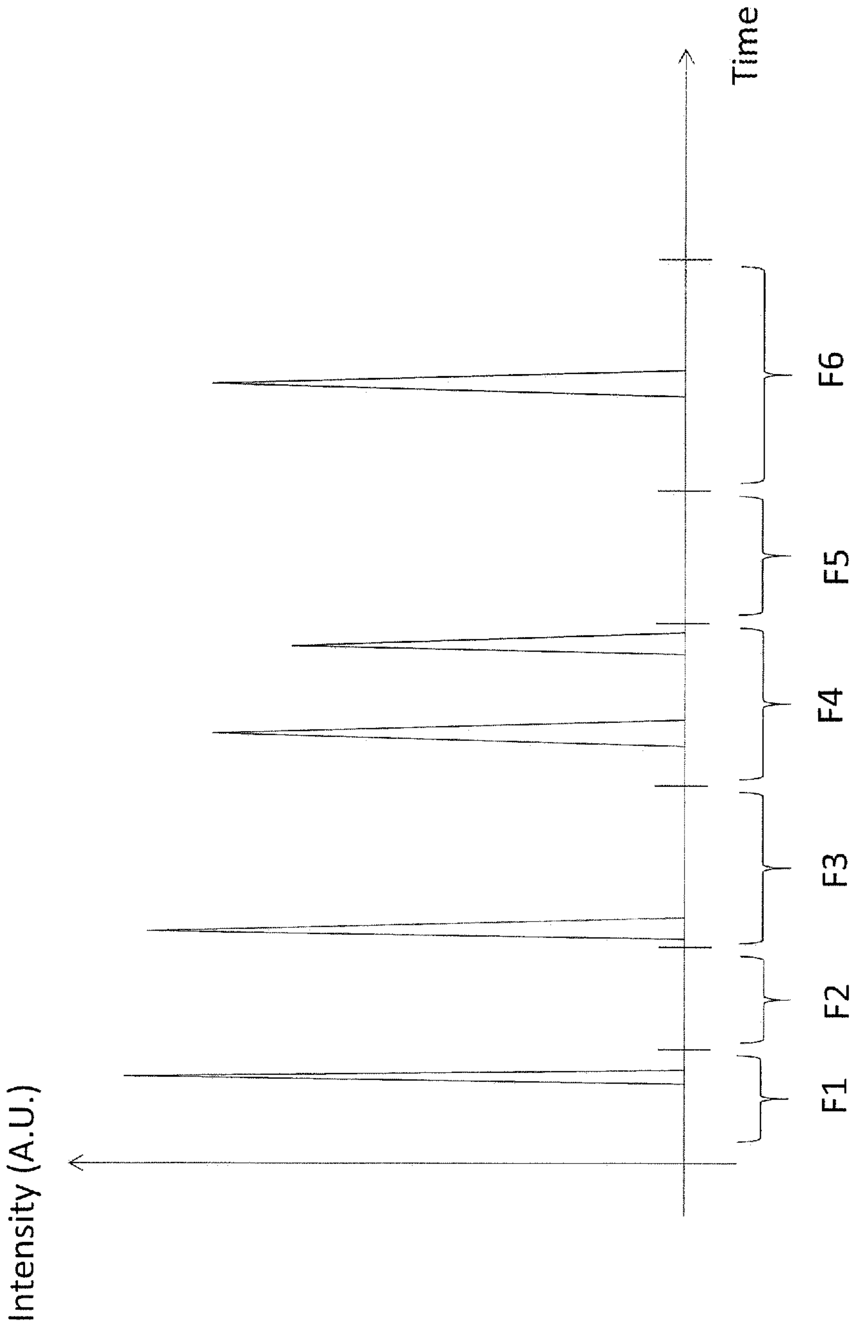

Frame rate may be variable. Period of a frame may vary with time. For example, FIG. 20C shows another graph that may represent output signal of a sensing element and circuit. In FIG. 20C, there are a plurality of frames, F1, F2, F3, F4, and so on. The frames may have a different period compared to one another. The period of a frame may be set to adapt to the signal intensity of the charged particle beam being detected. In some embodiments, adaptation may occur in a subsequent frame. For example, a first frame may be determined and then a second frame may be adjusted based on information from the first frame. In some embodiments, adaptation may occur within the same frame. For example, a first frame may be determined and the first frame may be adjusted concurrently. In some embodiments, real-time adjustment of frames may be used, which may help to reduce error rate in detection output signal.

A period may be set so that one charged particle is counted in one period. A period may be initially set based on a time period for collecting a charged particle. The period may also be initialized in other ways. Thereafter, a period of a next frame may be the same or different. In some embodiments, an iterative method may be used. For example, in FIG. 20C, a first frame F1 may be set with a certain period based on the time period for collecting a charged particle. The same period may be used for the next frame, F2. If no charged particles are detected in the frame F2, the frame period may be incremented to a longer period in the next frame. In frame F3, a charged particle is detected. Thereafter, in frame F4, the same period is used, and two charged particles may be detected. Because more than one charged particle is detected, the frame period may be decremented to a shorter period in the next frame. In frame F5, no charged particles are detected and thus, in frame F6, a longer period is used.

Figure 21A:
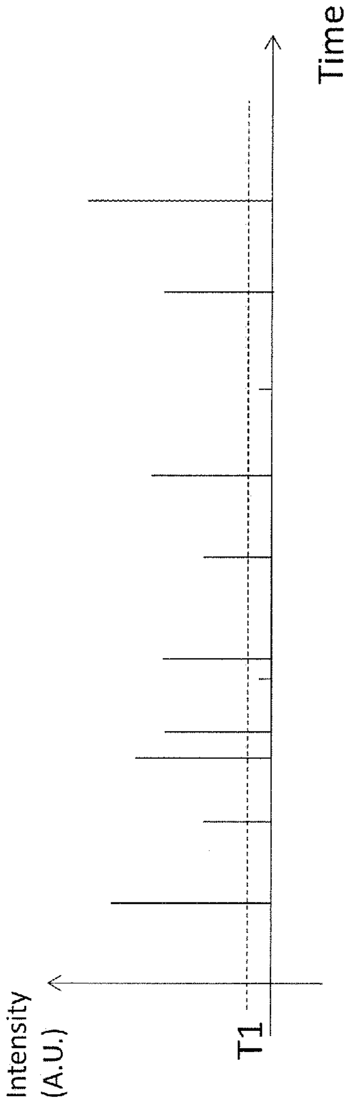
FIG. 21A, FIG. 21B, and FIG. 21C are graphs illustrating exemplary representations of output signals from sensing elements with respect to thresholds, consistent with embodiments of the present disclosure.

Reference is now made to FIG. 21A, which shows a representation of output signals of a sensing element that may be coupled to a circuit with respect to a first threshold T1. The first threshold T1 may be set so as to filter out noise. For example, the first threshold T1 may be set to a value greater than 0 and less than or equal to a value corresponding to a predetermined energy amount of a charged particle arrival event. The first threshold T1 may be used to determine that an output signal is a detection signal, rather than noise such as that caused by interference, dark current, or the like.

Figure 21B:
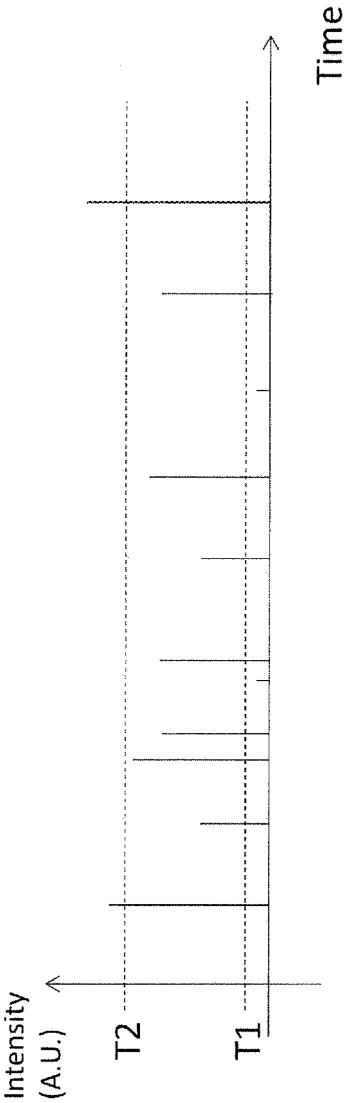

Reference is now made to FIG. 21B, which shows a representation of output signals of a sensing element that may be coupled to a circuit with respect to a first threshold T1 and a second threshold T2. The first threshold T1 may be set similar to the above so as to filter out noise. The second threshold T2 may be set so as to distinguish between different types of charged particles having different energy characteristics. For example, the second threshold T2 may be set so as to distinguish secondary electrons from scattered electrons. The value of the second threshold T2 may be determined in advance. When the ordinate axis of the graph of FIG. 21B is in terms of electron volts, the second threshold T2 may be set to, for example, a value of acceleration energy imparted by the SEM system (e.g., $E_{acc}$) plus 50 eV. Thus, electrons that have energies less than or equal to second threshold T2 may be determined to be secondary electrons, and electrons that have energies above second threshold T2 may be determined to be scattered electrons and counted accordingly.

Figure 21C:
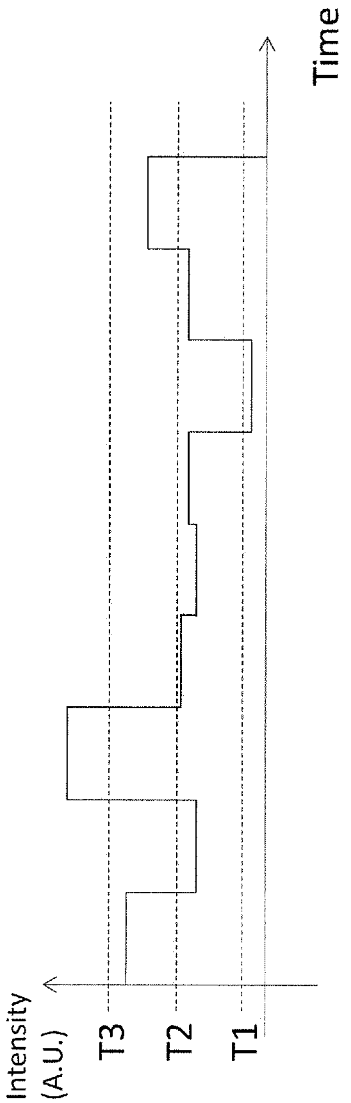

Reference is now made to FIG. 21C, which shows a representation of output signals of a sensing element that may be coupled to a circuit with respect to a first threshold T1, a second threshold T2, and a third threshold T3. In the representation of FIG. 21C, output detection signals may take one value per frame. The first threshold T1 may be set similar to the above so as to filter out noise. The second threshold T2 may be set so as to distinguish between different types of charged particles. The third threshold T3 may be set so as to determine whether a sensing element receives more than one charged particle. The value of the third threshold T3 may be twice that of the second threshold T2.

Figure 22:
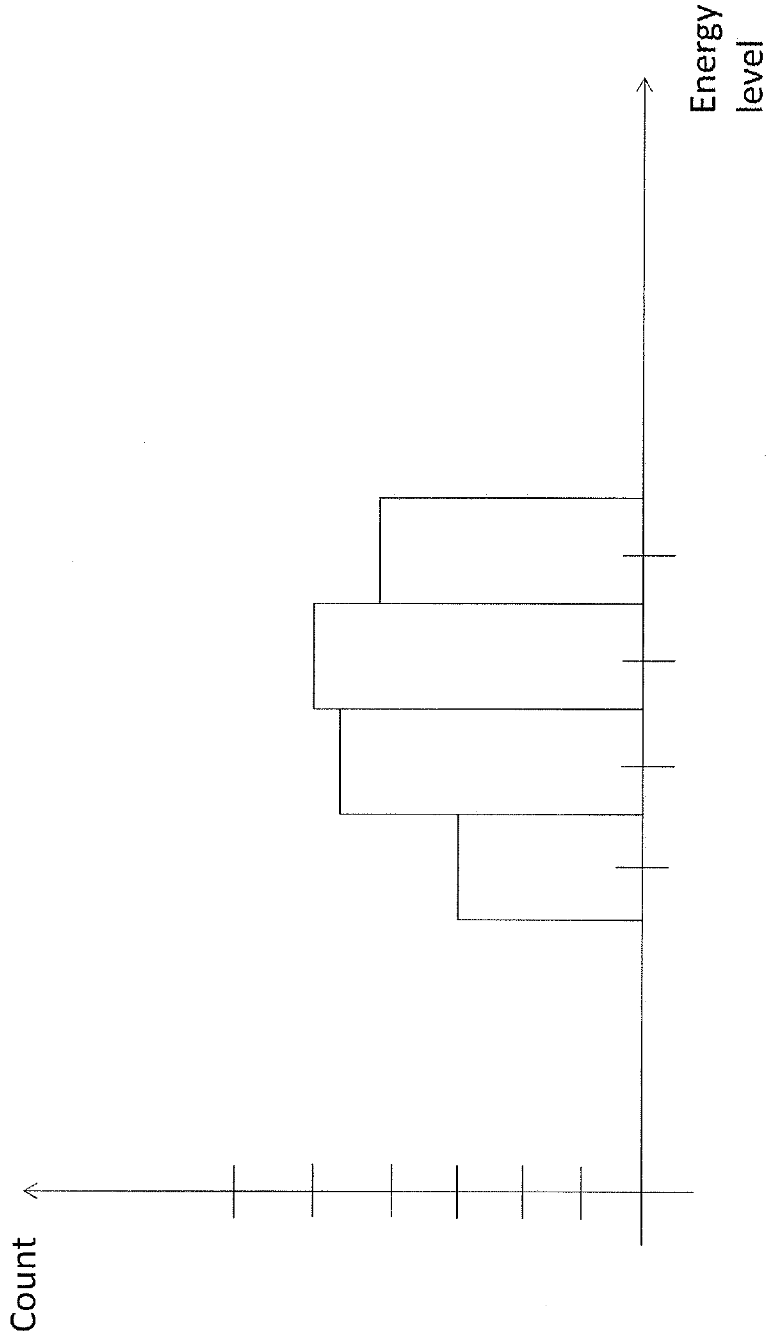
FIG. 22 is a graph illustrating an energy spectrum, consistent with embodiments of the present disclosure.

Reference is now made to FIG. 22, which shows an exemplary representation of statistical results of a frame. In some embodiments, the controller of a detection system may be configured to perform statistical analysis at each frame. For example, the sensing elements of the detector may output to the controller. The sensing elements may be connected to a circuit. The controller may be configured to receive the output from each sensing element and organize each sensing element's output on a frame-by-frame basis. After one frame, the controller may collect outputs from multiple sensing elements associated with a beam spot. For example, the controller may collect outputs from the sensing elements of the first group that may be contained within boundary line 350, as discussed above with reference to FIG. 3F. The controller may perform statistical analysis based on information of each sensing element's output at that frame. As an example, FIG. 22 shows, for one frame, charged particle count on the ordinate axis and energy level on the abscissa axis. The energy levels may correspond to all of the different energy levels of charged particles received by the first group of sensing elements in the one frame. For example, the energy levels may correspond to energy levels E1, E2, E3, E4 discussed above with respect to FIG. 20A. While FIG. 22 illustrates four such energy levels, it will be appreciated that different numbers of separate energy levels may be provided and analyzed. The count of charged particles may correspond to all of the charged particles detected by the first group of sensing elements in the one frame.

Other types of statistics may be determined. For example, the following may be determined: number of charged particles at a particular energy level as a proportion of all charged particles received; number of charged particles received in one sensing element as a proportion of total charged particles received in the first group; and so on.

While FIG. 22 shows exemplary statistical results as a histogram, various forms of representation may be used. For example, the statistical analysis may provide a scatterplot.

In some embodiments, the controller may be configured to perform statistical analysis on a pixel-by-pixel basis. The controller may be configured to receive the output of each sensing element and organize each sensing element's output corresponding to pixels in a SEM image. For example, as a charged particle beam scans across a sample, sensing element output corresponding to different pixels may be generated. Each pixel in a SEM image may be generated using the frames acquired during its allotted period of time during the scanning operation. For example, during the period associated with a pixel, one or more frames of data may be acquired. Thus, information corresponding to a pixel may be included in one or more frames. As used herein, the term "pixel" may refer to a unit region on a sample surface that is imaged. Thus, a SEM image may include a map of pixels, each of the pixels corresponding to a location on the sample surface. The greater the imaging resolution (or, e.g., the greater the field of view on the sample surface), the larger the number of pixels.

Figure 23:
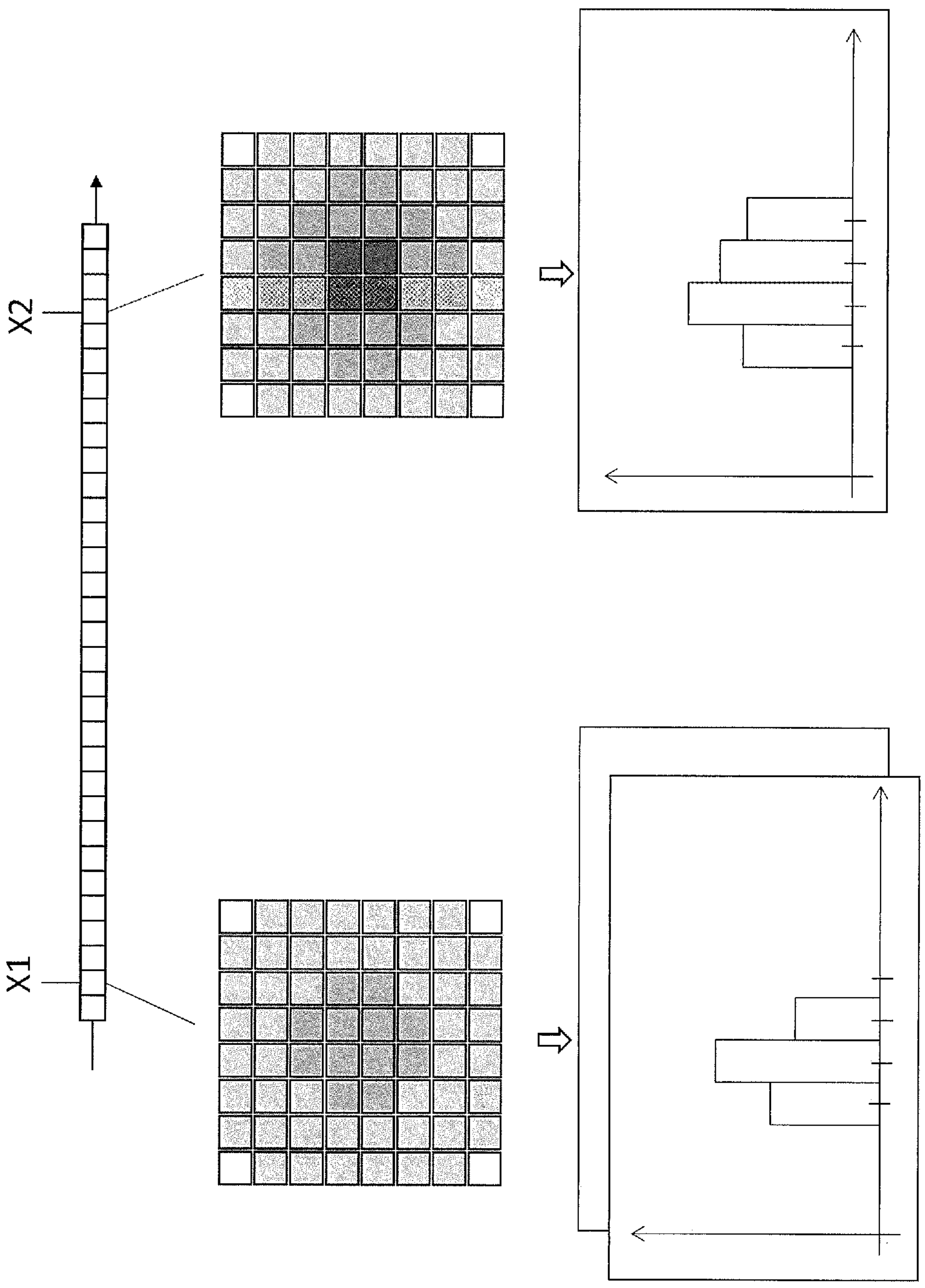
FIG. 23 is a diagram illustrating a plurality of pixels and corresponding sensing element detection signal output, consistent with embodiments of the present disclosure.

FIG. 23 shows a representation of a plurality of pixels on a line. The pixels may be organized according to a scanning pattern, such as a raster scan of an area of interest on a sample surface. Each pixel may be associated with data of sensing element output at a certain time. Each pixel may be associated with data of one or more sensing elements. As discussed above, one pixel may comprise data of one or more frames of data relating to sensing element output.

For a plurality of pixels to be used in a SEM image, statistical analysis may be performed based on information associated with pixels on a pixel-by-pixel basis. For example, the controller may be configured to receive the output of sensing elements through respective circuits coupled to each of the sensing elements. For one pixel, the controller may collect outputs from sensing elements that are associated with a beam spot and within the time period associated with the pixel. For example, a time stamp of a pixel may correspond with a time at which the primary electron beam of a charged particle beam imaging tool scans across a location on the sample surface. The controller may collect outputs from the sensing elements of the first group that may be contained within a boundary line, for example as discussed above with reference to FIG. 3F. The controller may perform statistical analysis based on information of each sensing element's output in one or more frames associated with a pixel. As an example, FIG. 23 shows, on the left, sensing element output associated with one pixel X1. The sensing element output may be represented with information such as charged particle count plotted against energy level based on statistical analysis. The information of charged particle count plotted against energy level may be based on information for a plurality of frames. For example, in FIG. 23, there are two frames of information associated with pixel X1. At a different time point in the scan, sensing element output associated with another pixel may be provided. For example, FIG. 23 shows, on the right, sensing element output associated with another pixel X2. For pixel X2, there may be only one frame of information associated with the pixel.

In the representations of information including charged particle count plotted against energy level, scale may be determined based on data of all of the plurality of pixels gathered in a scan. Energy levels of the abscissa axes may include all of the energy levels of the charged particles collected in the scan. Scale of each pixel in an image may be held constant. For example, scale may be determined so that gray level distortion may be avoided. Furthermore, under the same settings of a charged particle inspection tool, all images acquired may be set to have the same scale. Accordingly, gray level distortion may be avoided between images.

In accordance with some embodiments of the present disclosure, information indicative of an energy spectrum of incident charged particles may be generated. This information may be used in generating a pixel of an image in charged particle beam imaging, such as a SEM image.

For example, overall numerical output may be used in generating one pixel in a SEM image, such as a grayscale image (of the type that may be used in a conventional SEM). That is, the total count of incident charged particles may correspond to the gray level of the pixel. The total count of charged particles may correspond to intensity. In addition, color information may be added. For example, colored light is the portion of the electromagnetic spectrum that is visible to the human eye and that corresponds to wavelengths of approximately 390 to 700 nm, or photon energies of approximately 1.63 to 3.26 eV. In a similar way that visible colors, such as red, orange, yellow, green, blue, and violet, correspond to certain energy levels, color values may be assigned to pixels in a SEM image. For example, RGB values of each pixel in a SEM image may be determined based on the statistical analysis of sensing element output analyzed on a pixel-by-pixel basis. The RGB values may be based on numbers of charged particles received at particular energy levels.

In some embodiments, spectrum of radiation received from a sample may be represented by counts of incident charged particles at discrete bands of energy intervals.

Intervals of the energy levels may be determined in advance or on the basis of statistical analysis, for example. In some embodiments, the intervals may be based on thresholds including, for example, thresholds T1, T2, and T3.

In some embodiments, statistical analysis of sensing element output may include providing an approximation of radiation spectrum by a function, such as F(x), where x is energy level. Color specifications may be directly transformed from the function into color information, such as RBG values of a color gamut.

While an RGB color model has been discussed above, in some embodiments, other representations of color may be used, such as HSL (hue, saturation, lightness) or HSV (hue, saturation, value).

In some embodiments, an additional degree of freedom in information gathering and displaying may be obtained. Color may be added to a SEM image to represent additional properties, such as material property or micro structure, among others.

Examples of a controller consistent with the above description include controller 109 of FIG. 1. Controller 109 may be part of an image processing system 199 that also includes an image acquirer 120 and a storage 130 (see FIG. 2B). In some embodiments, controller 109 may be a stand-alone control unit that may perform the functions of image acquisition.

Figure 24:
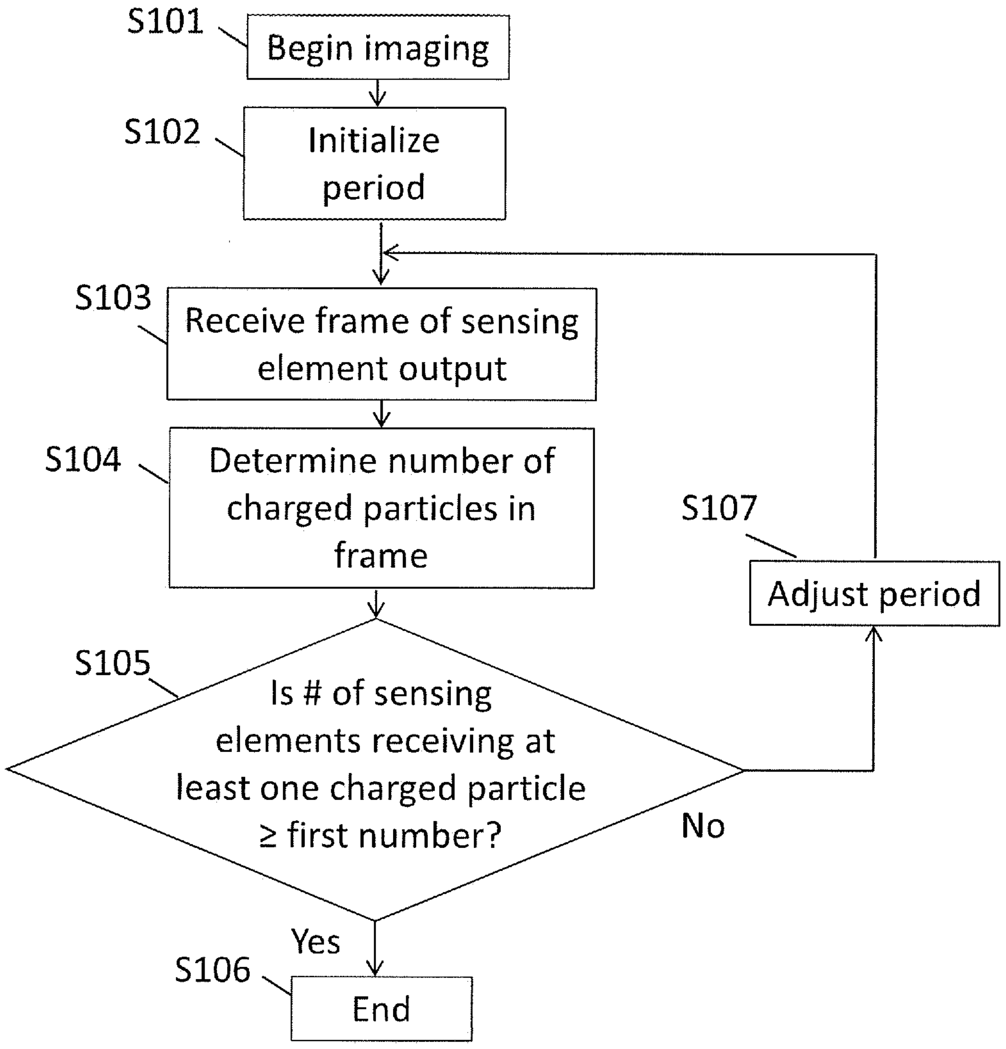
FIG. 24 is a flowchart representing an exemplary method, consistent with embodiments of the present disclosure.

Reference is now made to FIG. 24, which illustrates a flowchart of an exemplary period determination method. A controller (e.g., controller 109 of FIG. 1) may be programmed to implement one or more blocks of the flowchart of FIG. 24. In a step S101, charged particle imaging may be started. In a step S102, a period of processing is set to an initial value. The processing may comprise one or more of: making charged particle counting determinations, determining a first group of sensing elements, determining a second group of sensing elements, and performing image processing, etc.

In a step S103, the controller may receive a frame of data relating to sensing element output. The frame may comprise outputs from a plurality of sensing elements of a detector that may be connected to a circuit on a per-sensing element basis. Thus, the controller may receive a plurality of detection signals each corresponding to the output of an individual sensing element in one frame.

In a step S104, a number of charged particles incident on the detector within the frame may be determined. Step S104 may comprise determining numbers of charged particles incident on each sensing element of the plurality of sensing elements of the detector within the frame. The number of charged particles may be a whole number.

In a step S105, it may be determined whether a number of sensing elements receiving at least one charged particle is greater than or equal to a first number. The first number may be based on a first predetermined frame criteria. For example, the first number may be a number of sensing elements that correspond to the standard size of an electron beam spot based on parameters of a charged particle beam tool, such as apparatus 100 of FIG. 1. The determination of step S105 of FIG. 24 may also be in the form of a proportion. For example, step S105 may comprise determining whether at least A % of sensing elements receive at least one charged particle.

When a negative determination is made in step S105, the process may proceed to a step S107. In step S107, the period may be adjusted. For example, the period may be made longer so that more of the sensing elements can receive at least one charged particle in one frame. The period may be incremented by a predetermined amount. Thereafter, the process may return to step S103.

On the other hand, when an affirmative determination is made in step S105, the process may proceed to step S106. At step S106, the process may end. In some embodiments, another process may follow.

A method may include elements of the flowchart of FIG. 24 with or without various modifications. For example, concurrent with step S104, a boundary line may be determined that may be provided so as to encompass and group sensing elements that receive at least one charged particle. The sensing elements receiving at least one charged particle may be associated with the same charged particle beam spot. For example, the sensing elements associated with the same beam spot may be adjacent to one another.

In some embodiments, the determination made in step S105 may occur once per frame. In some embodiments, the determination may occur once for a plurality of frames. For example, rather than determining whether to adjust the period of a frame after every frame, a determination of step S105 may occur after a predetermined number of frames. Thus, frames may have the same period for the predetermined number of frames, after which a determination may be made to adjust the period.

Figure 25:
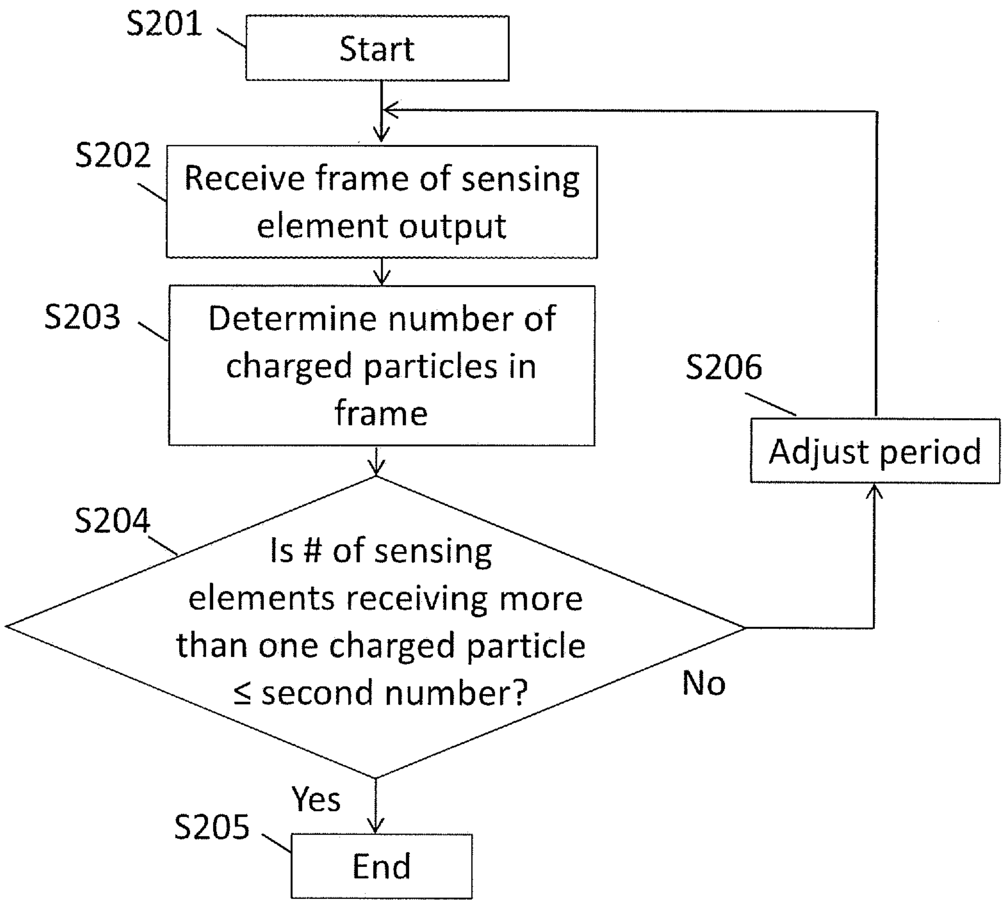
FIG. 25 is a flowchart representing an exemplary method, consistent with embodiments of the present disclosure.

Reference is now made to FIG. 25, which illustrates a flowchart of an exemplary period determination method. A controller (e.g., controller 109 of FIG. 1) may be programmed to implement one or more blocks of the flowchart of FIG. 25. The process of FIG. 25 may begin at a step S201. The process may follow directly from step S106 of FIG. 24.

In a step S202, the controller may receive a frame of sensing element output. The frame may comprise outputs from a plurality of sensing elements of a detector. Thus, the controller may receive a plurality of detection signals each corresponding to the output of an individual sensing element in one frame.

In a step S203, a number of charged particles incident on the detector within the frame may be determined. Step S203 may comprise determining numbers of charged particles incident on each sensing element of the plurality of sensing elements of the detector within the frame.

In a step S204, it may be determined whether a number of sensing elements receiving more than one charged particle is less than or equal to a second number. The number may be in the form of a proportion. For example, step S204 may comprise determining whether no more than B % of sensing elements receive more than one charged particle. The second number may be based on a second predetermined frame criteria. For example, the second number may be based on a predetermined requirement for measurement linearity. In some embodiments, the second number may be based on the linearity of the output image signal corresponding to the incident charged particle count. For example, sensing element output may exhibit nonlinear behavior when an incoming charged particle beam is so intense as to overwhelm charged particle counting capabilities. A sensing element may exhibit nonlinear output behavior when more than one charged particle is incident on the sensing element within one frame. The predetermined criteria may be based on a desired level of measurement linearity so that the number of sensing elements receiving more than one charged particle is limited.

When a negative determination is made in step S204, the process may proceed to a step S206. In step S206, the period may be adjusted. For example, the period may be made shorter so that less of the sensing elements will receive more than one charged particle in one frame. The period may be decremented by a predetermined amount. Thereafter, the process may return to step S202.

On the other hand, when an affirmative determination is made in step S204, the process may proceed to step S205. At step S205, the process may end. In some embodiments, other processing may follow.

A method may include elements of the flowchart of FIG. 25 with or without various modifications. For example, concurrent with step S203, a boundary line may be determined that may be provided so as to encompass and group sensing elements that receive more than one charged particle. The sensing elements receiving more than one charged particle may be associated with a region of high intensity of a charged particle beam spot.

It will be appreciated that both the processes of FIG. 24 and FIG. 25 may be incorporated into one control routine. For example, the flow of the process of FIG. 24 may be modified so that blocks S204 and S206 of FIG. 25 may operate in parallel with blocks S105 and S107.

Figure 26:
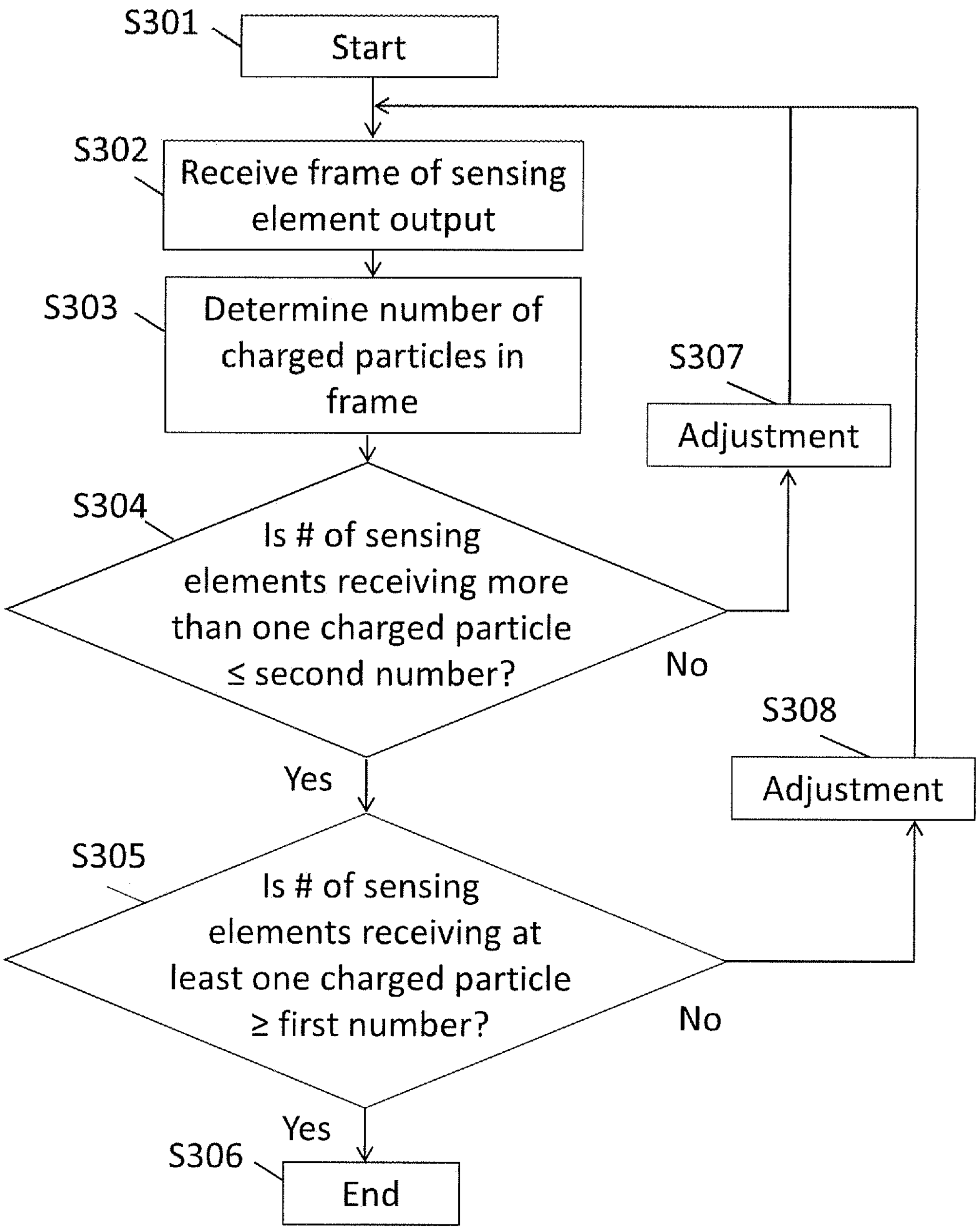
FIG. 26 is a flowchart representing an exemplary method, consistent with embodiments of the present disclosure.

Furthermore, a control routine may comprise additional processing such as determining to adjust settings or structures of a charged particle beam apparatus based on determinations related to the first or second predetermined criteria. Reference is now made to FIG. 26, which illustrates a flowchart of an exemplary determination method. The process of FIG. 26 may begin at a step S301.

In a step S302, a controller (e.g., controller 109 of FIG. 1) may receive a frame of data relating to sensing element output. The frame may comprise outputs from a plurality of sensing elements of a detector that may be connected to a circuit on a per-sensing element basis. Thus, the controller may receive a plurality of detection signals each corresponding to the output of an individual sensing element in one frame.

In a step S303, a number of charged particles incident on the detector within the frame may be determined. Step S303 may comprise determining numbers of charged particles incident on each sensing element of the plurality of sensing elements of the detector within the frame.

In a step S304, the controller may determine whether a first criteria has been satisfied. For example, it may be determined whether a number of sensing elements receiving more than one charged particle is less than or equal to a first number. Step S304 may comprise determining whether no more than B % of sensing elements receive more than one charged particle.

When an affirmative determination is made in step S304, the process may proceed to a step S305. In step S305, the controller may determine whether a second criteria is satisfied. For example, it may be determined whether a number of sensing elements receiving at least one charged particle is greater than or equal to a second number. Step S305 may comprise determining whether at least A % of sensing elements receive at least one charged particle.

When a negative determination is made in step S304, the process may proceed to a step S307. A negative determination in step S304 may mean that the first and second criteria should be adjusted. For example, a negative determination in step S304 may mean that the number B % may be set too low or the number A % may be set too high. It may also mean that charged particle distribution within a beam spot is not even enough. In step S307, an adjustment may be made. The adjustment may be made so that charged particle distribution within the beam spot may become more even. The adjustment may comprise defocusing a projection system in the charged particle beam apparatus. For example, the projection system may be configured to defocus the beam to a certain extent. Furthermore, the magnification of the charged particle beam apparatus may be changed to enlarge the beam spot. Further adjustments may also be made. For example, the frame period may be made shorter. Thereafter, the process may return to step S302.

In step S305, when a negative determination is made, the process may proceed to a step S308. In step S308, the numbers A % and B % may be adjusted. Further adjustments may also be made. For example, the frame period may be made longer. Thereafter, the process may return to step S302.

When an affirmative determination is made in step S305, the process may proceed to step S306. At step S306, the process may end.

Frame adaptation may occur after a current frame period has concluded. For example, an adjustment may be made in a subsequent frame in response to a situation in which sensor output is determined not to meet criteria for a current frame. A subsequent frame may be shortened or lengthened, for example as in the examples discussed above. However, in some embodiments, frame adaptation may occur in real time. A determination may be made for a current frame period. A determination may be made to cut a current frame short, or to lengthen the frame. The determination may be made when, for example, sensor output cannot meet criteria due to the period of the current frame.

Figure 27:
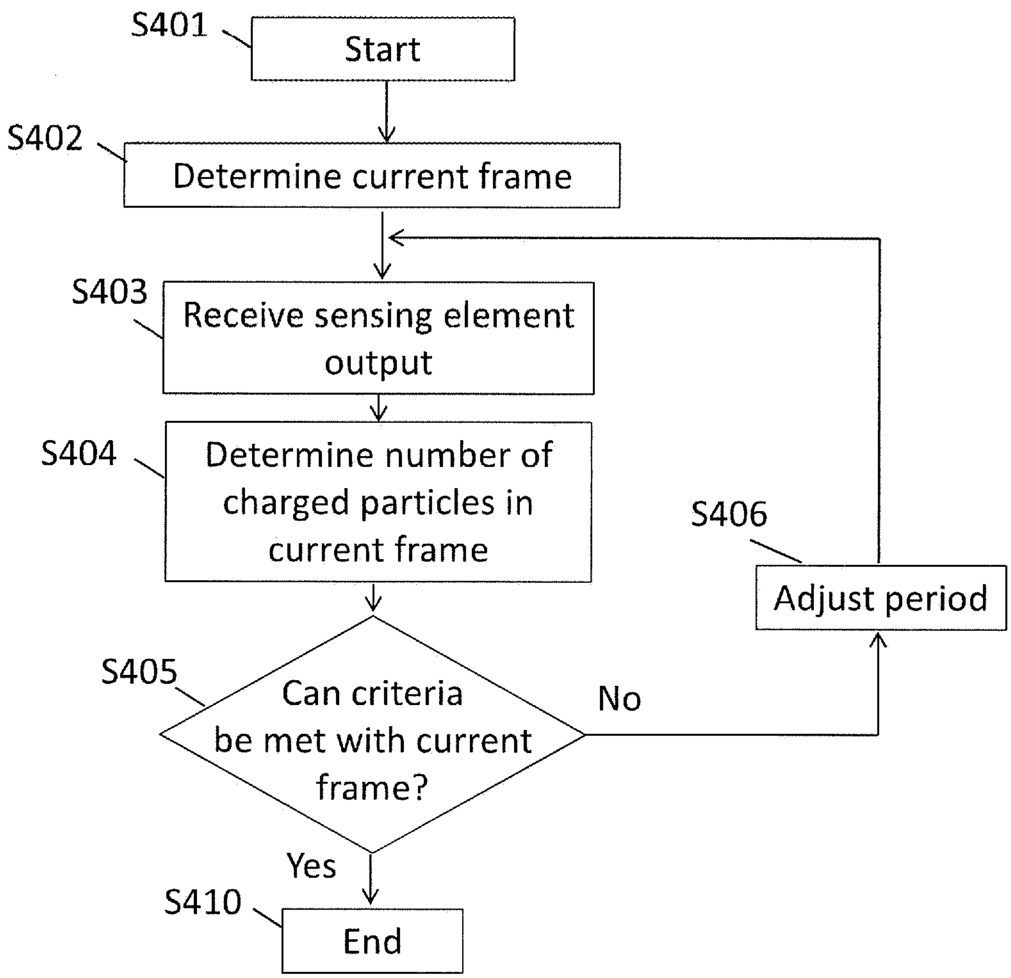
FIG. 27 is a flowchart representing an exemplary method, consistent with embodiments of the present disclosure.

Reference is now made to FIG. 27, which illustrates a flowchart of an exemplary period determination method. A controller (e.g., controller 109 of FIG. 1) may be programmed to implement one or more blocks of the flowchart of FIG. 27. In a step S401, the process may begin. Step S401 may follow processing such as that of FIG. 24, FIG. 25, or FIG. 26. From step S401, charged particle imaging may be started or may have been ongoing. A period of a frame may be set to a value such as from a prior frame processing or having been initialized at a predetermined initial value.

The processing of FIG. 24 or FIG. 25 may result in an adjustment that may be applied to the next data frame after the current one. In such processing, the current frame may end after data is received by a controller, even if there is an adjustment. In the processing of FIG. 27, however, after receiving data, the current frame may not necessarily end. If, for example, criteria has not been met, an adjustment for the current frame may be made, and then updated data that reflects the adjustment may be transmitted to the controller. When data transmitted to the controller meets the criteria, then the current frame may end.

Continuing in the process of FIG. 27, in a step S402, the controller may determine properties of the current frame. Properties of the current frame may include the frame period. Step S402 may include reading a value from a storage. Step S402 may also include determining properties related to the current frame, such as imaging conditions of a SEM system operating during the current frame.

In a step S403, the controller may receive a frame of data relating to sensing element output. The frame may comprise outputs from a plurality of sensing elements of a detector that may be connected to a circuit on a per-sensing element basis. Thus, the controller may receive a plurality of detection signals each corresponding to the output of an individual sensing element in one frame.

In a step S404, a number of charged particles incident on the detector within the frame may be determined. Step S404 may comprise determining numbers of charged particles incident on each sensing element of the plurality of sensing elements of the detector within the frame.

In a step S405, it may be determined whether criteria can be met based on received output signal, the properties of the current frame, or other properties previously determined. The criteria may include the first predetermined frame criteria or the second predetermined frame criteria, as discussed above with respect to FIG. 24 and FIG. 25. For example, step S405 may include determining whether at least A % of sensing elements receive at least one charged particle, or whether no more than B % of sensing elements receive more than one charged particle. In step S405 of FIG. 27, it may be determined that, based on the current frame properties, output from sensing elements of the array will not satisfy the criteria. For example, it may be determined that the current frame has a period so short that there will not be a number of sensing elements receiving at least one charged particle greater than the first number within the current frame. It may be determined that the current frame period is too short based on the average number of electron arrival events determined for a particular level of beam current. It may be determined that under the current imaging conditions using, e.g., a 4 nA electron beam, it will not be possible that more than the first number of sensing elements receive more than one electron because electron arrival events will be too sparse. Step S405 may include determinations that are based on a level of confidence. In some embodiments, a determination in step S405 may be based on information collected in steps S402, S403, or S404. Step S405 may include determinations based on both the first predetermined frame criteria (e.g., at least A % of sensing elements receive at least one charged particle) and the second predetermined frame criteria (e.g., no more than B % of sensing elements receive more than one charged particle). Determinations may be made in parallel or in separate process flows. For example, it may be determined together in one step whether the first and the second predetermined frame criteria can be met, or it may be determined separately whether the first predetermined frame criteria can be met and then whether the second predetermined frame criteria can be met, or vice versa.

When a negative determination is made in step S405, the process may proceed to a step S406. In step S406, the period of the current frame may be adjusted, or other adjustments to the frame may be made. For example, the period may be made longer so that more of the sensing elements may receive at least one charged particle in one frame. The amount of adjustment made may be proportional to an amount of shortfall that may be anticipated, for example as a result of a determination made in step S405. After adjusting the current frame, the process may return to step S403.

When a positive determination is made in step S405, the process may proceed to step S410 without adjusting the period, and the process may end. In some embodiments, other processing may follow. For example, the process may end with respect to the current frame and may repeat for a new frame.

A method may include elements of the flowchart of FIG. 27 with or without various modifications, for example, those discussed above with respect to FIG. 24, FIG. 25, and FIG. 26. Furthermore, while the example above discusses a shortening of the current frame period, there may also be a lengthening of the current frame period. In some embodiments, there may also be a step of determining whether a number of sensing elements receiving more than one charged particle is less than or equal to a second number, similar to step S204 discussed above with respect to FIG. 25 or step S305 discussed above with respect to FIG. 26. In some embodiments, steps S403 through S406 may occur iteratively.

In some detectors, a detection process may include two steps with a fixed sequence. The two steps may be used in determining the intensity of a secondary electron beam landing on a detector. Such steps may be used together with or in place of a period determination process such as those discussed above. There may be, for example, a first step of identifying a boundary of a beam spot on a detector surface. And there may be a second step of determining intensity of an electron beam based on grouped sensing elements corresponding to the beam spot. Information indicative of the sample surface may be derived from the determined beam intensity.

If an electron beam is incident on a detector in a fixed pattern of projection, the above-mentioned two steps in fixed sequence may be useful in determining the beam intensity. However, complications may arise if there are variations or fluctuations of the projection pattern of the electron beam on the detector. For example, it may become difficult to determine the intensity of an electron beam when electrons of the electron beam are distributed over multiple non-adjacent sensing elements on a sensing element array of a detector. Such situations may arise when beam current is low, for example, and relatively low numbers of electrons are incident on an array of sensing elements over a large area. In situations where electron arrival rate is low, individual electron arrival events on sensing elements may be sparse and may be spread over a wide area. As discussed above, a geometric spread of landing positions of electrons in a secondary electron beam may be large due to electrons having different trajectories that may be dependent on, for example, initial kinetic energy and emission angles of the electrons.

Reference is now made to FIG. 28A, which illustrates a situation wherein a charged particle beam apparatus may scan a primary beam of charged particles over a sample surface in a raster pattern. The beam may scan continuously over the surface of the sample. The beam scan path may correspond to pixels $X_i$ that may be used to make up a scanned image, where i is an index. As shown in FIG. 28B, in an array of sensing elements 2100 of a detector, at a scanning time T of $T_1$, there may be a sensing element 2101 that receives an incident charged particle. The detector may be configured for charged particle counting, and thus, charged particle arrival rate at a particular instant may be relatively low. As the primary charged particle beam scans across the surface of a sample, secondary or scattered charged particles may be generated that are incident on a detector. The distribution of landing positions of the charged particles in a secondary charged particle beam may be relatively broad. Therefore, at time $T_1$, sensing element 2101 may receive an incident charged particle. However, in a next detection frame, for example at time $T_2$ as shown in FIG. 28C, charged particles may be incident on different regions of the array of sensing elements 2100. As shown in FIG. 28C, at scanning time T of $T_2$, there may be a sensing element 2102 and a sensing element 2103 that each receive an incident charged particle within a sampling period. Next, as shown in FIG. 28D, at scanning time T of $T_3$, there may be a sensing element 2104 that receives an incident charged particle within a next frame. Further, as shown in FIG. 28E, at scanning time T of $T_4$, there may be a sensing element 2105 and a sensing element 2106 that each receive an incident charged particle within a further frame. Although sensing elements 2101, 2102, 2103, 2104, 2105, and 2106 may not necessarily be adjacent to one another, they may all be associated with the same secondary charged particle beam, and thus, some may need to be grouped together to determine the intensity of the secondary beam incident on the detector.

In some detection systems, it may be difficult to associate sensing elements with one charged particle beam spot when charged particle arrival events occur across a broad region including multiple sensing elements. Furthermore, in some detection systems, there may be multiple beamlets of a primary charged particle beam that scan multiple locations on a sample simultaneously, and thus, there may be multiple beams of secondary charged particles incident on a detector. Therefore, further complications may arise in distinguishing secondary charged particle arrival events from different beams, which may require grouping sensing elements separately. Additionally, flexibility of a detector may be limited due to requirements of grouping sensing elements. If a projection pattern of secondary beams of charged particles is not constant on a detector surface, for example when an anti-deflection unit does not function properly, which may result in fast movements of the projection pattern on the detector surface, it may be difficult to track the beam. The need for including processing such as the grouping of sensing elements may impede the ability to catch up with movements of the projection pattern and may introduce detection error.

Some embodiments of the disclosure may provide a detection process in which sensing elements need not be grouped before charged particle counting. Rather, grouping may be performed after charged particles have been counted and data representing the status of a detector at a particular instant has been stored. In some embodiments, a time stamp may be associated with sensing element data. Sensing element data corresponding to a particular time stamp may be correlated with a scanning time to associate the sensing element data with a scanned position on the sample surface. For example, sensing element data including a particular time stamp may be associated with a pixel of a SEM image of the sample surface.

A detector including a plurality of sensing elements may be operated in a variety of counting modes. A circuit may be connected to the sensing element, and the circuit may be configured to perform signal and data processing. The circuit may be built into the sensing element. Counting methods may be based on signals that are output from the circuit connected to the sensing element. A plurality of circuits may be provided, wherein each of the circuits is connected to a respective one of the sensing elements of an array.

As an example of a counting mode, there may be a first mode, in which sensing elements may count up to only one incident charged particle before being reset without discriminating the incident charged particle energy. Resetting may involve resetting both the sensing element or its associated circuit. As used herein, the phrase “resetting a sensing element” may refer to resetting of the sensing element or its associated circuit. In a second mode, sensing elements may count numbers of incident charged particles before being reset without discriminating the incident charged particle energy until a counter is full. The numbers may include a predefined number. The predefined number may be one. Sensing elements may stop counting charged particles after the counter is full. If a further charged particle arrives after the counter is full but before the next reset, an overflow flag may be set. In a third mode, sensing elements may count charged particles according to predefined energy levels. Energy ranges may include, for example, zero to a first predefined energy level, the first predefined energy level to another predefined energy level (and so on), and above the highest predefined energy level. Only up to one charged particle may be counted within each range before a sensing element is reset. In a fourth mode, sensing elements may count charged particles according to predefined energy levels and may set an overflow flag for an energy range when more than a predetermined number of charged particles is received in that energy range. In some embodiments, the predetermined number for a corresponding energy range may be zero or one. The above modes and others will be described further as follows.

Figure 29A:
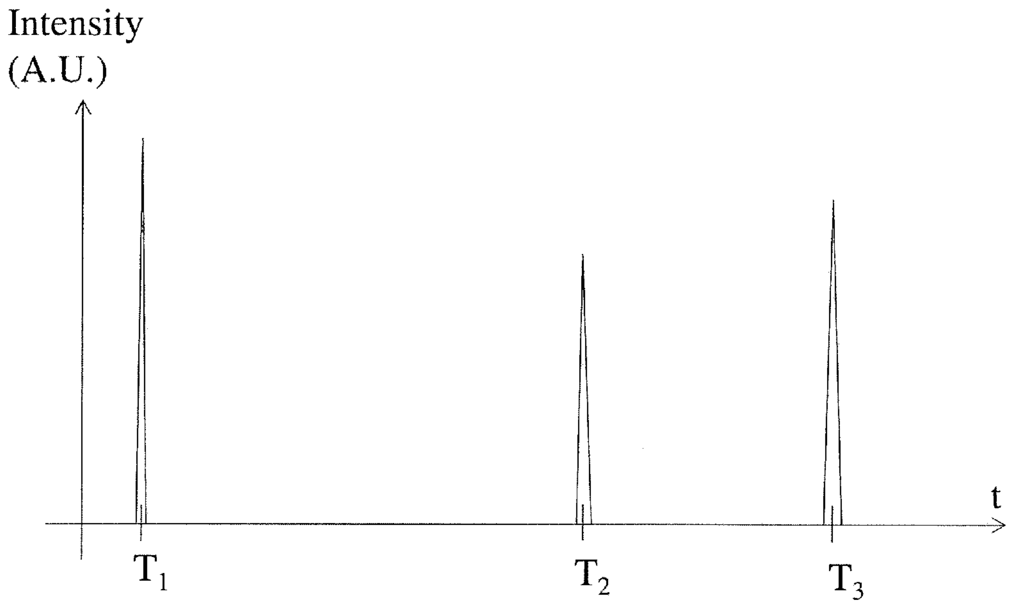
FIG. 29A and FIG. 29B illustrate a first mode of operating a detector, consistent with embodiments of the present disclosure.
Figure 29B:
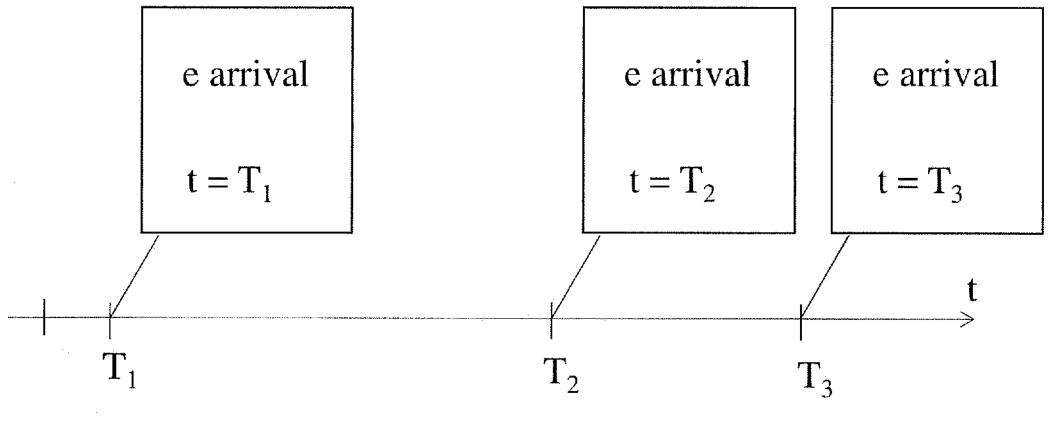

Reference is made to FIG. 29A and FIG. 29B, which illustrate a first counting mode for operating a detector or a detection system, consistent with embodiments of the disclosure. A sensing element may detect the energy of incident charged particles. A circuit connected to the sensing element may process an output of the sensing element. As shown in FIG. 29A, a sensing element and circuit may output a detection signal on the basis of time. FIG. 29A is a graph of detection signal intensity in arbitrary units on the ordinate axis plotted against time on the abscissa axis. Charged particle arrival events at a sensing element may occur at time points $T_1$, $T_2$, and $T_3$. A detector may have sensing elements and a circuit configured to detect charged particle arrival events. For example, a sensing element may be configured to generate a signal pulse in response to an incident charged particle arriving at the sensing element, which may be due to the generation of electron-hole pairs in the sensing element, and which may be fed to a circuit. The circuit may record a charged particle arrival event upon determining that a charged particle has arrived at the sensing element. FIG. 29B shows that at each of time points $T_1$, $T_2$, and $T_3$, a charged particle (such as an electron) arrival event may be recorded. Each of the events at time points $T_1$, $T_2$, and $T_3$, for example those shown in FIG. 29B, may correspond to a “count.” A count of a charged particle may include an indication that a charged particle arrival event has occurred at a sensing element. The count may indicate that a number of charged particles has arrived at a sensing element, the number being a whole number. Data associated with charged particle arrival events may include the time at which the charged particle arrival event was recorded. The time may be a system time. In some embodiments, the time may be based on global clock cycles of a detection system. In some embodiments, the time may be based on local time running at each individual sensing element. The time may be correlated with scanning time of the primary electron beam of an electron beam tool. The data associated with charged particle arrival events may also include an identifier indicating which sensing element among the array of sensing elements received the charged particle. Thus, a location on the detector surface may also be recorded.

In the first counting mode, in some embodiments, a detector may be configured to count up to only one charged particle arrival event in a sensing element before being reset. The detector may be configured to count the one charged particle arrival event without discriminating energy of the one charged particle arrival event. The detector may count a charged particle arrival event in response to detecting an amount of energy in a sensing element, for example. Resetting of the sensing element may occur at the end of a detection frame. Resetting may also include resetting a circuit connected to the sensing element.

In the first counting mode, in some embodiments, a miscount may occur if charged particle arrival events occur in quick succession. For example, a charged particle may arrive at a sensing element shortly after a preceding particle, before the sensing element or its associated circuit has reset, and thus the subsequent charged particle may not be counted. That is, the number of charged particles counted may be determined to be one, when two particles have actually arrived at the sensing element. Such a miscount may be addressed by using, for example, a second counting mode. It should be noted that in some embodiments, an array of sensing elements may be designed and sized so that the subsequent arrival time of adjacent charged particles for intended applications (e.g., a useable beam current range) is sufficiently long such that the probability of such a miscount may be low.

Figure 30A:
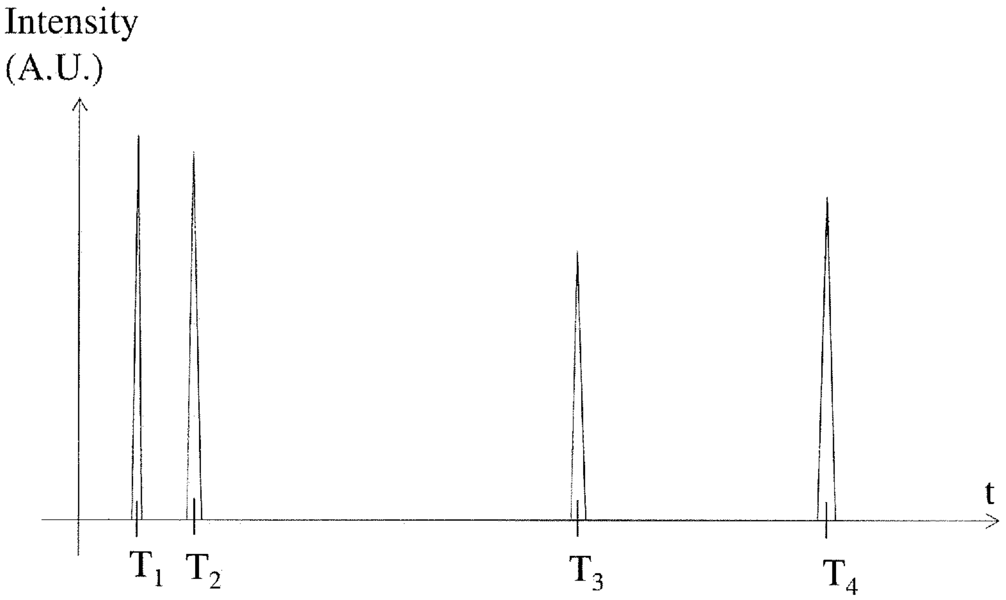
FIG. 30A and FIG. 30B illustrate a second mode of operating a detector, consistent with embodiments of the present disclosure.
Figure 30B:
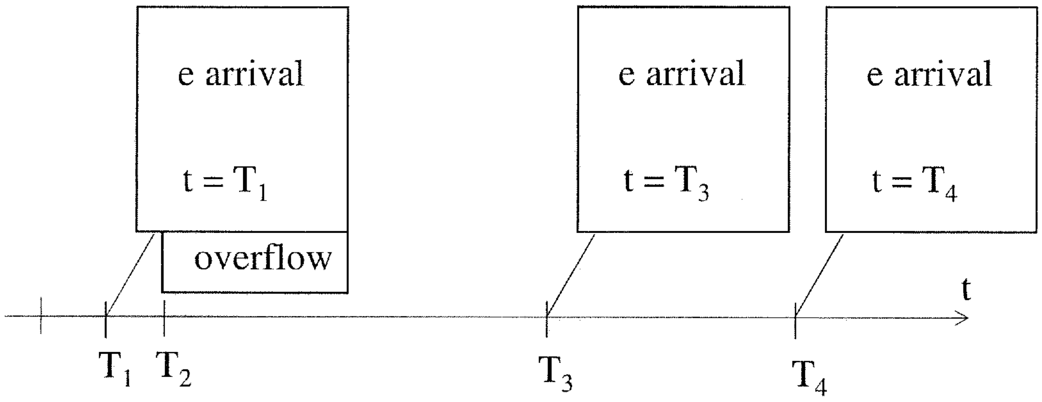

FIG. 30A and FIG. 30B illustrate a second counting mode for operating a detector or a detection system, consistent with embodiments of the disclosure. As shown in FIG. 30A, a sensing element and circuit may output a detection signal on the basis of time, and charged particle arrival events at the sensing element may occur at time points $T_1$, $T_2$, $T_3$, and $T_4$. At the time $T_2$, a charged particle may arrive before the sensing element or its associated circuit has reset. However, rather than ignoring the subsequent charged particle arrival event, a detector may set an overflow flag. The overflow flag may indicate that a further charged particle has arrived at the sensing element. The overflow flag may be triggered by the increase in signal generated at the sensing element and circuit due to the subsequent charged particle arrival event.

Overflow may include a first type of overflow. The first type of overflow may be encountered when one charged particle arrives at a sensing element and a subsequent charged particle arrives in a state where the sensing element and circuit are unable to give a proper response to the subsequent charged particle arrival event. This may be due to processing of the first charged particle arrival event by the circuit being ongoing when the subsequent charged particle arrives. The circuit may be unable to process output of the subsequent charged particle arrival event until processing for the first charged particle arrival event has finished and may simply record the subsequent charged particle arrival event as an overflow event by, e.g., setting an overflow flag. The first charged particle and the subsequent charged particle may be in the same or different energy level range. Processing the output of a charged particle arrival event may include determining the energy level of the charged particle. Therefore, when the subsequent charged particle arrival event is determined as an overflow event, an energy level of the subsequent charged particle may be ignored. If, for example, the subsequent charged particle arrival event occurs before processing for the first charged particle arrival event starts, the overflow flag may not be set, and the two incoming charged particles arriving one after another within a very short time period may still be identified and counted. For example, an event signal may be generated having an amplitude corresponding to that of a single secondary charged particle arrival event plus a single backscattered charged particle arrival event, and thus, it may be determined that a secondary and a backscattered particle have arrived.

Overflow may also include a second type of overflow. The second type of overflow may be encountered when a counter of a circuit connected to a sensing element is in an overflow state, such as in the second counting mode. In some embodiments, the second type of overflow may be encountered when a counter of a circuit connected to a sensing element for counting charged particles in a specific energy range is in an overflow state, such as in a fourth counting mode, as shall be discussed below. The overflow flag may be based on the second type of overflow in, for example, the second counting mode or the fourth counting mode. A detector may be configured to reset a sensing element and its associated circuit based on the second type of overflow.

In the second counting mode, in some embodiments, a detector may be configured to count numbers of charged particles incident on sensing elements of an array of sensing elements in the detector. The detector may be configured to count the numbers of charged particles as discrete charged particle arrival events. The detector may be configured to count the numbers of charged particles without discriminating energy levels of the charged particle arrival events. The detector may count a charged particle arrival event in response to detecting an amount of energy received by a sensing element, for example. The detector may detect an overflow state in response to an increase in energy received by the sensing element relative to that at the time of detecting the charged particle arrival event. Resetting of the sensing element may occur at the end of a detection frame. The detector may set an overflow flag that may indicate that another charged particle has arrived during the same detection frame as that in which the charged particle arrival event was already detected.

In the first counting mode and the second counting mode, charged particles may be counted without regard to the energy of the incident charged particles. Thus, regardless of whether a charged particle is a backscattered electron or a secondary electron, the charged particle arrival event may simply be recorded as an arrival event.

Figure 31A:
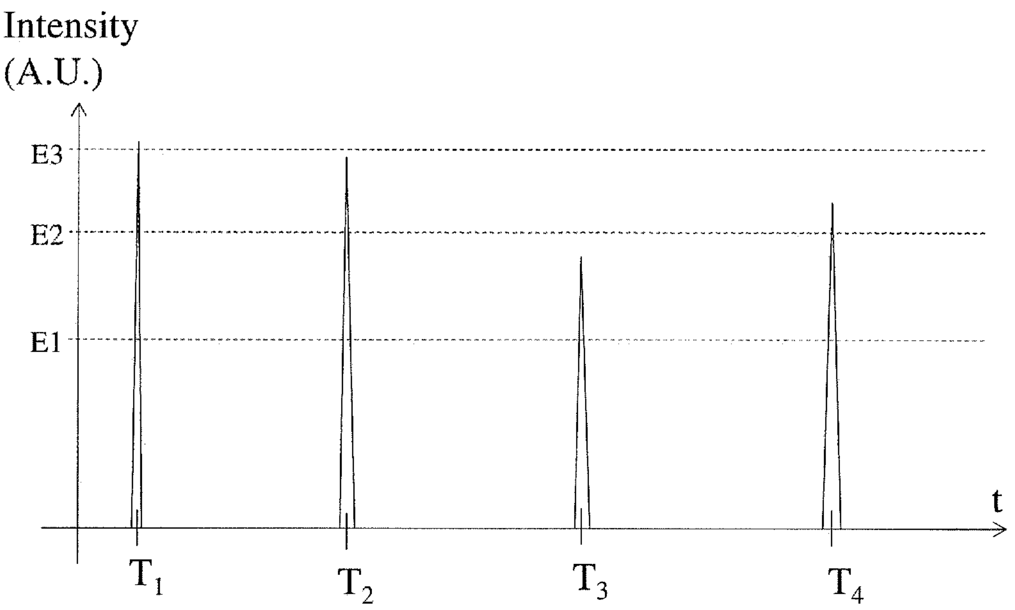
FIG. 31A and FIG. 31B illustrate a third mode of operating a detector, consistent with embodiments of the present disclosure.
Figure 31B:
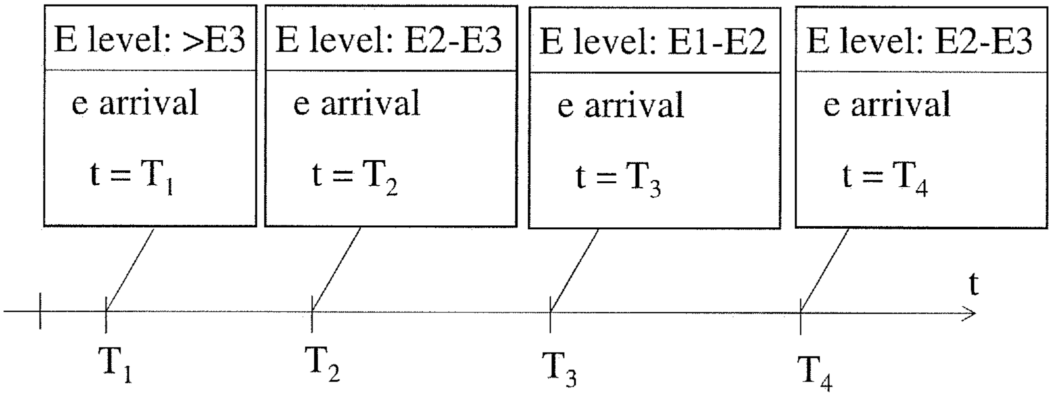

FIG. 31A and FIG. 31B illustrate a third counting mode for operating a detector or a detection system, consistent with embodiments of the disclosure. As shown in FIG. 31A, a sensing element and circuit may output a detection signal on the basis of time, and charged particle arrival events at the sensing element may occur at time points $T_1$, $T_2$, $T_3$, and $T_4$. The charged particles may have different energy levels. Separate energy level thresholds may be set. A threshold of the separate energy level thresholds may be set to distinguish noise from detection signal. For example, the detector may be configured not to count a charged particle having energy greater than zero but less than a first energy threshold E1. The detector may be configured to count a charged particle having energy greater than or equal to first energy threshold E1 and less than a second energy threshold E2. The detector may further be configured to count a charged particle having energy greater than or equal to second energy threshold E2 and less than a third energy threshold E3. The detector may further be configured to count a charged particle having energy greater than or equal to third energy threshold E3. It will be understood that bounds of energy ranges may be modified, for example, that a range may be defined as greater than first energy threshold E1 and less than or equal to second energy threshold E2. That is, in some embodiments, a range may be set as $E1<x\leq E2$. In some embodiments a range may be set as $E1<x<E2$. In some embodiments, a range may be set as $E1\leq x\leq E2$, and so on.

In the third counting mode, in some embodiments, a detector may be configured to count up to only one charged particle arrival event in a sensing element for a particular energy range before being reset. The detector may count a charged particle arrival event in an energy range in response to detecting a level of energy in a sensing element corresponding to the energy range. The detector may count a charged particle arrival event in an energy range in response to detecting an output signal of a sensing element corresponding to the energy range. Resetting of the sensing element may occur at the end of a detection frame.

In some embodiments, a detector may be configured to count only charged particle arrival events for a certain energy range or ranges. For example, a circuit connected to a sensing element may be configured to count only charged particle arrival events corresponding to the energy range of $E1<x\leq E2$ while neglecting events corresponding to other energy ranges.

FIG. 31B shows that at each of time points $T_1$, $T_2$, $T_3$, and $T_4$, an electron arrival event may be recorded. Data associated with electron arrival events may include energy level and the time at which the electron arrival event was recorded. Multiple recording may be made for different energy levels. For example, a detector may count a first charged particle arrival event at a first time, wherein the first charged particle has a first energy, and count a second charged particle arrival event also at or near the first time, the second charged particle having a second energy in a different energy range as compared to the first charged particle.

Figure 32A:
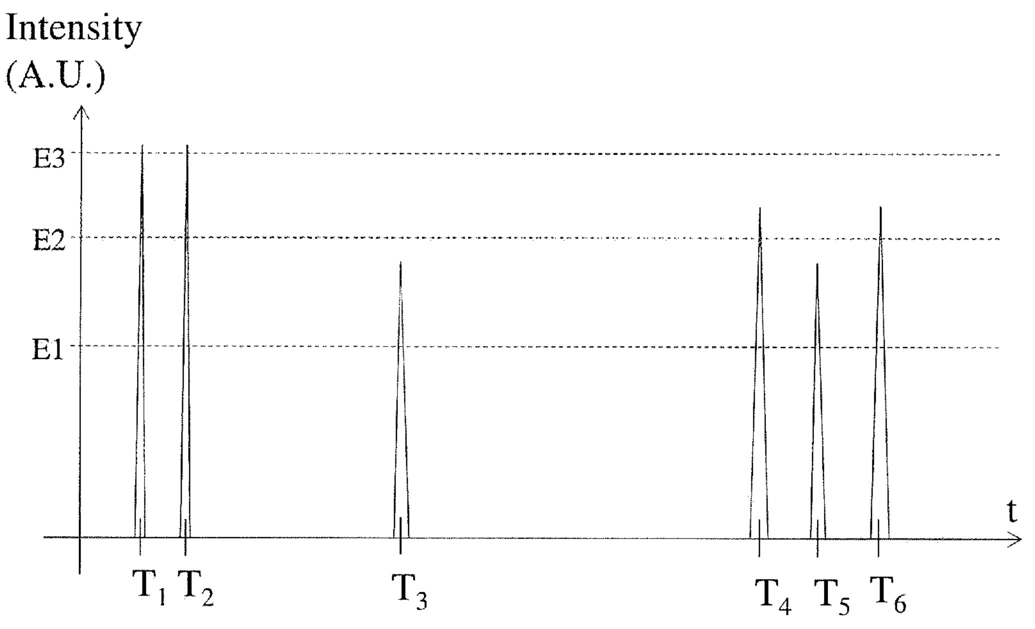
FIG. 32A and FIG. 32B illustrate a fourth mode of operating a detector, consistent with embodiments of the present disclosure.
Figure 32B:
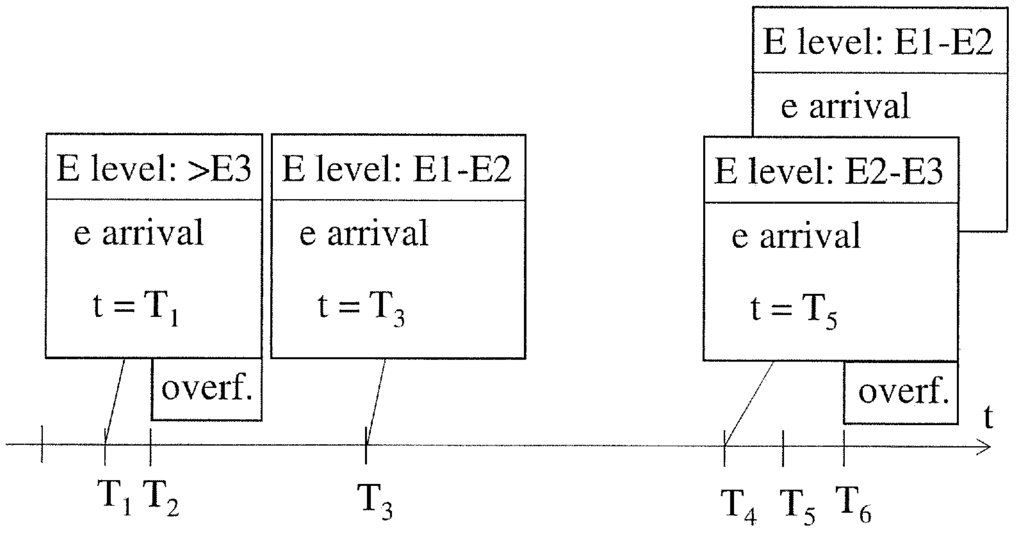

FIG. 32A and FIG. 32B illustrate a fourth counting mode of operating a detector or a detection system, consistent with embodiments of the disclosure. As shown in FIG. 32A, a sensing element and circuit may output a detection signal on the basis of time, and charged particle arrival events at the sensing element may occur at time points $T_1$, $T_2$, $T_3$, $T_4$, $T_5$, and $T_6$. The charged particles may have different energy levels.

FIG. 32B shows that at each of time points $T_1$, $T_3$, and $T_4$, an electron arrival event may be recorded. Data associated with electron arrival events may include energy level and the time at which the electron arrival event was recorded. Multiple recordings may be made for different energy levels. For example, a detector may count a first charged particle arrival event at a first time, wherein the first charged particle has a first energy, and count a second charged particle arrival event also at or near the first time, the second charged particle having a second energy in a different energy range as compared to the first charged particle.

At the time $T_2$, a charged particle in the same energy range as the preceding charged particle may arrive before the sensing element or its associated circuit has reset. The sensing element may set an overflow flag in response to a charged particle arrival event occurring at time $T_2$. The overflow flag may indicate that a further charged particle has arrived at the sensing element. The overflow flag may be specific to an energy range. The overflow flag may be triggered when a charged particle is detected while a prior charged particle in the same energy range has already been detected before the sensing element or its associated circuit has been reset.

Similarly, at the time $T_6$, a charged particle in the same energy range as a charged particle already received at the sensing element in a detection frame may arrive before the sensing element or its associated circuit has reset. However, at the time $T_5$, a charged particle in a different energy range as the preceding charged particle may arrive before the sensing element or its associated circuit has reset. In this case, the detector may still record that a charged particle has arrived without triggering the overflow flag. The charged particle arrival event occurring at time $T_6$ may trigger an overflow flag, as shown in FIG. 32B. The foregoing may include an example where a detector is configured to count numbers of charged particle arrival events for a first energy range and to set an overflow flag when overflow is encountered in a sensing element. The numbers of charged particles in the foregoing example may be one. However, in some embodiments, the numbers may be zero or may be more than one. Furthermore, the detector may be configured to count a same or different number of charged particles in different energy ranges.

Using different energy level thresholds may be useful to distinguish different types of charged particles. For example, in some embodiments, it may be useful to distinguish backscattered and secondary electrons from one another.

Comparison of incident charged particle energy may be based on reference values. Circuitry may be provided that includes, for example, a comparator. The comparator may compare an output signal from a sensing element to a reference provided in a circuit. As one example, in the case where a sensing element is connected to an element that converts output current signal to a voltage commensurate with the energy of the incident charged particle, a comparator may compare detected voltage to a voltage reference. The comparator may determine that the voltage signal is higher or lower than the reference voltage without ever storing a value of the detected voltage.

In some embodiments, data associated with charged particle arrival events may include recorded energy level corresponding to incident charged particles. For example, a sensing element may be connected to an analog-to-digital converter that may convert output signal of the sensing element to a value, which may be stored. Energy of incident charged particles may be directly measured and recorded.

In the fourth counting mode, in some embodiments, a detector may be configured to count numbers of charged particles incident on sensing elements of an array of sensing elements in the detector. The detector may be configured to count the numbers of charged particles as discrete charged particle arrival events. The detector may be configured to count the numbers of charged particles for a particular energy range before being reset. The detector may count a charged particle arrival event in an energy range in response to detecting a level of energy received by a sensing element corresponding to the energy range. The detector may count a charged particle arrival event in an energy range in response to detecting an output signal from a sensing element corresponding to the energy range. The detector may detect an overflow state in response to an increase in energy received by the sensing element relative to that at the time of detecting the charged particle arrival event in a particular energy range. Resetting of the sensing element may occur at the end of a detection frame. Resetting of the sensing elements may occur together with resetting their associated circuits. The detector may set an overflow flag that may indicate that another charged particle has arrived during the same detection frame as that in which the charged particle arrival event of a particular energy range was already detected.

A detector may include an array of sensing elements and a circuit, and may be operated in a variety of ways consistent with the above-discussed modes. The circuit may include a plurality of circuits, each of which may be connected to a respective sensing element of the array. All of the sensing elements in the array may be operated in the same mode. In some embodiments, sensing elements of the array may be operated in different modes at the same time. Data associated with charged particle arrival events may include an indicator of which mode of operation is used.

In some embodiments, a time stamp may be recorded when each incident charged particle is counted by a sensing element. If only up to one charged particle is counted without discriminating the energy of the particle, the time stamp may indicate the time at which the first charged particle arrives before the next reset. If only up to one charged particle is counted within each of predetermined energy ranges, the time stamp may indicate the time at which the first charged particle arrived within its associated energy range before the next reset. Overflow flags may also be set with their corresponding time stamps.

Resetting of sensing elements may be performed in a variety of ways. For example, in a first resetting mode, all sensing elements in an array may be reset at the same time with a fixed or varying period. In a second resetting mode, sensing elements may be reset at different time points based on predetermined regions. In a third resetting mode, sensing elements may be reset individually at different time points with fixed or varying periods. In a fourth resetting mode, one or more of the above modes may be combined. These modes will be discussed in further detail as follows.

The first resetting mode may be based on a common reset. Some or all of the sensing elements in an array of sensing elements may be reset at one time. For example, all sensing elements in the array of sensing elements may be reset simultaneously. The rate of resetting may be determined by a period. The period may be predetermined. In some embodiments, the period may be a fixed period. In some embodiments, the period may vary. For example, as discussed above with references to FIG. 20C, the length of frames may be different from one to another. The period of a frame may be set to adapt to the signal intensity of the charged particle beam being detected. In some embodiments, periods may include a mix of fixed and varying periods.

In the first resetting mode, in some embodiments, data from each sensing element may be stored before each reset. The data may be stored immediately prior to the reset. Thus, a snapshot of a surface of a sensing element array may be acquired at intervals. The intervals may be fixed or varying. In this way, a detector may output data on a timewise basis with a detection frame rate. The detection frame rate may be based on conditions that may be required for a particular SEM imaging frame rate.

In the first resetting mode, in some embodiments, resetting may occur based on predetermined conditions. The predetermined conditions may include criteria, such as a condition that at least A % of sensing elements in a sensing element array receive at least one charged particle. Another example of predetermined conditions may include a condition that at least A % of sensing elements in a sensing element array encounter overflow. A time stamp may be recorded each time a reset occurs. Time stamps may be used to label corresponding detection frames.

Figure 33A:
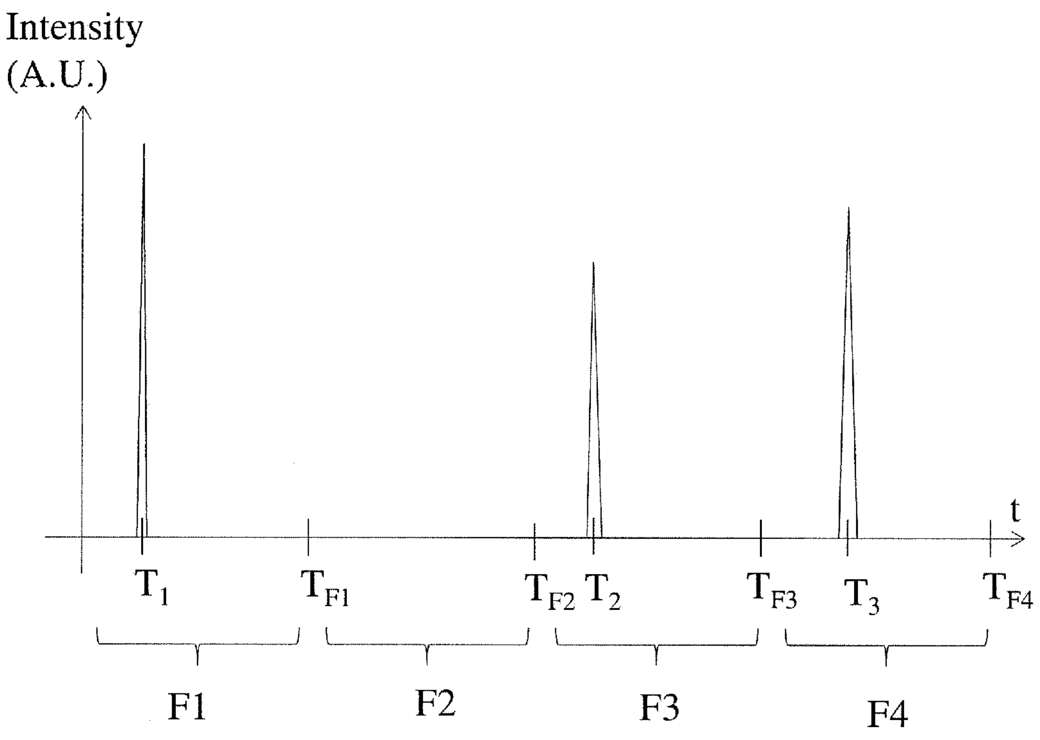
FIG. 33A and FIG. 33B illustrate detection signals according to a first resetting mode, consistent with embodiments of the present disclosure.
Figure 33B:
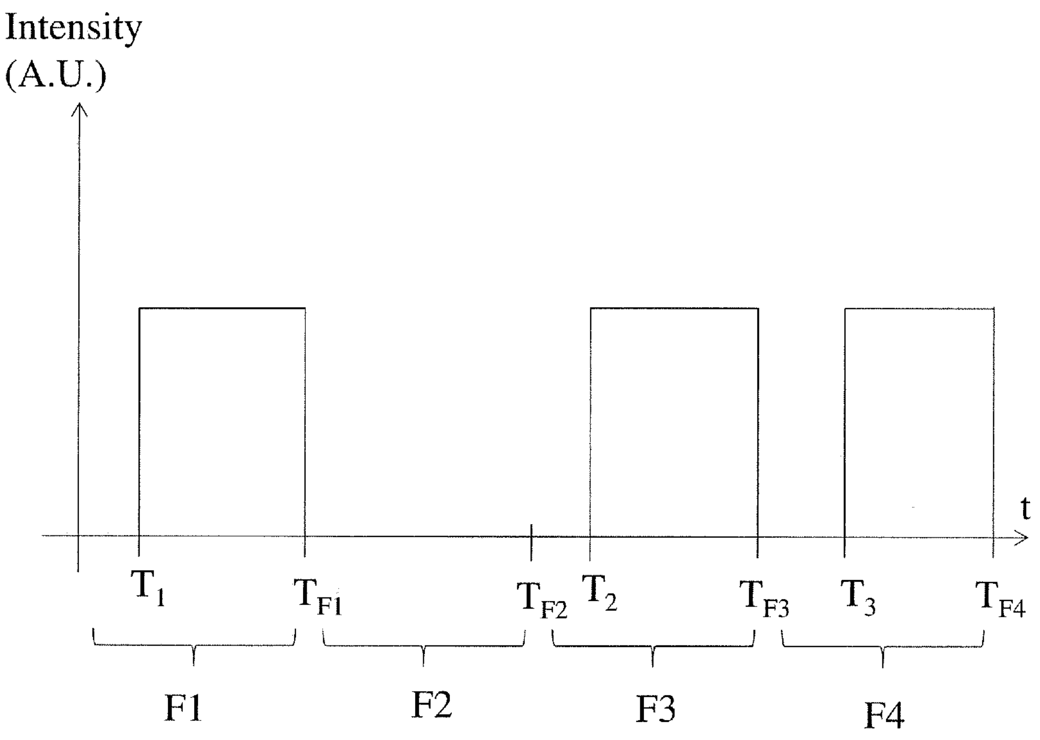

FIG. 33A and FIG. 33B illustrate a detection signal according to the first resetting mode, consistent with embodiments of the disclosure. Similar to the exemplary embodiment shown in FIG. 29A, in FIG. 33A, charged particle arrival events at a sensing element may occur at time points $T_1$, $T_2$, and $T_3$. A sensing element may detect charged particle arrival events at these time points. Meanwhile, FIG. 33A also shows a plurality of frames, F1, F2, F3, and F4 at a constant frame rate. The frames may correspond to resetting of sensing elements. In some embodiments, resetting may be initiated by a controller. At the end of each frame, sensing elements and their associated circuits may be reset. Thus, a reset may occur at time points $T_{F1}$, $T_{F2}$, $T_{F3}$, and $T_{F4}$. Storing of sensing element data may occur at or immediately before time points $T_{F1}$, $T_{F2}$, $T_{F3}$, and $T_{F4}$. While FIG. 33A may only show the output of one sensing element, it is understood that resetting according to the first resetting mode may occur simultaneously for all sensing elements of an array.

Referring now to the second resetting mode, the second resetting mode may be based on a common reset for a portion of the sensing elements of an array. Sensing elements in different regions of the array may be reset at different time points. Thus, not all of the sensing elements on the array may be reset at the same time. Regions may be determined in advance. For example, regions may be determined based on quadrants of a detector. In some embodiments, for example where a multi-beam apparatus is used, regions may correspond to portions of the detector where beams of secondary charged particles are expected to land. In some embodiments, the regions may correspond to detection sub-regions, such as 246, 248, and 250 of detector 244 (see FIG. 2A). In some embodiments, the regions may be determined in real time. Regions may also change during operation of the detector.

In the second resetting mode, the sensing elements in one region of an array of sensing elements may be reset at one time. The rate of resetting may be determined by a period. The period may be a fixed period, or the period may vary, for example as discussed above. Among different regions, resetting may be done at different time points.

In the second resetting mode, in some embodiments, data from each sensing element in a region may be stored before each reset. The data may be associated with other sensing elements in the same region. The data may be stored immediately prior to the reset. Thus, a snapshot of a surface of a specific region of a sensing element array may be acquired at intervals. The intervals may be fixed or varying. In this way, a detector may output data on a timewise basis with a detection frame rate based on different regions. The detection frame rate may be based on conditions that may be required for a particular SEM image frame rate.

In the second resetting mode, in some embodiments, resetting may occur based on predetermined conditions. The predetermined conditions may include criteria, such as a condition that at least A % of sensing elements in a region of a sensing element array receive at least one charged particle. Another example of predetermined conditions may include a condition that at least A % of sensing elements in a region of a sensing element array encounter overflow. A time stamp may be recorded each time a reset occurs. Time stamps may be used to label corresponding detection frames from specific regions. In some embodiments, the number of regions on the detector surface may relate to the number of beams to be detected. In some embodiments, the number of regions may be unrelated to the number of beams to be detected. The sizes and shapes of regions may be the same or different from one another.

While FIG. 33A and FIG. 33B may illustrate a detection signal according to the first resetting mode for a sensing element, it will be appreciated that multiple sensing elements associated with one region may be reset in a similar manner according to the second resetting mode. Thus, although output for only one sensing element may be shown in FIG. 33A and FIG. 33B, other sensing element output may be representing in a similar way.

Referring now to the third resetting mode, the third resetting mode may be based on individual resets of the sensing elements of an array. Each sensing element in the array may be reset at different time points. Sensing elements may be reset with fixed or varying period, for example as discussed above.

In the third resetting mode, in some embodiments, data from each sensing element may be stored before each reset. The data may be stored immediately prior to the reset. Thus, a snapshot of a surface of a specific sensing element in a sensing element array may be acquired at intervals. The intervals may be fixed or varying.

Resetting of sensing elements in the third resetting mode may be based on predetermined conditions. The predetermined conditions may include, for example, that a specific sensing element receives at least one charged particle. Another example of predetermined conditions may include a condition that a specific sensing element encounters overflow. A time stamp may be recorded each time a reset occurs.

Figure 34A:
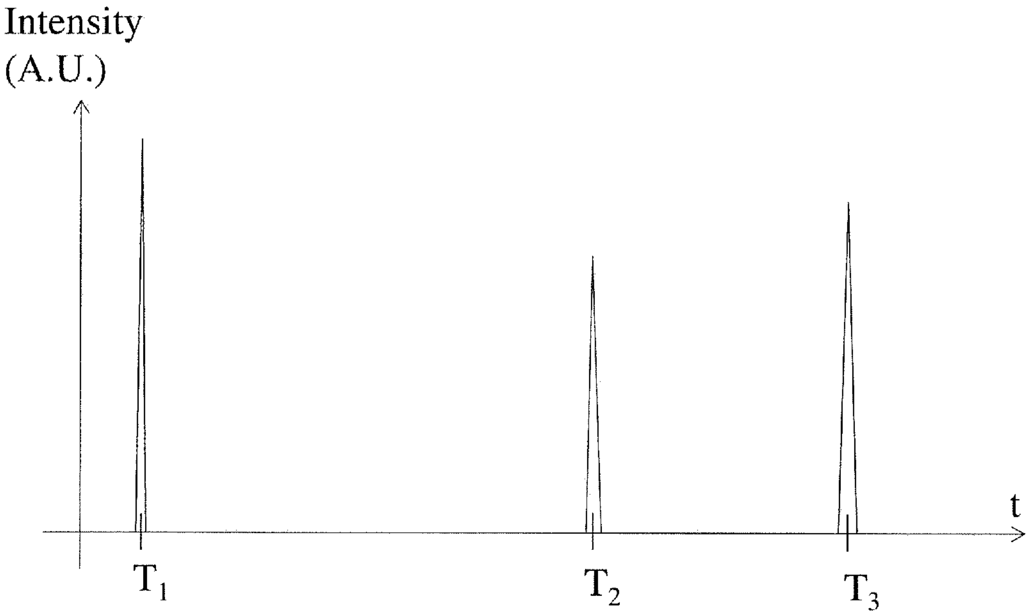
FIG. 34A and FIG. 34B illustrate detection signals according to another resetting mode, consistent with embodiments of the present disclosure.
Figure 34B:
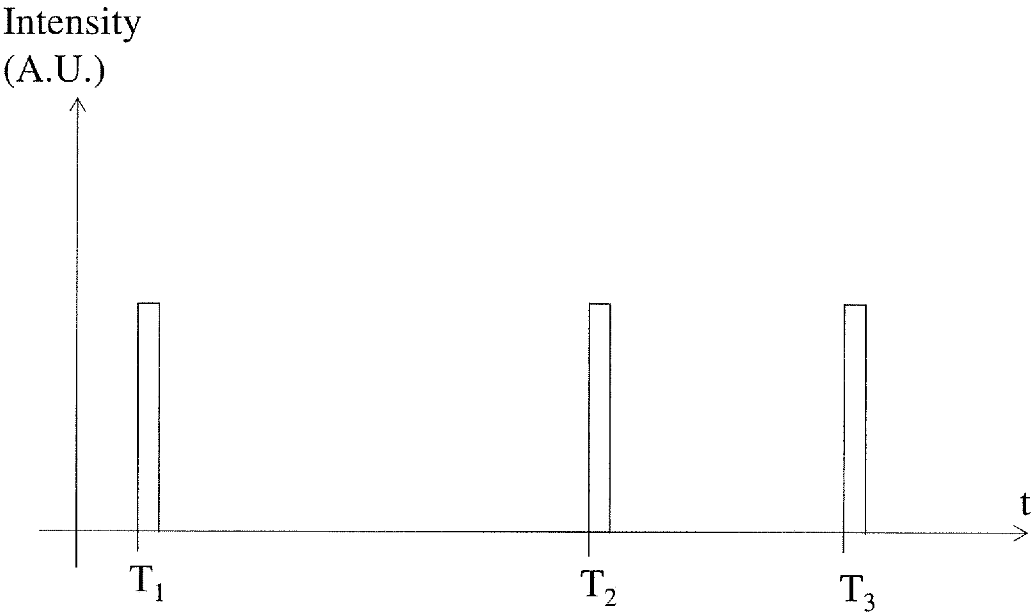

FIG. 34A and FIG. 34B illustrate an example of a sensing element and its associated circuit resetting in response to a charged particle arrival event. The reset may occur at a predetermined time after the charged particle arrival event. In some embodiments, the reset may be initiated directly after the charged particle arrival event occurs or is detected. A charged particle arrival event on a sensing element may initiate a feedback loop where a counter may be incremented and a reset operation is started. In comparison to, for example, FIG. 33A and FIG. 33B, resetting of a sensing element and its associated circuit according to FIG. 34A and FIG. 34B may occur irrespective of predetermined frames.

Figure 35A:
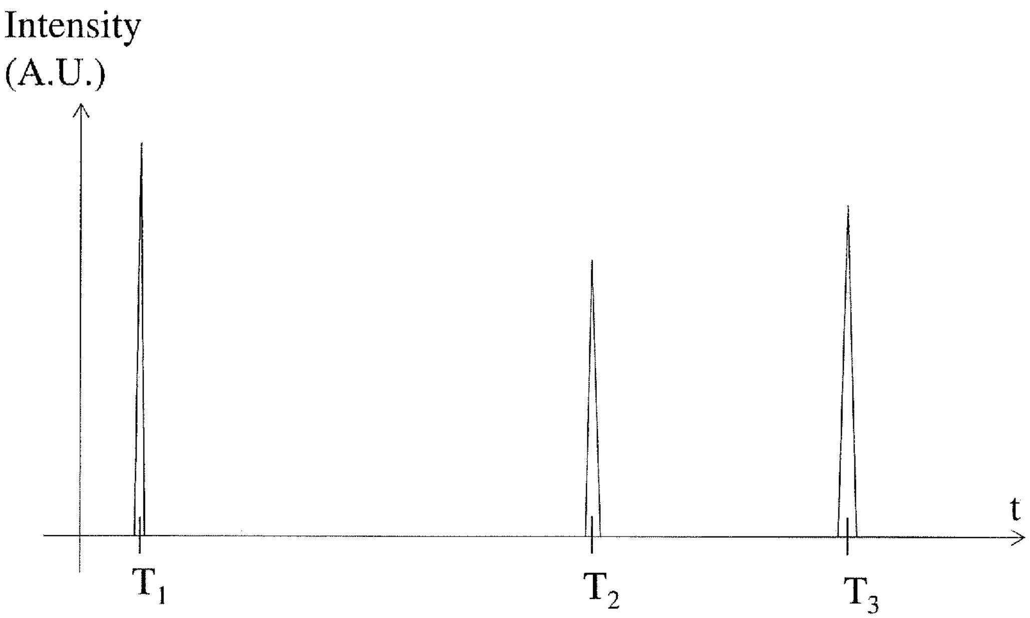
FIG. 35A and FIG. 35B illustrate detection signals according to another resetting mode, consistent with embodiments of the present disclosure.
Figure 35B:
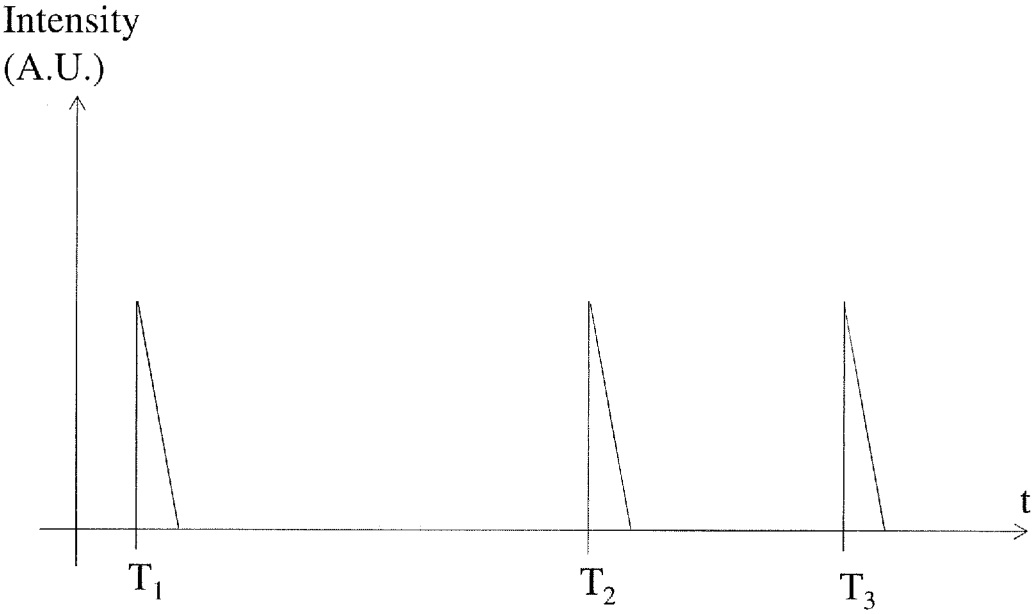

FIG. 35A and FIG. 35B illustrate an example in which resetting may occur by a passive method. As shown in FIG. 35B, detection signal may decay naturally in response to a charged particle arrival event without an active reset operation. Gradual decay of signal may include long tail behavior.

In some embodiments, resetting of a sensing element or its associated circuit may be passive or active. Resetting of a counting detector or a sensing element itself may include quenching. In some embodiments, a quenching circuit may be provided. The quenching circuit may control quenching of the respective sensing element. Resetting in a detector may include resetting another circuit connected to each sensing element in an array, for example a counting circuit. The counting circuit may include an analog portion, such as front-end electronics. Resetting of the analog portion of a circuit may be passive or active. The counting circuit may also include a digital portion, such as a pulse height analyzer and scaler. In some embodiments, resetting of the digital portion of a circuit may be active. Active resetting of a circuit or sensing element may be advantageous for achieving high speed.

In some embodiments, electron counting may be enabled wherein it is not necessary to bias a diode of a sensing element to avalanche mode or even so called “Geiger counting” mode to achieve gain. Gain may be achieved due to the kinetic energy of an incoming electron. Providing gain due to kinetic energy of electrons may help to maintain high speed of a detector. In addition, in some embodiments, a diode may be biased to avalanche mode, wherein the diode may have high speed. In avalanche mode, long tail in the signal may be reduced or avoided. Due to the avalanche effect, speed may even be higher than diodes under normal bias conditions. As a result, a detector with a sensing element may be fast enough so that there will be no long tail in the signal from the sensing element. In some embodiments, a reset mechanism may be provided for the sensing element and the related signal conditioning and processing circuits to cause the detector go back to the initial state after each electron arrival event.

Referring now to the fourth resetting mode, the fourth resetting mode may use a combination of the above discussed resetting modes. For example, the fourth resetting mode may include resetting of sensing elements in accordance with the second resetting mode and the third resetting mode in combination.

In some embodiments, resetting of sensing elements may occur uniformly among all the sensing elements in an array. Reset intervals of a single sensing element may be different from frame to frame. When all sensing elements of an array are reset uniformly, all of the sensing elements may use the same reset intervals. However, in some embodiments, reset intervals may be different from sensing element to sensing element.

The first to fourth resetting modes may be used with any of the first to fourth modes of operating a detector, discussed above. A variety of combinations may be employed.

A detector may be configured such that data is continued to be produced data that relates to the number of charged particles counted at a sensing element as time advances. In some embodiments, data may be produced from sensing elements with a time stamp at a time of a charged particle arrival event. Furthermore, in some embodiments, data may be produced from sensing elements with a time stamp at a time of sensing element reset. The time stamps of these events may be different from one another. Based on information derived from sensing elements, including information about locations of each sensing element, a motion picture of incoming charged particles received by sensing elements in an array may be generated. Raw data regarding charged particle arrival events may be converted to a desired format with a specified frame rate and pixel resolution. Information may be derived regarding intensity of beams of charged particles received on a detector.

Figure 36:
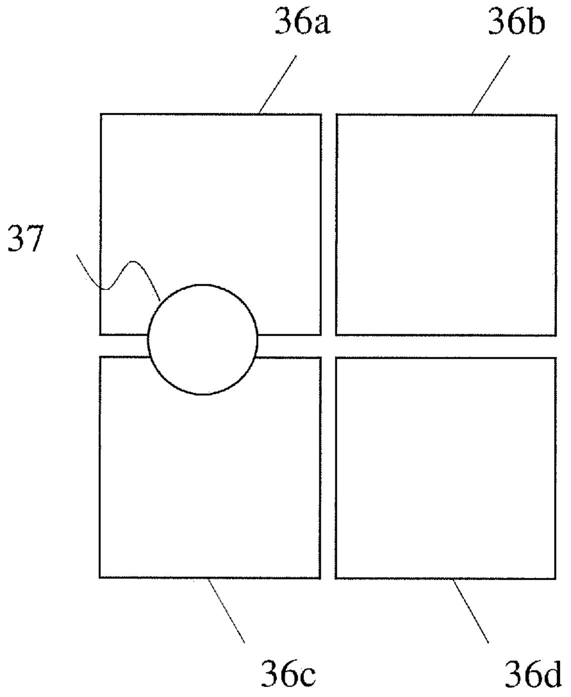
FIG. 36 illustrates an effect of a charged particle arrival event on a detection surface, consistent with embodiments of the present disclosure.

Reference is now made to FIG. 36, which illustrates an effect of a charged particle arrival event on a detection surface. In FIG. 36, a detector may include a plurality of sensing elements including sensing element 36*a*, sensing element 36*b*, sensing element 36*c*, and sensing element 36*d*. A charged particle may hit (e.g., impact) the detector surface in a region near a boundary between sensing element 36*a* and sensing element 36*c*. When an electron impacts a detector, it may create a charge in a volume of the detector. The volume may span two or more sensing elements. For example, an ionized region 37 may develop that may enter into multiple sensing elements. Charge developing in multiple sensing elements may lead to an electron being counted multiple times or not being counted at all.

In some embodiments, miscounting of electrons that reach a detection surface of a detector may be further reduced. Some miscounting may be based on electron arrival events that occur near the boundary between sensing elements. When electrons from an electron optical column of a SEM reach the sensing surface of a detector, the locations where the electrons enter the detection device may be randomly distributed. Due to an ionization process after each electron enters the detector, a temporary ionized region within the detector may be created. The temporary ionized region may expand outside of a depletion region of a sensing element. Each of the ionized regions may have a volume that relates to the energy of each incoming electron and the materials that form the detector. The randomness of the locations where each electron enters the detection device may result in the temporarily ionized region induced by each incoming electron crossing the boundary of adjacent sensing elements. Thus, multiple sensing elements in the detector may have an output signal corresponding to a specific incoming electron. In a per-sensing element based electron counting device, this may cause miscounting.

To address the above issue, some embodiments may employ the following. A sensing element may be configured to have a predetermined size and shape. An array of sensing elements may include sensing elements that are arranged in a pattern, such as a grid. The size of each sensing element in the detector may be chosen in such a way that in any direction, the size of the sensing element is no less than a maximum penetration depth of the incoming electrons. The sensing element may be configured such that no dimension (e.g., a length, width, height) of the sensing element is less than the maximum penetration depth. The maximum penetration depth may be based on the materials used to form the detector. For example, an electron may penetrate further in one material than another. In this way, each incoming electron may impact no more than four sensing elements at a time. This may help to further simplify signal post-processing for miscount correction.

Furthermore, in each sensing element, if the strength of a signal due to an incoming electron is higher than a predefined reference value, e.g., a threshold $TH_A$, a time stamp may be left for the event. Threshold $TH_A$ may correspond to a value that is a predetermined proportion of average event pulse signal, or some other parameter such as a measure of energy in response to electron arrival events. For example, threshold $TH_A$ may be set to a value that is equal to 20% of average amplitude of event signal pulses corresponding to situations of one incoming secondary electron impacting one sensing element. The situation of one incoming secondary electron impacting one sensing element may correspond to a temporary ionized region forming within the volume of one single sensing element. Threshold $TH_A$ may be based on parameters of secondary electrons that may have relatively consistent energy level. Furthermore, energy variation of secondary electrons under fixed SEM imaging settings may be smaller than, for example, that of backscattered electrons.

An event that has a signal strength exceeding threshold $TH_A$ may represent that a sensing element has been hit at least partially by an incoming electron. Then, information from any two adjacent sensing elements may be analyzed. If any two adjacent sensing elements encountered electron impacting events with the same time stamp, the signal from the two sensing elements may be added in an analog way, and the result may be sent to one of the two sensing elements. The signal stored in the other of the two sensing elements may be cleared (e.g., deleted).

For example, the signals due to an incoming electron from each sensing element that has been hit (e.g., impacted) may be presented in the form of a voltage across a capacitor. In each sensing element, the capacitor used to generate and store the signal may have the same capacitance. Then, during analog signal processing, e.g., analog signal adding, the charges from the capacitor in one of the two adjacent sensing elements may be transferred to the capacitor in the other one of the two adjacent sensing elements. In this way, signal adding may be conducted and the signal in the first one of the two adjacent sensing elements may then be deleted.

In some configurations, in each sensing element, there is only one capacitor and one memory for time stamp recording. The signal processing procedure may be started whenever there are two adjacent sensing elements that are impacted by incoming electrons simultaneously at a time point. The process may be asynchronized to the system clock.

In other configurations, in each sensing element, there are more than one capacitor for signal generation and storage. In addition, each of the capacitors may have its corresponding time stamp memory. These capacitors and their corresponding time stamp memories may be used in a way that each one of them is only used to generate and store the signal of one single event of an electron impacting the sensing element. For example, during each event, there may be one or more than one electrons impacting the sensing element within a period of time that is short enough that the circuit in the sensing element will treat the period as a time point. In other words, from the circuit's point of view, those electrons hit the sensing element at the same time. Then, the signal processing procedure for count correction may be started if a predefined number M, or a percentage B %, of capacitors in a sensing element are used and there is at least one event amount the events that involves at least two adjacent sensing elements. The procedure in that specific sensing element may be stopped until all the electron impacting events involving at least two sensing elements are processed. During the signal processing procedure, the sensing elements involved in the procedure may still count new events of incoming electrons until all the capacitors and time stamp memories in that sensing elements are used. Then, if there are new incident electrons that hit the same sensing element, an overflow may be recorded. The reset of that sensing element may be conducted after the signal processing procedure mentioned above is completed and the data stored in sensing element or associated with it is sent out.

In a signal processing procedure such as that consistent with the above, a combined signal may be stored in one element of the two adjacent sensing elements hit by the same incoming electron or electrons, from which the signal level is higher, each time there is a boundary impacting event occurs. Furthermore, the signal in the other one of the two sensing elements may be deleted. The capacitor and its corresponding time stamp memory will then be available immediately for the next electron impacting event for that sensing element.

A detector may be provided in which the miscounting rate due to one incoming electron hitting more than one sensing elements is reduced. Such an event may be referred to as a boundary impacting event. The boundary impacting event may occur when ionized region 37 develops in more than one sensing element, for example as shown in FIG. 36.

In some embodiments, each type of electron (e.g., secondary electron, backscattered electron, etc.) has a characteristic energy range and creates a characteristic amount of charge when impacting a detector. When multiple adjacent sensing elements detect charge at the same time, the charge may be compared to these characteristic energies to determine whether they correspond to multiple electron impacts, or a single impact that generates charge in multiple sensing elements. A method may be provided for reducing miscounting in an electron counting detector. The method may include detecting charge in two or more adjacent sensing elements at substantially a same time, comparing the charge detected in each of the adjacent sensing elements to one or more reference values, and based on the comparison, determining if the charge results from one electron impacting one of the sensing elements or from multiple electrons impacting the two or more sensing elements.

A charged particle beam apparatus may be configured to image a sample using a charged particle beam. A detector may be configured to determine a count of charged particles arriving at the detector. The count of charged particles may be based on individual counts of charged particles received by individual sensing elements of an array. Based on the count, an image of the sample may be reconstructed. Producing an image, such as a SEM image, may include summing counts for a plurality of sensing elements and correlating the counts with a particular time that corresponds to a position on the sample surface that was scanned. The summed counts may be used for determining a gray level of a pixel image. In some embodiments, further degrees of freedom in information display may be used. For example, information included in a count may include a time stamp, a location (e.g., a sensing element's location on the array of sensing elements), and a number of charged particles counted. Counts of sensing elements may be associated with sample surface position by correlating with scanning time. Counts of individual sensing elements may be grouped together based on, for example, their time stamp. Sensing element data having time stamps that are the same or close to one another in value may be grouped together. The grouped sensing element data may be associated with a beam of charged particles incident on the detector. The number of charged particles counted may be taken as the sum from a plurality of sensing elements that received charged particles within a time window based on their time stamps.

In some embodiments, sensing elements may be grouped without requiring pre-processing. Instead, sensing elements may be grouped in a post-processing method. Sensing elements that are determined to receive charged particles at a certain time based on their time stamps may be grouped together and may be associated with a beam spot. Thus, there may be no need to determine beam boundaries, such as boundary line 350 and 360 (see FIG. 3F). Sensing elements, or further, the information from sensing elements that are not necessarily adjacent to one another may be grouped based on their time stamp, location, scan action of the primary beam, or properties of the SEM system. Thus, for example referring to FIG. 28A to FIG. 28E, a detector may determine that all sensing elements receiving charged particles at a particular scan time (e.g., at $T=T_2$, sensing elements 2102 and 2103) may be associated with the same beam of charged particles that is incident at a particular spot on the detector.

According to some embodiments, real-time high-linearity (high-fidelity), or high dynamic range charged particle beam detection may be achieved. A charged particle beam detection system may be able to track slow and fast movements of a projection pattern of secondary charged particle beams incident on a detector. In some applications, a SEM system may be made more robust and failure tolerant. As a result, system down time may be reduced.

In some embodiments, an anti-deflection system in a projection system may be omitted, which may help to simplify systems. This may further improve reliability and reduce system down time.

A variety of results may be acquired according to specific application requirements based on the same set of acquired raw data. Results may be used in post processing rather than in pre-processing. In some embodiments, pre-processing may include sensing element grouping. Data may be further tailored for optimizing specific purposes. For example, a trade-off relationship may exist between optimizing detection parameters such as cross talk and secondary charged particle collection efficiency. However, when post processing is used to adjust data, the trade-off may be adjusted without loss of information. This may provide application layers with more flexibility and may reduce the risk of having to redo specific operations merely to obtain data with different detection parameter settings.

In some embodiments, a detection system may include analog, mixed signal, and digital circuits. In comparative embodiments, the percentage of analog circuit portions may be relatively high, which may make device implementation more difficult, and may make detector design less compatible with the most advanced semiconductor process nodes. Some embodiments of the disclosure may provide a detection system using a relatively higher proportion of mixed signal and digital circuits, or consisting of only mixed signal and digital circuits, which may reduce the difficulties associated with analog circuit design and manufacturing in ASICs (application-specific integrated circuits). Some embodiments may help achieve high compatibility with advanced semiconductor nodes. This may help to reduce overall power consumption.

The embodiments may further be described using the following clauses:

1. A method comprising:

determining a number of charged particles incident on a detector within a first frame among a plurality of frames; and determining a period of the first frame based on a first criteria comprising a condition that a charged particle is incident on each of a first number of sensing elements of the detector.

2. The method of clause 1, further comprising:

determining a period of the first frame based on the first criteria and a second criteria comprising a condition that more than one charged particle is incident on no more than a second number of sensing elements among the first number of sensing elements.

3. The method of clauses 1 or 2, further comprising:

determining a frame rate of the plurality of frames based on the first criteria.

4. The method of clause 2, further comprising:

determining a frame rate of the plurality of frames based on the first criteria and the second criteria.

5. The method of any of clauses 1 to 4, further comprising:

determining a statistic of amounts of incident charged particles at a plurality of energy levels within the first frame.

6. The method of clause 5, wherein the statistic comprises overall amounts of incident charged particles among the first number of sensing elements at each of respective energy levels corresponding to charged particles incident on each sensing element of the first number of sensing elements.

7. The method of any of clauses 1 to 6, further comprising:

determining a third number of charged particles incident on a sensing element of the detector at an energy level greater than or equal to a first threshold and less than a second threshold.

8. The method of clause 7, further comprising:

determining a fourth number of charged particles incident on a sensing element of the detector at an energy level greater than or equal to the second threshold and less than a third threshold.

9. The method of clause 8, further comprising:

determining a fifth number of charged particles incident on a sensing element of the detector at an energy level greater than or equal to the third threshold.

10. The method of any of clauses 1 to 9, further comprising:

generating a pixel of a grayscale image based on the at least one frame.

11. The method of any of clauses 1 to 10, further comprising:

generating a pixel of a color image based on the at least one frame.

12. The method of any of clauses 1 to 11, further comprising:

generating a charged particle beam; and scanning the charged particle beam across a sample, wherein the detector is configured to receive charged particles projected from the sample.

13. A non-transitory computer readable medium comprising a set of instructions that are executable by one or more processors of a controller to cause the controller to perform a method comprising:

determining a number of charged particles incident on a detector within a first frame among a plurality of frames; and determining a period of the first frame based on a first criteria comprising a condition that a charged particle is incident on each of a first number of sensing elements of the detector.

14. The non-transitory computer readable medium of clause 13, wherein the set of instructions that are executable by the at least one processor of the controller cause the controller to further perform: determining a period of the first frame based on the first criteria and a second criteria comprising a condition that more than one charged particle is incident on no more than a second number of sensing elements among the first number of sensing elements.

15. The non-transitory computer readable medium of clauses 13 or 14, wherein the set of instructions that are executable by the at least one processor of the controller cause the controller to further perform determining a frame rate of the plurality of frames based on the first criteria.

16. The non-transitory computer readable medium of clause 14, wherein the set of instructions that are executable by the at least one processor of the controller cause the controller to further perform determining a frame rate of the plurality of frames based on the first criteria and the second criteria.

17. The non-transitory computer readable medium of any of clauses 13 to 16, wherein the set of instructions that are executable by the at least one processor of the controller cause the controller to further perform determining a statistic of amounts of incident charged particles at a plurality of energy levels within the first frame.

18. The non-transitory computer readable medium of clause 17, wherein the statistic comprises overall amounts of incident charged particles among the first number of sensing elements at each of respective energy levels corresponding to charged particles incident on each sensing element of the first number of sensing elements.

19. The non-transitory computer readable medium of any of clauses 13 to 18, wherein the set of instructions that are executable by the at least one processor of the controller cause the controller to further perform determining a third number of charged particles incident on a sensing element of the detector at an energy level greater than or equal to a first threshold and less than a second threshold.

20. The non-transitory computer readable medium of clause 19, wherein the set of instructions that are executable by the at least one processor of the controller cause the controller to further perform determining a fourth number of charged particles incident on a sensing element of the detector at an energy level greater than or equal to the second threshold and less than a third threshold.

21. The non-transitory computer readable medium of clause 20, wherein the set of instructions that are executable by the at least one processor of the controller cause the controller to further perform determining a fifth number of charged particles incident on a sensing element of the detector at an energy level greater than or equal to the third threshold.

22. The non-transitory computer readable medium of any of clauses 13 to 21, wherein the set of instructions that are executable by the at least one processor of the controller cause the controller to further perform generating a pixel of a grayscale image based on the at least one frame.

23. The non-transitory computer readable medium of any of clauses 13 to 22, wherein the set of instructions that are executable by the at least one processor of the controller cause the controller to further perform generating a pixel of a color image based on the at least one frame.

24. The non-transitory computer readable medium of any of clauses 13 to 23, wherein the set of instructions that are executable by the at least one processor of the controller cause the controller to further perform:

causing a charged particle source to generate a charged particle beam; and causing a deflector to scan the charged particle beam across a sample, wherein the detector is configured to receive charged particles projected from the sample.

25. A charged particle beam apparatus comprising a detector and a controller with at least one processor and a non-transitory computer readable medium comprising instructions that, when executed by the processor, cause the apparatus to:

determine a number of charged particles incident on the detector within a first frame among a plurality of frames; and determine a period of the first frame based on a first criteria comprising a condition that a charged particle is incident on each of a first number of sensing elements of the detector.

26. The apparatus of clause 25, wherein the instructions further cause the apparatus to:

determine a period of the first frame based on the first criteria and a second criteria comprising a condition that more than one charged particle is incident on no more than a second number of sensing elements among the first number of sensing elements.

27. The apparatus of clauses 25 or 26, wherein the instructions further cause the apparatus to:

determine a frame rate of the plurality of frames based on the first criteria.

28. The apparatus of clause 26, wherein the instructions further cause the apparatus to:

determine a frame rate of the plurality of frames based on the first criteria and the second criteria.

29. The apparatus of any of clauses 25 to 28, wherein the instructions further cause the apparatus to:

determine a statistic of amounts of incident charged particles at a plurality of energy levels within the first frame.

30. The apparatus of clause 29, wherein the statistic comprises overall amounts of incident charged particles among the first number of sensing elements at each of respective energy levels corresponding to charged particles incident on each sensing element of the first number of sensing elements.

31. The apparatus of any of clauses 25 to 30, wherein the instructions further cause the apparatus to:

determine a third number of charged particles incident on a sensing element of the detector at an energy level greater than or equal to a first threshold and less than a second threshold.

32. The apparatus of clause 31, wherein the instructions further cause the apparatus to:

determine a fourth number of charged particles incident on a sensing element of the detector at an energy level greater than or equal to the second threshold and less than a third threshold.

33. The apparatus of clause 32, wherein the instructions further cause the apparatus to:

determine a fifth number of charged particles incident on a sensing element of the detector at an energy level greater than or equal to the third threshold.

34. The apparatus of any of clauses 25 to 33, wherein the instructions further cause the apparatus to:

generate a pixel of a grayscale image based on the at least one frame.

35. The apparatus of any of clauses 25 to 34, wherein the instructions further cause the apparatus to:

generate a pixel of a color image based on the at least one frame.

36. The apparatus of any of clauses 25 to 35, wherein the instructions further cause the apparatus to:

generate a charged particle beam; and scan the charged particle beam across a sample, wherein the detector is configured to receive charged particles projected from the sample.

37. A detector for a charged particle beam apparatus, the detector comprising:

an array of detector elements, wherein an area of a detector element of the array is configured to receive no more than a predetermined number of charged particles per sampling period with at least a level of confidence.

38. The detector of clause 37, wherein the sampling period is less than a dead time of the detector element.

39. The detector of clause 37, wherein the level of confidence corresponds to a statistical probability that no more than the predetermined number of charged particles are received in the detector element per sampling period or a miscount rate, wherein the detector element is configured to receive no more than the predetermined number of charged particles per sampling period with the miscount rate satisfying a condition related to a first miscount threshold.

40. The detector of clause 39, wherein the condition is satisfied when the miscount rate is less than or equal to the first miscount threshold.

41. The detector of any one of clauses 37 to 40, wherein the area of the detector element is configured so that the sampling period is a factor of average charged particle separation time.

42. The detector of clause 41, wherein the sampling period is 0.1 times the average charged particle separation time.

43. The detector of clause 41 or clause 42, wherein the average charged particle separation time is based on beam current of a beam of charged particles incident on the detector and a position of the detector elements relative to a geometric spread of the charged particles incident on the detector.

44. The detector of clause 41, wherein the sampling period is 0.01 times the average charged particle separation time.

45. The detector of clause 41, wherein the sampling period is 0.05 times the average charged particle separation time.

46. The detector of any one of clauses 37 to 45, wherein the predetermined number of charged particles is one or two, and the detector is configured to detect an overflow state.

47. The detector of any one of clauses 37 to 46, wherein the plurality of detector elements includes segmented diodes.

48. The detector of any one of clauses 37 to 47, further comprising a plurality of circuitries, a circuit of the plurality of circuitries being configured to process an output from the detector element to count a number of the charged particles incident on the detector element.

49. The detector of clause 48, wherein the plurality of circuitries each include a signal conditioning circuit, an event detector, and a pixel count buffer.

50. The detector of clause 48 or clause 49, wherein the plurality of circuitries each include a discriminator configured to compare an incoming signal with a reference value and set a flag when a rising edge of the incoming signal exceeds the reference value.

51. The detector of clauses 37 to 50, further comprising an image processor configured to determine a sum of counted charged particles incident on the detector.

52. The detector of any of clauses 37 to 51, wherein the charged particles incident on the detector are secondary particles resulting from interaction of primary particles with a specimen, the primary particles being generated from a source of the charged particle beam apparatus and focused on the specimen.

53. A method comprising:

counting a number of charged particles incident on a detector element of an array of detector elements of a detector, wherein an area of the detector element of the array is configured to receive no more than a predetermined number of charged particles per sampling period.

54. The method of clause 53, wherein the sampling period is less than a dead time of the detector element.

55. The method of clause 53 or clause 54, wherein the area is configured so that the sampling period is a factor of average charged particle separation time, the factor being 0.1 or less.

56. The method of clause 55, wherein the average charged particle separation time is based on beam current of a beam of charged particles incident on the detector and a position of the detector elements relative to a geometric spread of the charged particles incident on the detector.

57. The method of any of clauses 53 to 56, further comprising adjusting the sampling rate to satisfy a predetermined criteria.

58. The method of clause 57, wherein the predetermined criteria is that the sampling period is less than pulse width of signal generated in response to an electron arrival event.

59. The method of any of clauses 53 to 58, further comprising summing a plurality of numbers of counted charged particles incident on respective detector elements of the array of detector elements; and determining a gray level of an SEM image.

60. A detector for a charged particle beam apparatus, the detector comprising:

a semiconductor substrate including an array of sensing elements; and a circuit configured to count a number of charged particles incident on the detector.

61. The detector of clause 60, wherein the circuit is configured to process outputs from the plurality of sensing elements and to increment a counter in response to a charged particle arrival event on a sensing element of the array.

62. The detector of clause 61, wherein the circuit is configured to determine a time stamp of the charged particle arrival event.

63. The detector of clause 62, wherein the time stamp is based on a global system time of the detector, the global system time being common to each sensing element in the array.

64. The detector of clause 62, wherein the time stamp is based on a local time of the sensing element, the local time being independent of other sensing elements in the array.

65. The detector of any one of clauses 62 to 64, wherein the time stamp is associated with a position on a surface of a sample scanned by a primary charged particle beam of the charged particle beam apparatus.

66. The detector of clause 65, wherein the time stamp is associated with a pixel of a SEM image.

67. The detector of any one of clauses 60 to 66, wherein the circuit is configured to sum counts of a plurality of sensing elements of the array based on time stamps of the counts.

68. The detector of any one of clauses 60 to 67, wherein the detector is configured to count up to only one charged particle arrival event in a sensing element before resetting without discriminating energy of the one charged particle arrival event.

69. The detector of any one of clauses 60 to 67, wherein the detector is configured to count numbers of charged particle arrival events without discriminating energy of the charged particle arrival events and to set an overflow flag when overflow is encountered in a sensing element.

70. The detector of clause 69, wherein the numbers of charged particle arrival events include one.

71. The detector of any one of clauses 60 to 67, wherein the detector is configured to count up to only one charged particle arrival event in a sensing element for a first energy range before resetting.

72. The detector of any one of clauses 60 to 67, wherein the detector is configured to count numbers of charged particle arrival events for a first energy range and to set an overflow flag when overflow is encountered in a sensing element.

73. The detector of clause 72, wherein the numbers of charged particle arrival events include zero or one.

74. The detector of any one of clauses 61 or 62, wherein the circuit includes a discriminator configured to compare an output signal from the sensing element with a reference value and increment the counter when the output signal is greater than the reference value.

75. The detector of any one of clauses 61 or 62, wherein the circuit includes a discriminator configured to compare an output signal from the sensing element with a reference range including a lower limit value and an upper limit value, and wherein the counter is incremented in response to a determination based on the output signal in relation to the reference range.

76. The detector of clause 75, wherein the circuit is configured to increment the counter when the output signal is below a reference value included in the reference range.

77. The detector of clause 75, wherein the circuit is configured to increment the counter when the output signal is greater than a reference value included in the reference range.

78. The detector of clause 75, wherein the circuit is configured to increment the counter when the output signal is above the lower limit value and below the upper limit value.

79. The detector of any one of clauses 61 or 62, wherein the circuit includes a pulse detector configured to detect an arrival event of a charged particle on a sensing element by detecting an amount of energy received by the sensing element.

80. The detector of any one of clauses 61 or 62, wherein the circuit includes a comparator configured to compare an amount of energy received by the sensing element with a reference and increment the counter after making a determination based on the reference.

81. The detector of any one of clauses 61 or 62, wherein the circuit includes a comparator configured to compare an amount of energy received by the sensing element with a reference value and increment the counter when the amount of energy is greater than the reference value.

82. The detector of clause 61 or 62, wherein the circuit includes a comparator configured to compare an amount of energy received by the sensing element with a reference range including a lower limit and an upper limit, and wherein the counter is incremented in response to a determination based on the amount of energy in relation to the reference range.

83. The detector of clause 82, wherein the circuit is configured to increment the counter when the amount of energy is below a reference value included in the reference range.

84. The detector of clause 82, wherein the circuit is configured to increment the counter when the amount of energy is greater than a reference value included in the reference range.

85. The detector of clause 82, wherein the circuit is configured to increment the counter when the amount of energy is above the lower limit and below the upper limit.

86. The detector of any one of clauses 60 to 85, wherein the detector is configured to reset all sensing elements of the array of sensing elements simultaneously.

87. The detector of any one of clauses 60 to 85, wherein the detector is configured to reset all sensing elements of a region of the array of sensing elements simultaneously.

88. The detector of any one of clauses 60 to 85, wherein the detector is configured to reset each sensing element of the array of sensing elements individually.

89. The detector of any one of clauses 60 to 85, wherein the detector is configured to reset some sensing elements of the array of sensing elements simultaneously and some sensing elements of the array of sensing elements individually.

90. The detector of any one of clauses 86 to 89, wherein data from each sensing element is stored before resetting.

91. The detector of any one of clauses 86 to 90, wherein the detector is configured to reset sensing elements with a fixed period.

92. The detector of any one of clauses 86 to 90, wherein the detector is configured to reset sensing elements with a varying period.

93. The detector of any one of clauses 60 to 85, wherein the detector is configured to reset all sensing elements of the array of sensing elements based on a predetermined condition, wherein data from each sensing element is stored before resetting.

94. The detector of clause 93, wherein the predetermined condition includes a condition that at least a first proportion of sensing elements in the array of sensing elements receive at least one charged particle.

95. The detector of clause 93 or clause 94, wherein the predetermined condition includes a condition that at least a first proportion of sensing elements in the array of sensing elements encounter overflow.

96. The detector of any one of clauses 60 to 85, wherein the detector is configured to reset all sensing elements of a region of the array of sensing elements based on a predetermined condition, wherein data from each sensing element in the region is stored before resetting.

97. The detector of clause 96, wherein the predetermined condition includes a condition that at least a first proportion of sensing elements in the region of the array of sensing elements receive at least one charged particle.

98. The detector of clause 96 or clause 97, wherein the predetermined condition includes a condition that at least a first proportion of sensing elements in the region of the array of sensing elements encounter overflow.

99. The detector of any one of clauses 60 to 85, wherein the detector is configured to reset each sensing element of the array of sensing elements individually based on a predetermined condition, wherein data from each sensing element is stored before resetting.

100. The detector of clause 99, wherein the predetermined condition includes a condition that a first sensing element in the array of sensing elements receives at least one charged particle.

101. The detector of clause 99 or clause 100, wherein the predetermined condition includes a condition that a first sensing element in the array of sensing elements encounters overflow.

102. The detector of any of clauses 60 to 101, wherein the number is a whole number.

103. The detector of any of clauses 60 to 102, wherein the semiconductor substrate includes a PIN diode.

104. The detector of any one of clauses 60 to 103, wherein the array of sensing elements includes segmented diodes, wherein the segmented diodes include PIN or NIP diodes.

105. A method comprising:

processing outputs from a plurality of sensing elements of an array of sensing elements of a detector;

counting a number of charged particles incident on a detector, wherein the counting includes incrementing a counter in response to a charged particle arrival event on a sensing element of the array; and determining a time stamp of the charged particle arrival event.

106. The method of clause 105, wherein the time stamp is based on a global system time of the detector, the global system time being common to each sensing element in the array.

107. The method of clause 106, wherein the time stamp is based on a local time of the sensing element, the local time being independent of other sensing elements in the array.

108. The method of any one of clauses 105 to 107, wherein the time stamp is associated with a position on a surface of a sample scanned by a primary charged particle beam of a charged particle beam apparatus.

109. The method of clause 108, wherein the time stamp is associated with a pixel of a SEM image.

110. The method of any one of clauses 105 to 109, further comprising combining counts of the plurality of sensing elements of the array based on time stamps of the counts.

111. The method of any one of clauses 105 to 110, wherein the counting comprises counting up to only one charged particle arrival event in a sensing element before being reset without discriminating energy of the one charged particle arrival event.

112. The method of any one of clauses 105 to 110, wherein the counting comprises counting numbers of charged particle arrival events without discriminating energy of the charged particle arrival events and to set an overflow flag when overflow is encountered in a sensing element.

113. The method of clause 112, wherein the numbers of charged particle arrival events include one.

114. The method of any one of clauses 105 to 110, wherein the counting comprises counting up to only one charged particle arrival event in a sensing element for a first energy range before resetting.

115. The method of any one of clauses 105 to 111, wherein the counting comprises counting numbers of charged particle arrival events for a first energy range and to set an overflow flag when overflow is encountered in a sensing element.

116. The method of clause 115, wherein the numbers of charged particle arrival events include zero or one.

117. The method of any one of clauses 105 to 116, further comprising comparing an output signal from the sensing element with a reference value and incrementing the counter when the output signal is greater than the reference value.

118. The method of any one of clauses 105 to 116, further comprising:

comparing an output signal from the sensing element with a reference range including a lower limit value and an upper limit value, and incrementing the counter in response to a determination based on the output signal in relation to the reference range.

119. The method of clause 118, further comprising incrementing the counter when the output signal is below a reference value included in the reference range.

120. The method of clause 118, further comprising incrementing the counter when the output signal is greater than a reference value included in the reference range.

121. The method of clause 118, further comprising incrementing the counter when the output signal is above the lower limit value and below the upper limit value.

122. The method of any one of clauses 105 to 117, further comprising detecting an arrival event of a charged particle on a sensing element by detecting an amount of energy received by the sensing element.

123. The method of any one of clauses 105 to 117, further comprising comparing an amount of energy received by the sensing element with a reference and incrementing the counter after making a determination based on the reference.

124. The method of any one of clauses 105 to 117, further comprising comparing an amount of energy received by the sensing element with a reference and incrementing the counter when the amount of energy is greater than the reference value.

125. The method of any one of clauses 105 to 117, further comprising comparing an amount of energy received by the sensing element with a reference range including a lower limit and an upper limit, and incrementing the counter in response to a determination based on the amount of energy in relation to the reference range.

126. The method of clause 125, further comprising incrementing the counter when the amount of energy is below a reference value included in the reference range.

127. The method of clause 125, further comprising incrementing the counter when the amount of energy is greater than a reference value included in the reference range.

128. The method of clause 125, further comprising incrementing the counter when the amount of energy is above the lower limit and below the upper limit.

129. The method of any one of clauses 105 to 128, further comprising resetting all sensing elements of the array of sensing elements simultaneously.

130. The method of any one of clauses 105 to 128, further comprising resetting all sensing elements of a region of the array of sensing elements simultaneously.

131. The method of any one of clauses 105 to 128, further comprising resetting each sensing element of the array of sensing elements individually.

132. The method of any one of clauses 105 to 128, further comprising resetting some sensing elements of the array of sensing elements simultaneously and some sensing elements of the array of sensing elements individually.

133. The method of any one of clauses 129 to 132, further comprising storing data from each sensing element before resetting.

134. The method of any one of clauses 129 to 133, further comprising resetting sensing elements with a fixed period.

135. The method of any one of clauses 129 to 133, further comprising resetting sensing elements with a varying period.

136. The method of any one of clauses 105 to 123, further comprising resetting all sensing elements of the array of sensing elements based on a predetermined condition, and storing data from each sensing element before resetting.

137. The method of clause 136, wherein the predetermined condition includes a condition that at least a first proportion of sensing elements in the array of sensing elements receive at least one charged particle.

138. The method of clause 136 or clause 137, wherein the predetermined condition includes a condition that at least a first proportion of sensing elements in the array of sensing elements encounter overflow.

139. The method of any one of clauses 105 to 123, further comprising:

resetting all sensing elements of a region of the array of sensing elements based on a predetermined condition, and storing data from each sensing element in the region before resetting.

140. The method of clause 139, wherein the predetermined condition includes a condition that at least a first proportion of sensing elements in the region of the array of sensing elements receive at least one charged particle.

141. The method of clause 139 or clause 140, wherein the predetermined condition includes a condition that at least a first proportion of sensing elements in the region of the array of sensing elements encounter overflow.

142. The method of any one of clauses 105 to 123, further comprising:

resetting each sensing element of the array of sensing elements individually based on a predetermined condition, and storing data from each sensing element before resetting.

143. The method of clause 142, wherein the predetermined condition includes a condition that a first sensing elements in the array of sensing elements receives at least one charged particle.

144. The method of clause 142 or clause 143, wherein the predetermined condition includes a condition that a first sensing element in the array of sensing elements encounters overflow.

145. The method of any of the clauses 105 to 144, wherein the number is a whole number.

146. A charged particle beam apparatus comprising a detector and a controller with at least one processor and a non-transitory computer readable medium comprising instructions that, when executed by the processor, cause the apparatus to:

process outputs from a plurality of sensing elements of an array of sensing elements of the detector;

count a number of charged particles incident on a detector, wherein the counting includes incrementing a counter in response to a charged particle arrival event on a sensing element of the array; and determine a time stamp of the charged particle arrival event.

147. A detector for a charged particle beam apparatus, the detector comprising:

an array of sensing elements, wherein the detector is configured such that no more than a predetermined number of charged particles is received on a sensing element of the array in a sampling period with no more than a predetermined miscount rate.

148. The detector of clause 147, wherein the predetermined number is one.

149. The detector of clause 147, wherein the predetermined number is greater than one.

150. The detector of clause 147, wherein the predetermined number is one or two.

151. The detector of any one of clauses 147 to 150, wherein the sampling period is less than a dead time associated with the sensing element.

152. The detector of any one of clauses 147 to 151, wherein the array includes a plurality of uniformly sized sensing elements.

153. The detector of any one of clauses 147 to 151, wherein the predetermined miscount rate is 10%.

154. The detector of any one of clauses 147 to 153, wherein the sampling period is a time channel width of a multi-channel scaler connected to the sensing element.

155. The detector of clause 151, wherein the detector is configured such that the dead does not include a paralyzable dead time associated with the sensing element.

156. A detector for a charged particle beam apparatus, the detector comprising:

a semiconductor substrate including an array of sensing elements; and a circuit configured to count a number of charged particles incident on the detector.

157. The detector of clause 156, wherein the circuit is configured to determine a number of charged particles received on a sensing element of the array in a sampling time.

158. The detector of clause 156 or clause 157, wherein the semiconductor substrate includes a plurality of segmented diodes.

159. The detector of clause 156, wherein the semiconductor substrate includes an amplifier connected to each of the plurality of segmented diodes.

160. The detector of any one of clauses 156 to 159, wherein the circuit includes a plurality of circuits, each of the circuits connected to a respective sensing element of the array.

161. The detector of clause 160, wherein each of the circuits includes an amplifier, an event pulse detector, and a counter.

162. The detector of clause 160, wherein each of the circuits includes a single-bit counter.

163. The detector of any one of clauses 156 to 162, wherein the circuit includes a summing unit configured to determine a total number of charged particles incident on the detector in each sampling period.

164. The detector of any one of clauses 156 to 163, wherein the circuit includes an event flag detector and an overflow flag detector.

165. The detector of any one of clauses 156 to 164, wherein the circuit includes a front-end analog circuit.

166. The detector of clause 165, wherein the front-end analog circuit includes a current buffer and an amplifier including one of a transimpedance amplifier, a charge amplifier, or a charge transfer amplifier.

167. A detector for a charged particle apparatus comprising:

a plurality of sensor elements, each of the sensor elements having a corresponding circuit configured to detect an electron event based on a current pulse generated by the corresponding sensor element in response to an electron impacting the corresponding sensor element, each of the sensor elements including a diode that is configured to operate in a linear mode; and a second circuit configured to determine a number of electron events detected by the plurality of sensor elements during a predetermined period of time.

168. The detector of clause 167, wherein the diode is a PIN diode or an avalanche diode operating in a linear mode.

169. The detector of clause 168, wherein the avalanche diode operating in the linear mode is a low gain avalanche diode.

170. The detector of clause 167, wherein the diode being configured to operate in a linear mode includes the diode being configured to avoid operation in a Geiger mode or in a photon counting mode.

171. The detector of clause 167, wherein the diode being configured to operate in a linear mode includes the diode being configured to generate the current pulse with a magnitude distribution that is substantially proportional to a kinetic energy of the impacting electron when the impacting electron enters the diode.

172. The detector of clause 171, wherein said corresponding circuit includes circuitry to determine a first characteristic of the current pulse, and to determine a second characteristic of the incoming electron based on the first characteristic.

173. The detector of clause 172, wherein the first characteristic is a magnitude of the current pulse and the second characteristic is a determination that the electron is any one of a secondary electron, a backscattered electron, or an electron from a noise source.

174. The detector of clause 173, wherein the determination that the electron is from a noise source is based on the magnitude of the current pulse being below a first threshold, wherein the determination that the electron is a secondary electron is based on the magnitude of the current pulse being above the first threshold and below a second threshold, and wherein the determination that the electron is a backscattered electron is based on the magnitude of the current pulse being above the second threshold.

175. The detector of clause 172, wherein the second characteristic is a determination that the electron event corresponding to the electron is one of multiple electron events resulting from multiple electrons impacting said corresponding sensor element during the predetermined period of time.

176. The detector of clause 175, wherein the current pulse generated by said corresponding sensor element is in response to the multiple electrons impacting said corresponding sensor element.

177. A method of reducing miscounting in an electron counting detector, the method comprising:

detecting charge in two or more adjacent sensing elements at substantially a same time;

comparing the charge detected in each of the adjacent sensing elements to one or more reference values; and based on the comparison, determining if the charge results from one electron impacting one of the sensing elements or from multiple electrons impacting the two or more sensing elements.

178. The method of clause 177, wherein a sensing element included in an array of sensing elements has a size such that an incoming electron impacts no more than four sensing elements at the same time.

179. The method of clause 178, wherein the size is configured such that no dimension of the sensing element is less than a penetration depth of the incoming electron in a material of the sensing element.

In some embodiments, a detector may communicate with a controller that controls a charged particle beam system. The controller may instruct components of the charged particle beam system to perform various functions, such as controlling a charged particle source to generate a charged particle beam and controlling a deflector to scan the charged particle beam. The controller may also perform various other functions such as adjusting a sampling rate of a detector, resetting sensing element, or performing image processing. The controller may comprise a storage that is a storage medium such as a hard disk, random access memory (RAM), other types of computer readable memory, and the like. The storage may be used for saving scanned raw image data as original images, and post-processed images. A non-transitory computer readable medium may be provided that stores instructions for a processor of controller 109 to carry out charged particle beam detection, sampling period determination, image processing, or other functions and methods consistent with the present disclosure. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a ROM, a PROM, and EPROM, a FLASH-EPROM or any other flash memory, NVRAM, a cache, a register, any other memory chip or cartridge, and networked versions of the same.

Block diagrams in the figures may illustrate the architecture, functionality, and operation of possible implementations of systems, methods, and computer hardware/software products according to various exemplary embodiments of the present disclosure. In this regard, each block in a schematic diagram may represent certain arithmetical or logical operation processing that may be implemented using hardware such as an electronic circuit. Blocks may also represent a module, segment, or portion of code that comprises one or more executable instructions for implementing the specified logical functions. It should be understood that in some alternative implementations, functions indicated in a block may occur out of the order noted in the figures. For example, two blocks shown in succession may be executed or implemented substantially concurrently, or two blocks may sometimes be executed in reverse order, depending upon the functionality involved. Some blocks may also be omitted. It should also be understood that each block of the block diagrams, and combination of the blocks, may be implemented by special purpose hardware-based systems that perform the specified functions or acts, or by combinations of special purpose hardware and computer instructions.

It will be appreciated that the present invention is not limited to the exact construction that has been described above and illustrated in the accompanying drawings, and that various modifications and changes can be made without departing from the scope thereof. For example, while a PIN diode has been discussed with reference to certain exemplary embodiments, other types of diodes, such as a NIP diode may be similarly applied. Furthermore, other types of devices that may generate a measurable signal in response to receiving incident energy may be applied in a detector.

It will be understood that elements shown in separate figures may be combined. For example, detection system 901 of FIG. 19A may additionally include energy storage units, like detection system 902 of FIG. 19B. And detection system 902 may include elements shown as being a part of detection system 901.

Furthermore, while scanning electron microscopy has been discussed with reference to some embodiments, other types of systems may be applicable as well. For example, a detector may be used in transmission electron microscopy (TEM), scanning transmission electron microscopy (STEM), or structured illumination microscopy (SIM) systems.

What is claimed is:

1. A non-transitory computer readable medium comprising a set of instructions that are executable by one or more processors of a controller to cause the controller to perform operations comprising:
- determining a number of charged particles incident on a detector within a first frame among a plurality of frames; and
- determining a period of the first frame based on a first criteria comprising a condition that a charged particle is incident on each of a first number of sensing elements of the detector.

2. The non-transitory computer readable medium of claim 1, wherein the operations further comprise:
- determining a period of the first frame based on the first criteria and a second criteria comprising a condition that more than one charged particle is incident on no more than a second number of sensing elements among the first number of sensing elements.

3. The non-transitory computer readable medium of claim 1, wherein the operations further comprise determining a frame rate of the plurality of frames based on the first criteria.

4. The non-transitory computer readable medium of claim 2, wherein the operations further comprise determining a frame rate of the plurality of frames based on the first criteria and the second criteria.

5. The non-transitory computer readable medium of claim 1, wherein the operations further comprise determining a statistic of amounts of incident charged particles at a plurality of energy levels within the first frame.

6. The non-transitory computer readable medium of claim 5, wherein the statistic comprises overall amounts of incident charged particles among the first number of sensing elements at each of respective energy levels corresponding to charged particles incident on each sensing element of the first number of sensing elements.

7. The non-transitory computer readable medium of claim 1, wherein the operations further comprise determining a third number of charged particles incident on a sensing element of the detector at an energy level greater than or equal to a first threshold and less than a second threshold.

8. The non-transitory computer readable medium of claim 7, wherein the operations further comprise determining a fourth number of charged particles incident on a sensing element of the detector at an energy level greater than or equal to the second threshold and less than a third threshold.

9. The non-transitory computer readable medium of claim 8, wherein the operations further comprise determining a fifth number of charged particles incident on a sensing element of the detector at an energy level greater than or equal to the third threshold.

10. The non-transitory computer readable medium of claim 1, wherein the operations further comprise generating a pixel of a grayscale image based on the first frame.

11. The non-transitory computer readable medium of claim 1, wherein the operations further comprise generating a pixel of a color image based on the first frame.

12. The non-transitory computer readable medium of claim 1, wherein operations further comprise:
- causing a charged particle source to generate a charged particle beam; and
- causing a deflector to scan the charged particle beam across a sample,
- wherein the detector is configured to receive charged particles projected from the sample.

13. A method, comprising:
- determining a number of charged particles incident on a detector within a first frame among a plurality of frames; and
- determining a period of the first frame based on a first criteria comprising a condition that a charged particle is incident on each of a first number of sensing elements of the detector.

14. A charged particle beam apparatus comprising a detector and a controller with at least one processor and a non-transitory computer readable medium comprising instructions that, when executed by the processor, cause the apparatus to:
- determine a number of charged particles incident on the detector within a first frame among a plurality of frames; and
- determine a period of the first frame based on a first criteria comprising a condition that a charged particle is incident on each of a first number of sensing elements of the detector.

15. The apparatus of claim 14, wherein the instructions further cause the apparatus to:
- determine a period of the first frame based on the first criteria and a second criteria comprising a condition that more than one charged particle is incident on no more than a second number of sensing elements among the first number of sensing elements.

16. The apparatus of claim 14, wherein the instructions further cause the apparatus to:
- determine a frame rate of the plurality of frames based on the first criteria.

17. The apparatus of claim 15, wherein the instructions further cause the apparatus to:
- determine a frame rate of the plurality of frames based on the first criteria and the second criteria.

18. The apparatus of claim 14, wherein the instructions further cause the apparatus to:
- determine a statistic of amounts of incident charged particles at a plurality of energy levels within the first frame.

19. The apparatus of claim 14, wherein the instructions further cause the apparatus to:

determine a third number of charged particles incident on a sensing element of the detector at an energy level greater than or equal to a first threshold and less than a second threshold.

20. The apparatus of claim 14, wherein the instructions further cause the apparatus to:

generate a charged particle beam; and scan the charged particle beam across a sample, wherein the detector is configured to receive charged particles projected from the sample.

* * * * *